US012686695B2

(12) United States Patent
Min et al.

(10) Patent No.: US 12,686,695 B2
(45) Date of Patent: Jul. 21, 2026

(54) ORGANOMETALLIC COMPOUND, ORGANIC LIGHT-EMITTING DEVICE INCLUDING ORGANOMETALLIC COMPOUND, AND ELECTRONIC APPARATUS INCLUDING ORGANIC LIGHT-EMITTING DEVICE

(71) Applicant: Samsung Electronics Co., Ltd., Suwon-si (KR)

(72) Inventors: Minsik Min, Suwon-si (KR); Hyesung Choi, Seoul (KR); Hwangsuk Kim, Suwon-si (KR); Hyejin Bae, Suwon-si (KR); Soonok Jeon, Suwon-si (KR); Yeonsook Chung, Seoul (KR); Hosuk Kang, Suwon-si (KR); Jong Soo Kim, Hanam-si (KR); Joonghyuk Kim, Seoul (KR); Jun Chwae, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 934 days.

(21) Appl. No.: 17/533,488

(22) Filed: Nov. 23, 2021

(65) Prior Publication Data

US 2023/0002429 A1 Jan. 5, 2023

(30) Foreign Application Priority Data

Jun. 9, 2021 (KR) ........................ 10-2021-0074979

(51) Int. Cl.
*C07F 15/00* (2006.01)
*H10K 50/11* (2023.01)
(Continued)

(52) U.S. Cl.
CPC ....... *C07F 15/0086* (2013.01); *H10K 85/346* (2023.02); *H10K 50/11* (2023.02);
(Continued)

(58) Field of Classification Search
CPC ............. H01L 51/0077; H01L 51/0078; H01L 51/0079; H01L 51/008; H01L 51/0081;
(Continued)

(56) References Cited

U.S. PATENT DOCUMENTS

| | | | | |
|---|---|---|---|---|
| 10,573,828 | B2 | 2/2020 | Bold et al. | |
| 2006/0024522 | A1 * | 2/2006 | Thompson ............ | H05B 33/14 549/3 |

(Continued)

FOREIGN PATENT DOCUMENTS

| | | | |
|---|---|---|---|
| EP | 2927234 | A1 | 10/2015 |
| KR | 20160058874 | A | 5/2016 |

(Continued)

OTHER PUBLICATIONS

Ruben Seifert et al., "Chemical degradation mechanisms of highly efficient blue phosphorescent emitters used for organic light emitting diodes," Organic Electronics, Nov. 7, 2012, pp. 115-123, vol. 14.

(Continued)

*Primary Examiner* — Braelyn R Watson
(74) *Attorney, Agent, or Firm* — CANTOR COLBURN LLP

(57) ABSTRACT

An organometallic compound represented by Formula 1:

Formula 1

$$M_1(L_{11})_{n11}(L_{12})_{n12}$$

wherein, in Formula 1, $M_1$ is a first-row transition metal, a second-row transition metal, or a third-row transition metal, $L_{11}$ is a ligand represented by Formula 1-1, $L_{12}$ is a monodentate ligand or a bidentate ligand, n11 is 1, and n12 is 0, 1, or 2:

(Continued)

Formula 1-1

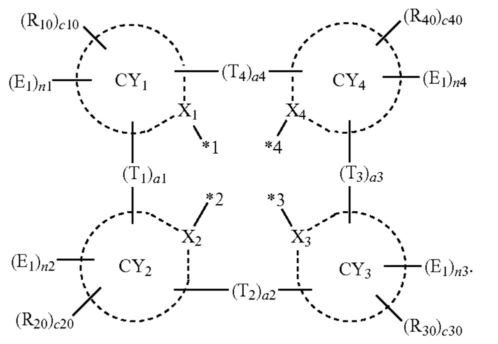

wherein ring $CY_1$ to ring $CY_4$, $E_1$, $T_1$ to $T_4$, $R_{10}$ to $R_{40}$, $X_1$ to $X_4$, n1 to n4, a1 to a4, and c10 to c40 may each be understood by referring to the descriptions thereof provided herein, and *1, *2, *3, and *4 are each a binding site to $M_1$ in Formula 1.

17 Claims, 1 Drawing Sheet

(51) Int. Cl.

| | |
|---|---|
| ***H10K 50/12*** | (2023.01) |
| ***H10K 85/30*** | (2023.01) |
| ***H10K 101/10*** | (2023.01) |
| *H10K 101/30* | (2023.01) |
| *H10K 101/40* | (2023.01) |

(52) U.S. Cl.
CPC ......... *H10K 50/12* (2023.02); *H10K 2101/10* (2023.02); *H10K 2101/30* (2023.02); *H10K 2101/40* (2023.02)

(58) Field of Classification Search
CPC ............. H01L 51/0082; H01L 51/0083; H01L 51/0084; H01L 51/0085; H01L 51/0086; H01L 51/0087; H01L 51/0088; H01L 51/0089; H01L 51/0091; H01L 51/0071; H01L 51/0072; H01L 51/0073; H01L 51/0074; C09K 11/06; C09K 2211/182–188; C09K 2211/1022; C09K 2211/185; C07F 5/00; C07F 5/003; C07F 5/06–069; C07F 7/00; C07F 7/003; C07F 7/22–28; C07F 9/00; C07F 9/005; C07F 5/02; C07F 15/0086; C07F 5/027; C07F 19/00; H10K 85/322; H10K 85/658; H10K 85/657–6576; H10K 85/346; H10K 50/11; H10K 50/12; H10K 2101/10; H10K 2101/30; H10K 2101/40; H10K 85/361; H10K 85/633; H10K 85/654; H10K 85/6572
See application file for complete search history.

(56) References Cited

U.S. PATENT DOCUMENTS

| | | | | |
|---|---|---|---|---|
| 2016/0233444 | A1 | 8/2016 | Hayer et al. | |
| 2018/0287070 | A1 | 10/2018 | Ji et al. | |
| 2018/0375036 | A1 | 12/2018 | Chen et al. | |
| 2019/0119312 | A1 | 4/2019 | Chen et al. | |
| 2020/0140471 | A1 | 5/2020 | Chen et al. | |
| 2020/0216481 | A1 | 7/2020 | Chen et al. | |
| 2020/0388774 | A1 | 12/2020 | Tsai et al. | |
| 2020/0392173 | A1 | 12/2020 | Bae et al. | |
| 2020/0395560 | A1 | 12/2020 | Bae et al. | |
| 2022/0081457 | A1 | 3/2022 | Bae et al. | |
| 2022/0336759 | A1* | 10/2022 | Macinnis | H10K 85/342 |
| 2023/0075211 | A1* | 3/2023 | Sotoyama | H10K 85/658 |

FOREIGN PATENT DOCUMENTS

| | | | |
|---|---|---|---|
| KR | 1020200143234 | A | 12/2020 |
| KR | 1020200143237 | A | 12/2020 |
| KR | 20210097051 | A | 8/2021 |
| KR | 1020220037360 | A | 3/2022 |
| WO | 02015645 | A1 | 2/2002 |
| WO | 2005019373 | A2 | 3/2005 |

OTHER PUBLICATIONS

Office Action issued Feb. 20, 2026 of KR Patent Application No. 10-2021-0074979.

* cited by examiner

ORGANOMETALLIC COMPOUND, ORGANIC LIGHT-EMITTING DEVICE INCLUDING ORGANOMETALLIC COMPOUND, AND ELECTRONIC APPARATUS INCLUDING ORGANIC LIGHT-EMITTING DEVICE

CROSS-REFERENCE TO RELATED APPLICATION

This application claims priority to Korean Patent Application No. 10-2021-0074979, filed on Jun. 9, 2021, in the Korean Intellectual Property Office, and all benefits accruing therefrom under 35 U.S.C. § 119, the disclosure of which is incorporated by reference herein in its entirety.

BACKGROUND

1. Field

One or more embodiments relate to an organometallic compound, an organic light-emitting device including the heterocyclic compound, and an electronic apparatus including the organic light-emitting device.

2. Description of the Related Art

Organic light-emitting devices (OLEDs) are self-emissive devices that, as compared with conventional devices, have wide viewing angles, high contrast ratios, short response times, and excellent brightness, driving voltage, and response speed characteristics, and produce full-color images.

OLEDs include an anode, a cathode, and an organic layer between the anode and the cathode and including an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. The excitons may transition from an excited state to a ground state, thus generating light.

SUMMARY

Provided are a novel organometallic compound, an organic light-emitting device including the organometallic compound, and an electronic apparatus including the organic light-emitting device.

Additional aspects will be set forth in part in the description which follows and, in part, will be apparent from the description, or may be learned by practice of the presented embodiments of the disclosure.

According to an aspect of one or more embodiments, an organometallic compound may be represented by Formula 1:

Formula 1

$$M_1(L_{11})_{n11}(L_{12})_{n12}$$

wherein, in Formula 1, $M_1$ is a first-row transition metal, a second-row transition metal, or a third-row transition metal, $L_{11}$ is a ligand represented by Formula 1-1, $L_{12}$ is a monodentate ligand or a bidentate ligand, n11 is 1, and n12 is 0, 1, or 2:

Formula 1-1

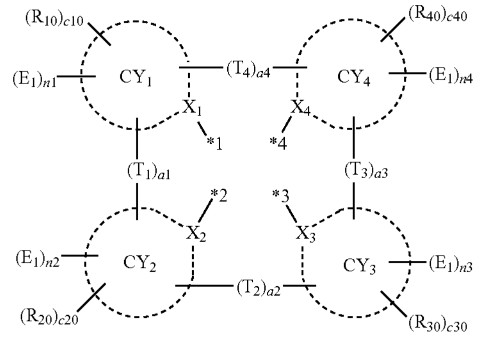

wherein, in Formula 1-1,

*1, *2, *3, and *4 are each a binding site to $M_1$ in Formula 1, $X_1$ to $X_4$ are each independently C or N, a bond between $X_1$ and $M_1$, a bond between $X_2$ and $M_1$, a bond between $X_3$ and $M_1$, and a bond between $X_4$ and $M_1$ are each independently a covalent bond or a coordinate bond, ring $CY_1$ to ring $CY_4$ are each independently a $C_5$-$C_{30}$ carbocyclic group or a $C_1$-$C_{30}$ heterocyclic group, $T_1$ to $T_4$ are each independently a single bond, *—O—*', *—S—*', *—Se—*', *—S(=O)$_2$—*', *—C($R_{50}$)($R_{60}$)—*', *—C($R_{50}$)=*', *—C($R_{50}$)=C($R_{60}$)—*', *—C(=O)—*', *—C(=S)—*', *—C≡C—*', *—B($R_{50}$)—*', *—N($R_{50}$)—*', *—P($R_5$)—*', *—Si($R_{50}$)($R_{60}$)—*', *—P(=O)($R_{50}$)—*', or *—Ge($R_{50}$)($R_{60}$)—*', a1 to a4 are each independently an integer from 0 to 3, provided that at least three of a1 to a4 are each independently an integer from 1 to 3, $E_1$ is a group represented by Formula 2, and n1 to n4 are each independently 0, 1, or 2, and the sum of n1, n2, n3, and n4 is 1 or greater:

Formula 2

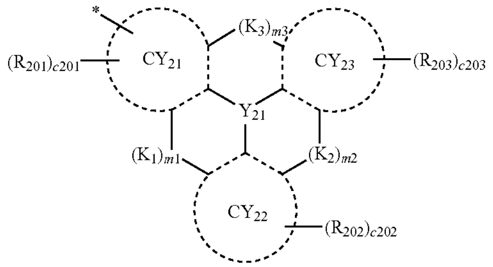

wherein, in Formula 2, ring $CY_{21}$ to ring $CY_{23}$ are each independently a $C_5$-$C_{30}$ carbocyclic group or a $C_1$-$C_{30}$ heterocyclic group, and $Y_{21}$ is B, P, P(=O), or N, $K_1$ to $K_3$ are each independently a single bond, B($R_{204}$), N($R_{205}$), O, S, Se, C(=O), or S(=O)$_2$, m1 to m3 re each independently 0 or 1, provided that when m1 is 0, $K_1$ is not present, when m2 is 0, $K_2$ is not present, and when m3 is 0, $K_3$ is not present, $R_{10}$, $R_{20}$, $R_{30}$, $R_{40}$, $R_{50}$, $R_{60}$, and $R_{201}$ to $R_{205}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(Q_8)(Q_9)$, or —$P(=O)(Q_8)(Q_9)$, c10, c20, c30, and c40 are each independently an integer from 1 to 10, c201 to c203 are each independently an integer from 1 to 10, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, or the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, or a phosphoric acid group or a salt thereof;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alky aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(Q_{18})(Q_{19})$, —$P(=O)(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alky aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a C1-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(Q_{28})(Q_{29})$, —$P(=O)(Q_{28})(Q_{29})$, or a combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(Q_{38})(Q_{39})$, or —$P(=O)(Q_{38})(Q_{39})$; or a combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group, a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_1$-$C_{60}$ heteroaryl group; a $C_1$-$C_{60}$ heteroaryloxy group; a $C_1$-$C_{60}$ heteroarylthio group; a monovalent non-aromatic condensed polycyclic group; or a monovalent non-aromatic condensed heteropolycyclic group.

According to an aspect, an organic light-emitting device includes: a first electrode; a second electrode; and an organic layer located between the first electrode and the second electrode, wherein the organic layer includes an emission layer and at least one of the organometallic compounds described herein.

According to an aspect of another embodiment, an electronic apparatus may include the organic light-emitting device.

BRIEF DESCRIPTION OF THE DRAWINGS

The above and other aspects, features, and advantages of one or more exemplary embodiments will be more apparent from the following description taken in conjunction with the accompanying drawings, in which.

DETAILED DESCRIPTION

Figure 1:
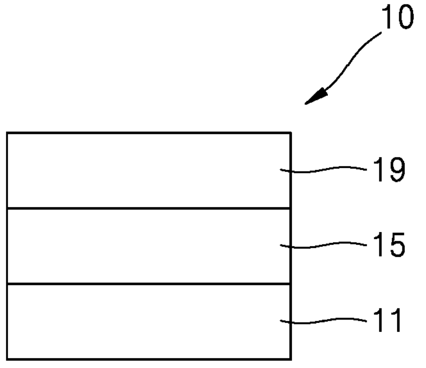
FIG. 1 is a schematic cross-sectional view of an organic light-emitting device according to one or more embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An organometallic compound according to an aspect of one or more embodiments is represented by Formula 1:

Formula 1

$$M_1(L_{11})_{n11}(L_{12})_{n12}$$

wherein, in Formula 1, $M_1$ is a first-row transition metal, a second-row transition metal, or a third-row transition metal.

For example, in Formula 1, $M_1$ may be iridium (Ir), platinum (Pt), osmium (Os), titanium (Ti), zirconium (Zr), hafnium (Hf), europium (Eu), terbium (Tb), thulium (Tm), rhodium (Rh), palladium (Pd), or gold (Au).

In one or more embodiments, in Formula 1, $M_1$ may be Pt, Pd, or Au.

For example, in one or more embodiments, $M_1$ in Formula 1 is Pt.

$L_{11}$ in Formula 1 may be a ligand represented by Formula 1-1.

n11 in Formula 1 is 1.

$L_{12}$ in Formula 1 is a monodentate ligand or a bidentate ligand.

n12 in Formula 1 is 0, 1, or 2. When n12 is 2, two $L_{12}$(s) may be identical to or different from each other.
In one or more embodiments, $L_{12}$ in Formula 1 may be a ligand represented by one of Formulae 8-1 to 8-23, but embodiments are not limited thereto:
8-1
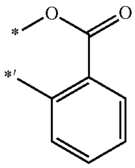
8-2
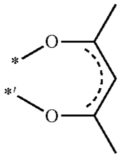
8-3
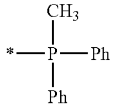
8-4
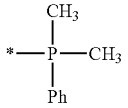
8-5
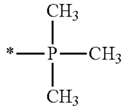
8-6
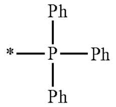
8-7
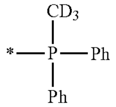
8-8
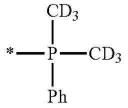
8-9
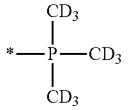
8-10
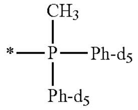
8-11
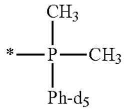
-continued
8-12
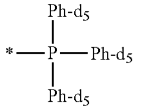
8-13
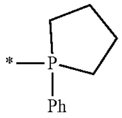
8-14
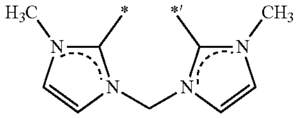
8-15
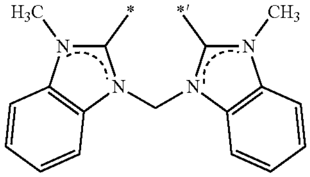
8-16
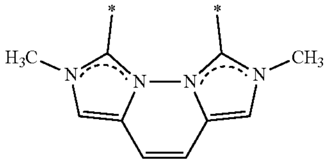
8-17
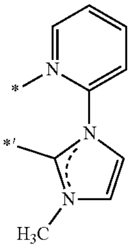
8-18
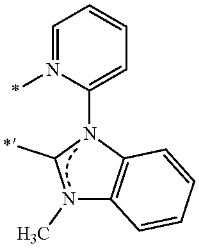
8-19
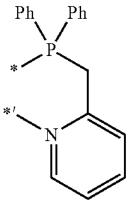

-continued 8-20

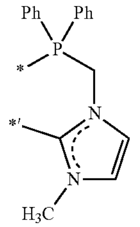

8-21

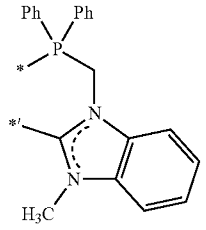

8-22

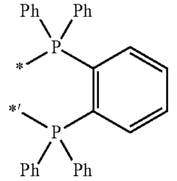

8-23

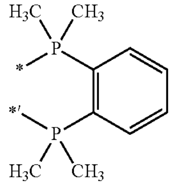

wherein, in Formulae 8-1 to 8-23,

"Ph" represents a phenyl group,

Ph-d5 represents a phenyl group wherein all hydrogen atoms are substituted with deuterium atoms, and

* and *' each indicate a binding site to an adjacent atom.

In one or more embodiments, in Formula 1, $M_1$ may be Pt, n11 may be 1, and n12 may be 0, but embodiments are not limited thereto:

Formula 1-1

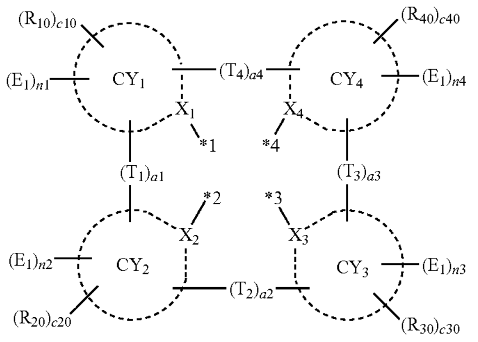

wherein in Formula 1-1, *1, *2, *3, and *4 each indicate a binding site $M_1$ in Formula 1.

In Formula 1-1, $X_1$ to $X_4$ are each independently C or N. A bond between $X_1$ in Formula 1-1 and $M_1$ in Formula 1, a bond between $X_2$ in Formula 1-1 and $M_1$ in Formula 1, a bond between $X_3$ in Formula 1-1 and $M_1$ in Formula 1, and a bond between $X_4$ in Formula 1-1 and $M_1$ in Formula 1 are each independently a covalent bond or a coordinate bond.

In one or more embodiments, two of a bond between $X_1$ in Formula 1-1 and $M_1$ in Formula 1, a bond between $X_2$ in Formula 1-1 and $M_1$ in Formula 1, a bond between $X_3$ in Formula 1-1 and $M_1$ in Formula 1, and a bond between $X_4$ in Formula 1-1 and $M_1$ in Formula 1 may each be a coordinate bond, and the other two of a bond between $X_1$ in Formula 1-1 and $M_1$ in Formula 1, a bond between $X_2$ in Formula 1-1 and $M_1$ in Formula 1, a bond between $X_3$ in Formula 1-1 and $M_1$ in Formula 1, and a bond between $X_4$ in Formula 1-1 and $M_1$ in Formula 1 may each be a covalent bond. The organometallic compound represented by Formula 1 may be electrically neutral (i.e., when the anion(s) and cation(s) are balanced the organometallic compound has a net charge of zero).

In one or more embodiments, a bond between $X_1$ in Formula 1-1 and $M_1$ in Formula 1 may be a coordinate bond.

For example, $X_1$, $X_2$, and $X_3$ may each be C, $X_4$ may be N, a bond between $X_2$ and $M_1$ and a bond between $X_3$ and $M_1$ may each be a covalent bond, and a bond between $X_1$ and $M_1$ and a bond between $X_4$ and $M_1$ may each be a coordinate bond.

In Formula 1-1, ring $CY_1$ to ring $CY_4$ are each independently a $C_5$-$C_{30}$ carbocyclic group or a $C_1$-$C_{30}$ heterocyclic group.

In one or more embodiments, in Formula 1-1, ring $CY_1$ to ring $CY_4$ may each independently be:

i) a first ring, ii) a second ring, iii) a condensed ring wherein at least two first rings are condensed, iv) a condensed ring wherein at least two second rings are condensed, or v) a condensed ring wherein at least one first ring is condensed with at least one second ring, wherein the first ring may be a cyclopentane group, a cyclopentadiene group, a furan group, a thiophene group, a pyrrole group, a silole group, a borole group, a phosphole group, a germole group, a selenophene group, an oxazole group, an isoxazole group, an oxadiazole group, an oxatriazole group, a thiazole group, an isothiazole group, a thiadiazole group, a thiatriazole group, a pyrazole group, an imidazole group, a triazole group, a tetrazole group, an azasilole group, a diazasilole group, or a triazasilole group, and wherein the second ring may be an adamantane group, a norbornane group, a norbornene group, a cyclohexane group, a cyclohexene group, a cyclohexadiene group, a benzene group, a pyridine group, a pyrimidine group, a pyrazine group, a pyridazine group, a triazine group, an oxazine group, a thiazine group, a dihydropyrazine group, a dihydropyridine group, or a dihydroazasilole group.

In one or more embodiments, ring $CY_1$ to ring $CY_4$ in Formula 1-1 may each independently be: a cyclopentane group, a cyclopentene group, a cyclohexane group, a cyclohexene group, a cyclohexadiene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, a borole group, a phosphole group, a germole group, a selenophene group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, a1 in Formula 1-1 may not be 0 (i.e., a1 may be an integer from 1 to 3), and ring $CY_1$ may be represented by one of Formulae CY1(1) to CY1(56) and CY1(101) to CY1(108):

CY1(17)

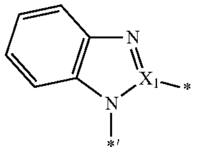

CY1(18)

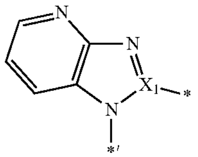

CY1(19)

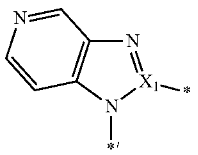

CY1(20)

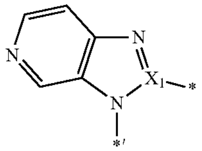

CY1(21)

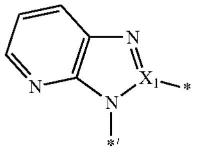

-continued

CY1(22)

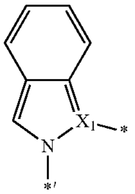

CY1(23)

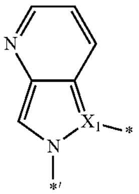

CY1(24)

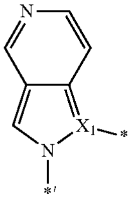

CY1(25)

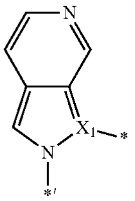

CY1(26)

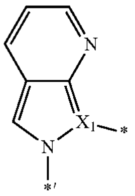

CY1(27)

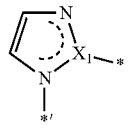

CY1(28)

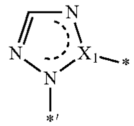

CY1(29)

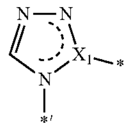

CY1(30)

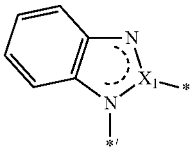

-continued
CY1(31)
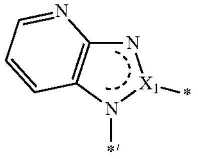
CY1(32)
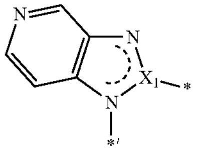
CY1(33)
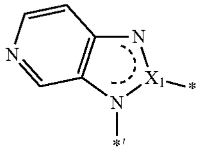
CY1(34)
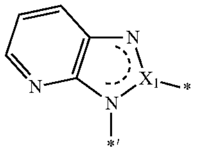
CY1(35)
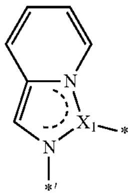
CY1(36)
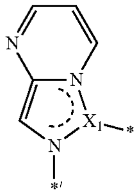
CY1(37)
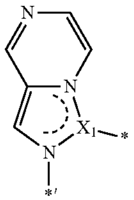
CY1(38)
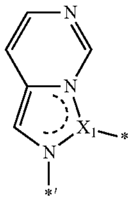
-continued
CY1(39)
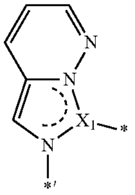
CY1(40)
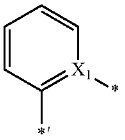
CY1(41)
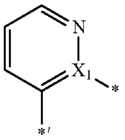
CY1(42)
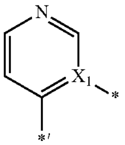
CY1(43)
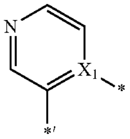
CY1(44)
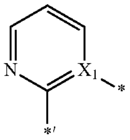
CY1(45)
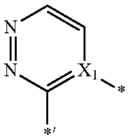
CY1(46)
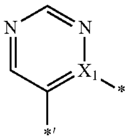
CY1(47)
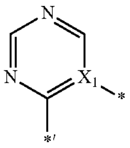
CY1(48)
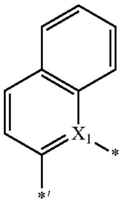

-continued

CY1(49)

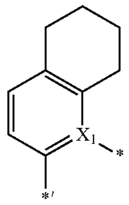

CY1(50)

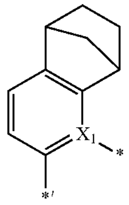

CY1(51)

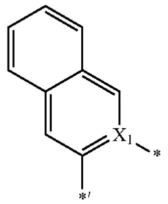

CY1(52)

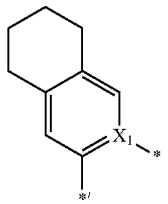

CY1(53)

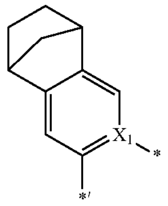

CY1(54)

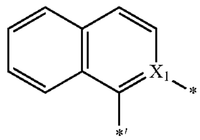

CY1(55)

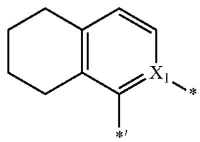

CY1(56)

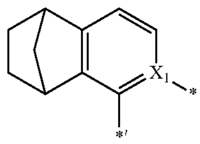

-continued

CY1(101)

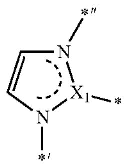

CY1(102)

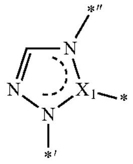

CY1(103)

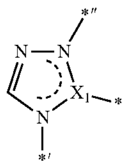

CY1(104)

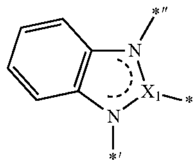

CY1(105)

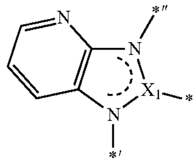

CY1(106)

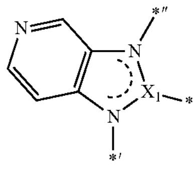

CY1(107)

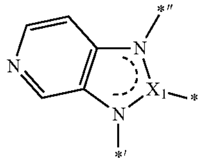

CY1(108)

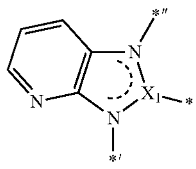

wherein, in Formulae CY1(1) to CY1(56) and CY1(101) to CY1(108), $X_1$ may be C or N, and $X_1$ in Formulae CY1(27) to CY1(39) and CY1(101) to CY1(108) may be C, $X_{11}$ may be O, S, $N(R_{18})$, $C(R_{18})(R_{19})$, or $Si(R_{18})(R_{19})$, and $R_{18}$ and $R_{19}$ may each be understood by referring to the description of $R_{10}$ provided herein,

* indicates a binding site to $M_1$ in Formula 1,

*' indicates a binding site to $T_1$ in Formula 1-1, and

*" indicates a binding site to $T_4$ in Formula 1.

In one or more embodiments, in Formula 1-1, a1 may not be 0 (i.e., a1 may be an integer from 1 to 3), a2 may not be 0 (i.e., a2 may be an integer from 1 to 3), and ring $CY_2$ may be represented by one of Formulae CY2(1) to CY2(15):

CY2(1)

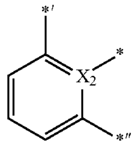

CY2(2)

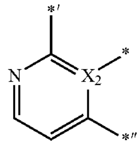

CY2(3)

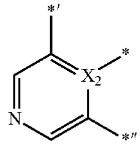

CY2(4)

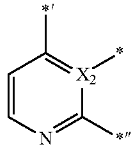

CY2(5)

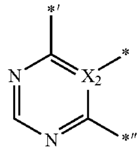

CY2(6)

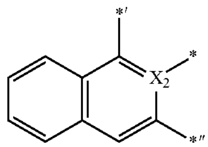

CY2(7)

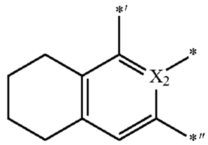

CY2(8)

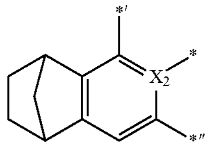

CY2(9)

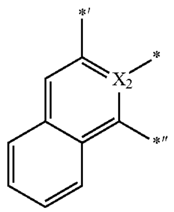

-continued

CY2(10)

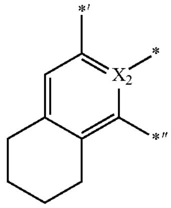

CY2(11)

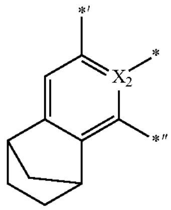

CY2(12)

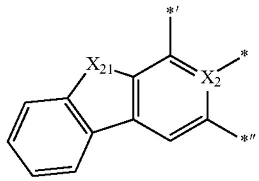

CY2(13)

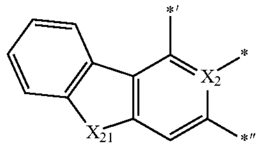

CY2(14)

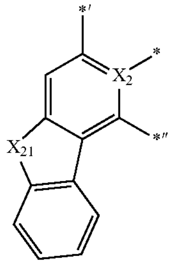

CY2(15)

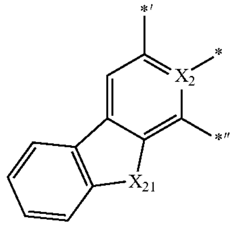

wherein, in Formulae CY2(1) to CY2(15), $X_2$ may be C or N, $X_{21}$ may be O, S, $N(R_{28})$, $C(R_{28})(R_{29})$, or $Si(R_{28})(R_{29})$, and $R_{28}$ and $R_{29}$ may each be understood by referring to the description of $R_{20}$ provided herein,

* indicates a binding site to $M_1$ in Formula 1,

*' indicates a binding site to $T_1$ in Formula 1-1, and

*" indicates a binding site to $T_2$ in Formula 1-1.

In one or more embodiments, in Formula 1-1, a2 may not be 0 (i.e., a2 may be an integer from 1 to 3), a3 may not be 0 (i.e., a3 may be an integer from 1 to 3), and ring $CY_3$ may be a group represented by Formula CY3-A or Formula CY3-B:

CY3-A

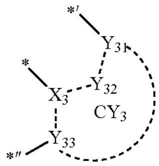

CY3-B

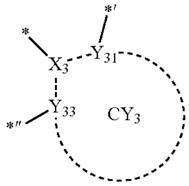

wherein, in Formulae CY3-A and CY3-B, $X_3$ and ring $CY_3$ may respectively be understood by referring to the descriptions of $X_3$ and ring $CY_3$ provided herein, and $Y_{31}$ and $Y_{33}$ may each independently be C or N, and $Y_{32}$ may be O, S, N, C, or Si.

In Formula CY3-A, a bond between $X_3$ and $Y_{33}$, a bond between $X_3$ and $Y_{32}$, and a bond between $Y_{32}$ and $Y_{31}$ may each be a chemical bond (e.g., a single bond or a double bond), and in Formula CY3-B, a bond between $X_3$ and $Y_{31}$ and a bond between $X_3$ and $Y_{33}$ may each be a chemical bond (e.g, a single bond or a double bond),

* indicates a binding site to $M_1$ in Formula 1,

*'' indicates a binding site to $T_2$ in Formula 1-1, and

*' indicates a binding site to $T_3$ in Formula 1.

In one or more embodiments, in Formula 1-1, a2 may not be 0, a3 may not be 0, and ring $CY_3$ may be represented by one of Formulae CY3(1) to CY3(12) and CY3(101) to CY3(122):

CY3(1)

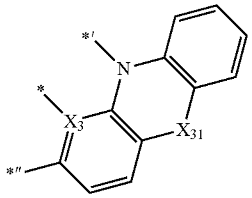

CY3(2)

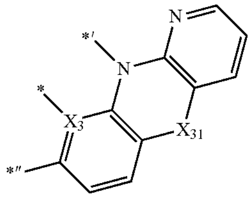

CY3(3)

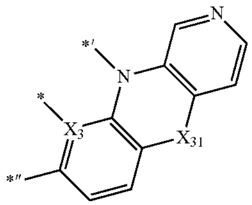

-continued

CY3(4)

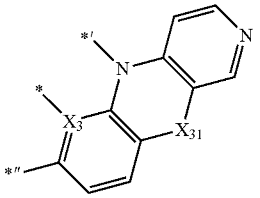

CY3(5)

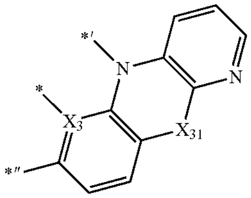

CY3(6)

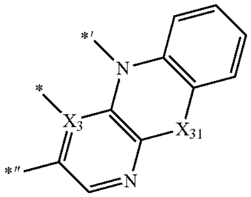

CY3(7)

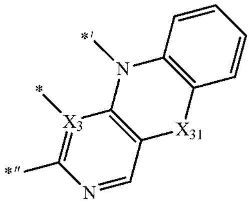

CY3(8)

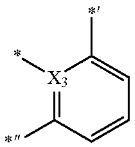

CY3(9)

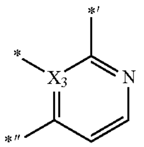

CY3(10)

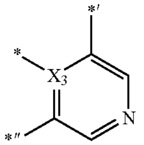

CY3(11)

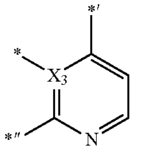

CY3(12)

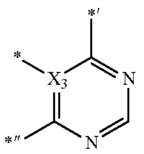

-continued
CY3(101)
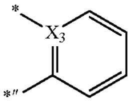
CY3(102)
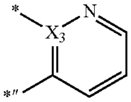
CY3(103)
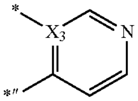
CY3(104)
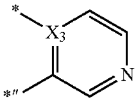
CY3(105)
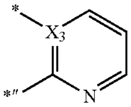
CY3(106)
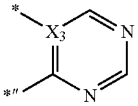
CY3(107)
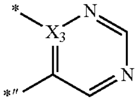
CY3(108)
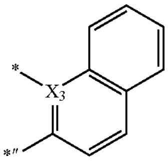
CY3(109)
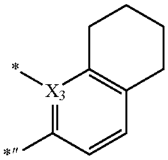
CY3(110)
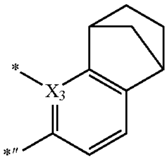
CY3(111)
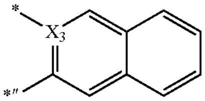
CY3(112)
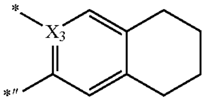
-continued
CY3(113)
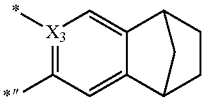
CY3(114)
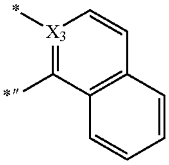
CY3(115)
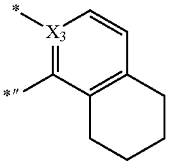
CY3(116)
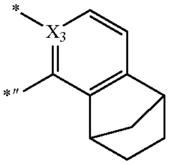
CY3(117)
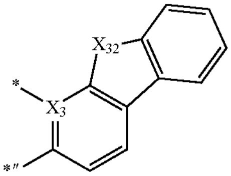
CY3(118)
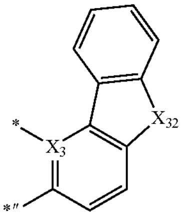
CY3(119)
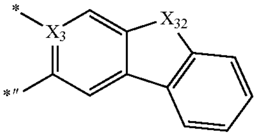
CY3(120)
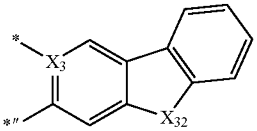
CY3(121)
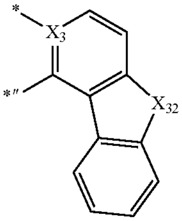

-continued

CY3(122)

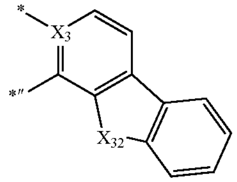

wherein, in Formulae CY3(1) to CY3(12) and CY3(101) to CY3(122), $X_3$ may be C or N, $X_{31}$ may be a single bond, O, S, $N(R_{38})$, $C(R_{38})(R_{39})$, or $Si(R_{38})(R_{39})$, $X_{32}$ may be O, S, $N(R_{38})$, $C(R_{38})(R_{39})$, or $Si(R_{38})(R_{39})$, and $R_{38}$ and $R_{39}$ may each be understood by referring to the description of $R_{30}$ provided herein,

* indicates a binding site to $M_1$ in Formula 1,

*" indicates a binding site to $T_2$ in Formula 1-1, and

*' indicates a binding site to $T_3$ in Formula 1-1.

In one or more embodiments, in Formula 1-1, a2 may not be 0 (i.e., a2 may be an integer from 1 to 3), a3 may not be 0 (i.e., a3 may be an integer from 1 to 3), and a group represented by:

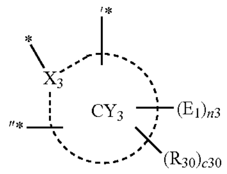

may be represented by one of Formulae CY3-1 to CY3-20:

CY3-1

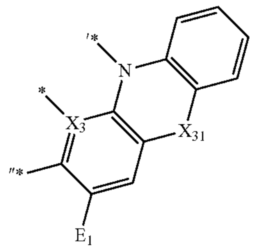

CY3-2

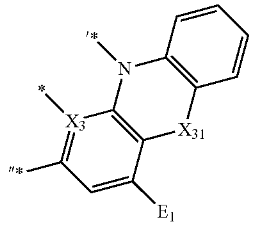

CY3-3

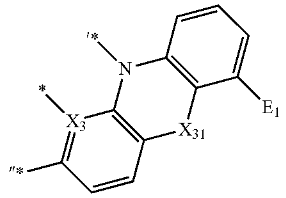

-continued

CY3-4

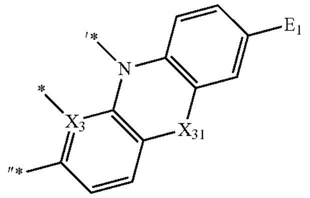

CY3-5

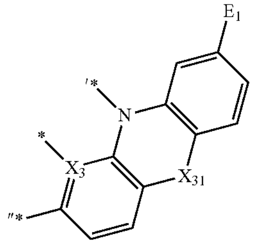

CY3-6

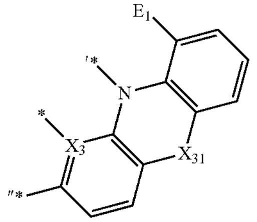

CY3-7

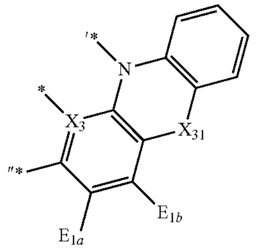

CY3-8

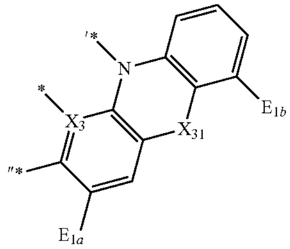

CY3-9

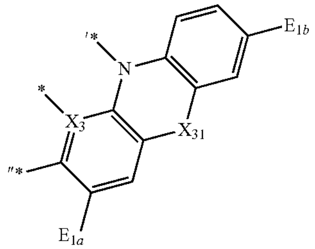

-continued

CY3-10

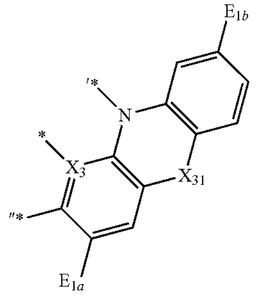

CY3-11

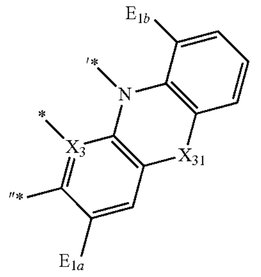

CY3-12

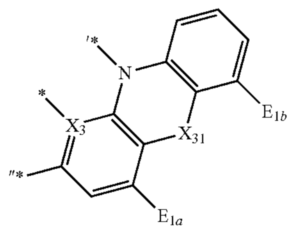

CY3-13

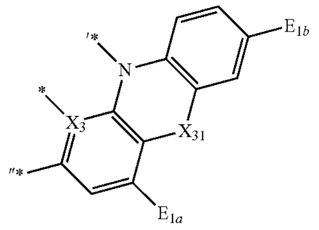

CY3-14

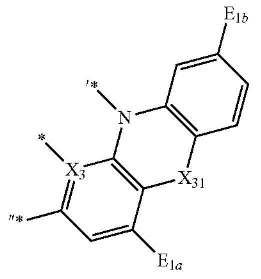

CY3-15

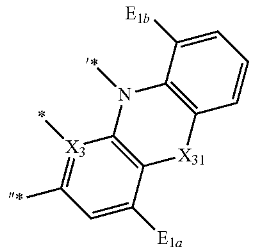

-continued

CY3-16

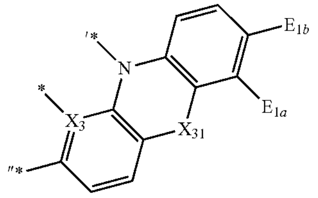

CY3-17

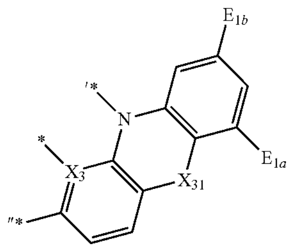

CY3-18

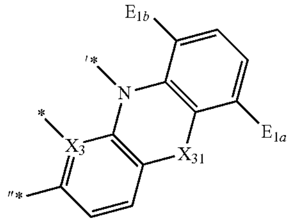

CY3-19

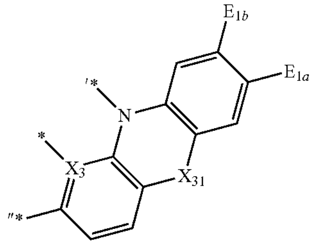

CY3-20

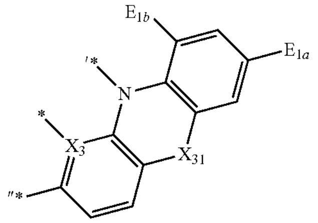

wherein, in Formulae CY3-1 to CY3-20, $X_3$ may be C or N, $X_{31}$ may be a single bond, O, S, $N(R_{38})$, $C(R_{38})(R_{39})$, or $Si(R_{38})(R_{39})$, $X_{32}$ may be O, S, $N(R_{38})$, $C(R_{38})(R_{39})$, or $Si(R_{38})(R_{39})$, and $R_{38}$ and $R_{39}$ may each be understood by referring to the description of $R_{30}$ provided herein, $E_1$ may be understood by referring to the description of $E_1$ provided herein, $E_{1a}$ and $E_{1b}$ may each be understood by referring to the description of $E_1$ provided herein, and $E_{1a}$ and $E_{1b}$ may be identical to or different from each other,

* indicates a binding site to $M_1$ in Formula 1,

*" indicates a binding site to $T_2$ in Formula 1-1, and

*' indicates a binding site to $T_3$ in Formula 1-1.

In one or more embodiments, in Formula 1-1, a3 may not be 0 (i.e., a3 may be an integer from 1 to 3), and ring $CY_4$ may be represented by one of Formulae CY4(1) to CY4(42) and CY4(101) to CY4(111):
CY4(1)
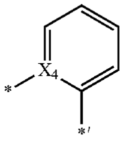
CY4(2)
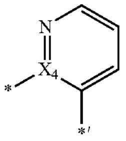
CY4(3)
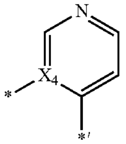
CY4(4)
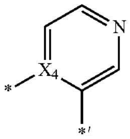
CY4(5)
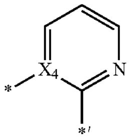
CY4(6)
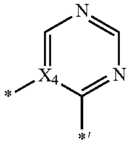
CY4(7)
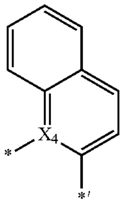
CY4(8)
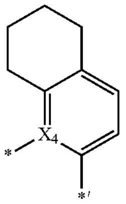
-continued
CY4(9)
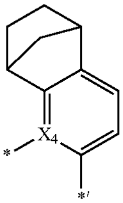
CY4(10)
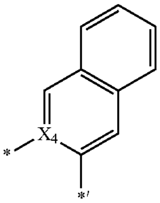
CY4(11)
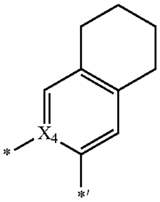
CY4(12)
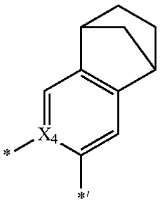
CY4(13)
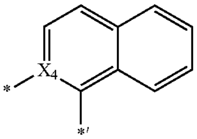
CY4(14)
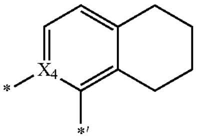
CY4(15)
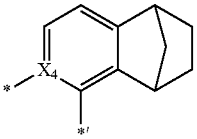
CY4(16)
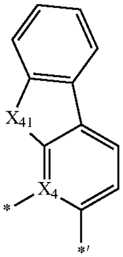

-continued
CY4(17)
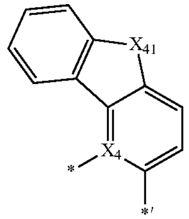
CY4(18)
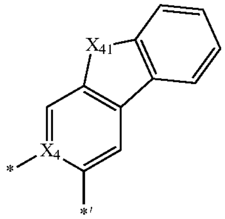
CY4(19)
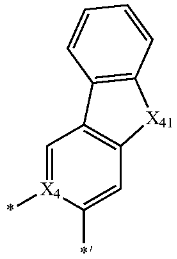
CY4(20)
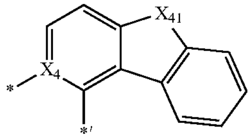
CY4(21)
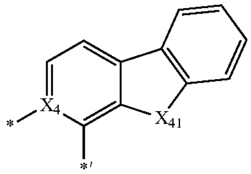
CY4(22)
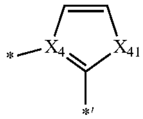
CY4(23)
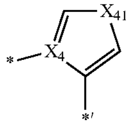
CY4(24)
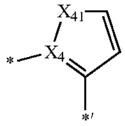
-continued
CY4(25)
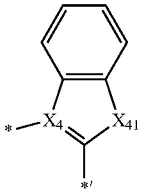
CY4(26)
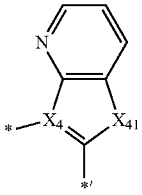
CY4(27)
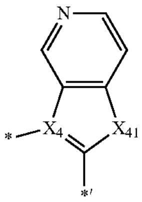
CY4(28)
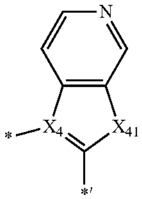
CY4(29)
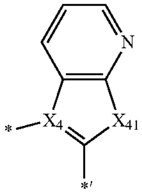
CY4(30)
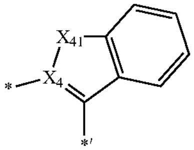
CY4(31)
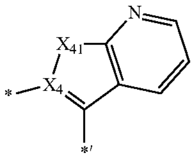
CY4(32)
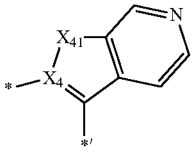

-continued
CY4(33)
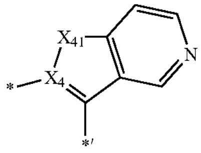
CY4(34)
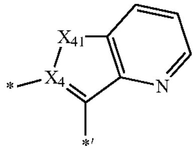
CY4(35)
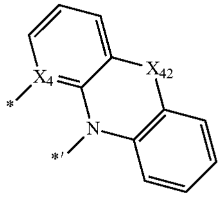
CY4(36)
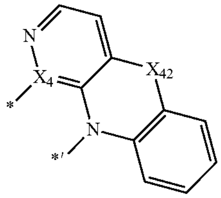
CY4(37)
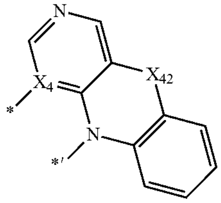
CY4(38)
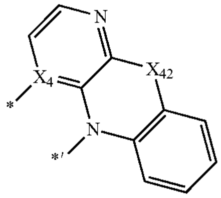
CY4(39)
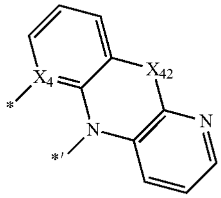
CY4(40)
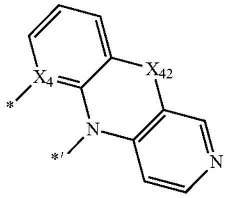
-continued
CY4(41)
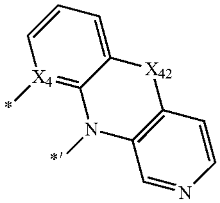
CY4(42)
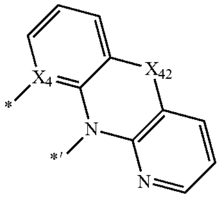
CY4(101)
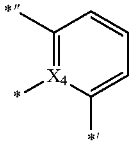
CY4(102)
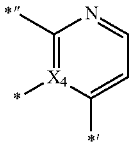
CY4(103)
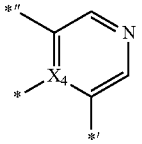
CY4(104)
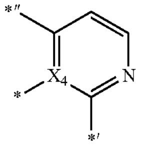
CY4(105)
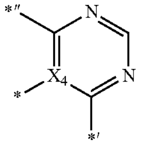
CY4(106)
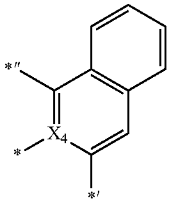
CY4(107)
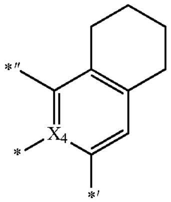

-continued

CY4(108)

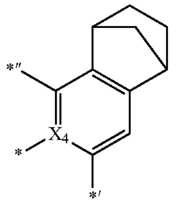

CY4(109)

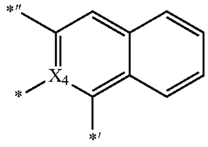

CY4(110)

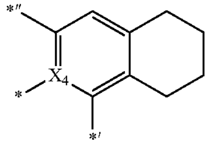

CY4(111)

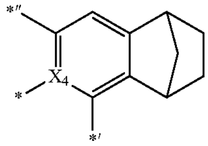

wherein, in Formulae CY4(1) to CY4(42) and CY4(101) to CY4(111), $X_4$ may be C or N, $X_{41}$ may be O, S, $N(R_{48})$, $C(R_{48})(R_{49})$, or $Si(R_{48})(R_{49})$, $X_{42}$ may be a single bond, O, S, $N(R_{48})$, $C(R_{48})(R_{49})$, or $Si(R_{48})(R_{49})$, and $R_{48}$ and $R_{49}$ may each be understood by referring to the description of $R_{40}$ provided herein,

* indicates a binding site to $M_1$ in Formula 1,

*' indicates a binding site to $T_3$ in Formula 1-1, and

*" indicates a binding site to $T_4$ in Formula 1-1.

In Formula 1-1, $T_1$ to $T_4$ may each independently be a single bond, *—O—*', *—S—*', *—Se—*', *—S(=O)$_2$—*', *—C($R_{50}$)($R_{60}$)—*', *—C($R_{50}$)=*', *—C($R_{50}$)=C($R_{60}$)—*', *—C(=O)—*', *—C(=S)—*', *—C≡C—*', *—B($R_{50}$)—*', *—N($R_{50}$)—*', *—P($R_5$)—*', *—Si($R_{50}$)($R_{60}$)—*', *—P(=O)($R_{50}$)—*', or *—Ge($R_{50}$)($R_{60}$)—*', wherein $R_{50}$ and $R_{60}$ are as described in Formula 1-1. It is to be understood that when a1, a2, a3, or a4 is an integer of 2 or greater, than the corresponding group $T_1$ to $T_4$ includes 2 or more of the foregoing groups except a single bond.

In Formula 1-1, a1 to a4 are each independently an integer from 0 to 3, provided that at least three of a1 to a4 are each independently an integer from 1 to 3. That is, the organometallic compound represented by Formula 1 may have a tetradentate ligand.

When a1 is 0, $T_1$ may not be present, when a2 is 0, $T_2$ may not be present, when a3 is 0, $T_3$ may not be present, and when a4 is 0, $T_4$ may not be present.

In one or more embodiments, in Formula 1-1, i) when a1 is 0, a2, a3, and a4 may each independently be an integer from 1 to 3, ii) when a2 is 0, a1, a3, and a4 may each independently be an integer from 1 to 3, iii) when a3 is 0, a1, a2, and a4 may each independently be an integer from 1 to 3, or iv) when a4 is 0, a1, a2, and a3 may each independently be an integer from 1 to 3.

In one or more embodiments, in Formula 1-1, a1 may not be 0, and $T_1$ may be a single bond.

In one or more embodiments, in Formula 1-1, a2 may not be 0 (i.e., a2 may be an integer from 1 to 3), and $T_2$ may be *—O—*', *—S—*', *—C($R_{50}$)($R_{60}$)—*', *—B($R_{50}$)—*', *—N($R_{50}$)—*', *—P($R_5$)—*', *—Si($R_{50}$)($R_{60}$)—*', or *—Ge($R_{50}$)($R_{60}$)—*', wherein $R_{50}$ and $R_{60}$ are as described in Formula 1-1.

In one or more embodiments, in Formula 1-1, a3 may not be 0 (i.e., a3 may be an integer from 1 to 3), and $T_3$ may be a single bond, *—O*', *—S*', *—C($R_{50}$)($R_{60}$)—*', *—B($R_{50}$)—*', *—N($R_{50}$)—*', *—P($R_5$)—*', *—Si($R_{50}$)($R_{60}$)—*', or *—Ge($R_{50}$)($R_{60}$)—*', wherein $R_{50}$ and $R_{60}$ are as described in Formula 1-1.

In one or more embodiments, in Formula 1-1, a4 may be 0 (i.e., a1, a2, and a3 each independently may be an integer from 1 to 3).

In Formula 1-1, n1 to n4 may each indicate the number of $E_1$(s), and n1 to n4 may each independently be 0, 1, or 2, provided that the sum of n1, n2, n3, and n4 may be 1 or greater. That is, the organometallic compound represented by Formula 1 may include at least one group represented by Formula 2.

For example, in Formula 1-1, the sum of n1, n2, n3, and n4 may be 1.

In one or more embodiments, in Formula 1-1, n1, n2, and n4 may each be 0, and n3 may be 1.

In Formula 1-1, $E_1$ may be a group represented by Formula 2:

Formula 2

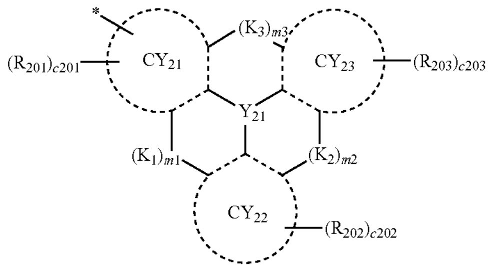

In Formula 2, ring $CY_{21}$ to ring $CY_{23}$ may each independently be a $C_5$-$C_{30}$ carbocyclic group or a $C_1$-$C_{30}$ heterocyclic group.

In one or more embodiments, ring $CY_{21}$ to ring $CY_{23}$ in Formula 2 may each independently be a benzene group, a naphthalene group, an anthracene group, a phenanthrene group, a pyrene group, a furan group, a thiophene group, a pyrrole group, a cyclopentene group, a silole group, a germole group, a benzofuran group, a benzothiophene group, an indole group, an indene group, a benzosilole group, a benzogermole group, a dibenzofuran group, a dibenzothiophene group, a carbazole group, a fluorene group, a dibenzosilole group, a dibenzogermole group, an indolodibenzofuran group, an indolodibenzothiophene group, an indolocarbazole group, an indolofluorene group, an indolodibenzosilole group, or an indolodibenzogermole group.

In Formula 2, $Y_{21}$ may be B, P, P(=O), or N.

In one or more embodiments, in Formula 2, $Y_{21}$ may be B or N.

In Formula 2, $K_1$ to $K_3$ may each independently be a single bond, B($R_{204}$), N($R_{205}$), O, S, Se, C(=O), or S(=O)$_2$.

In one or more embodiments, in Formula 2, i) $Y_{21}$ may be B, and $K_1$ to $K_3$ may each be O, ii) $Y_{21}$ may be B, and $K_1$ to $K_3$ may each be $N(R_{205})$, wherein $R_{205}$ is as defined herein, iii) $Y_{21}$ may be B, at least one of $K_1$ to $K_3$ may be 0, and at least one of $K_1$ to $K_3$ may be $N(R_{205})$, wherein $R_{205}$ is as defined herein, iv) $Y_{21}$ may be N, and $K_1$ to $K_3$ may each be a single bond, v) $Y_{21}$ may be N, and $K_1$ to $K_3$ may each be C(═O), or vi) $Y_{21}$ may be N, and $K_1$ to $K_3$ may each be $S(═O)_2$.

In Formula 2, m1 to m3 may each independently be 0 or 1, when m1 is 0, $K_1$ may not be present, when m2 is 0, $K_2$ may not be present, and when m3 is 0, $K_3$ may not be present.

In one or more embodiments, the sum of m1, m2, and m3 may be 2 or 3.

For example, i) m1, m2, and m3 may each be 1, ii) m1 and m3 may each be 1, and m2 may be 0, iii) m1 and m2 may each be 1, and m3 may be 0, and iv) m2 and m3 may each be 1, and m1 may be 0.

In one or more embodiments, in Formula 1-1, $E_1$ may be represented by one of Formulae 2-1 to 2-8:

2-1

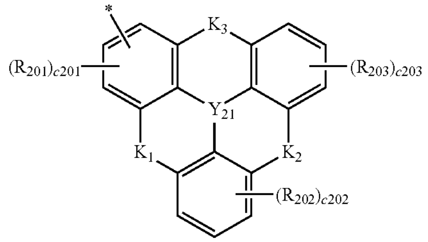

2-2

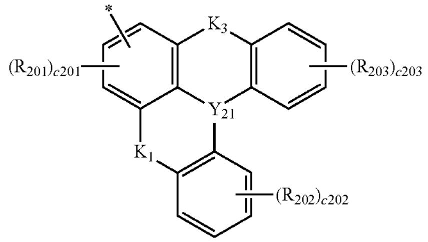

2-3

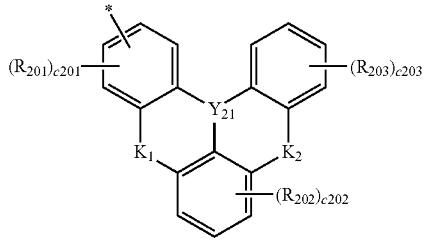

2-4

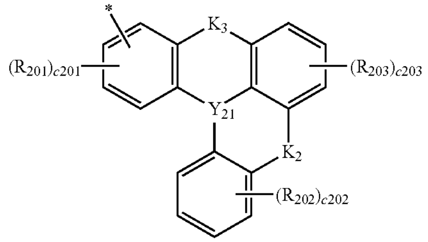

-continued 2-5

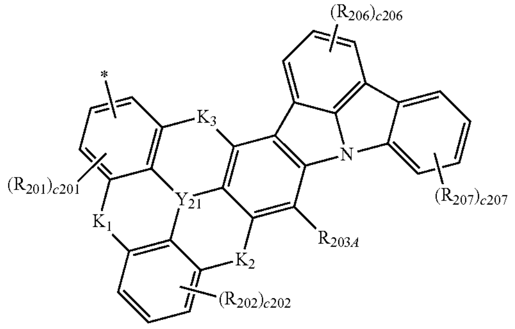

2-6

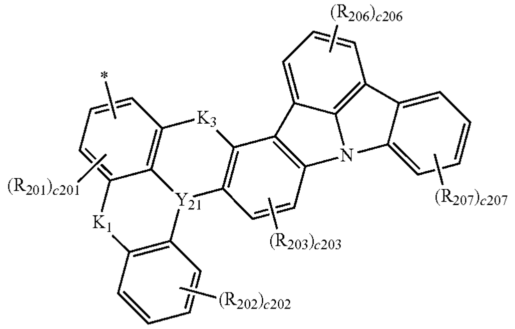

2-7

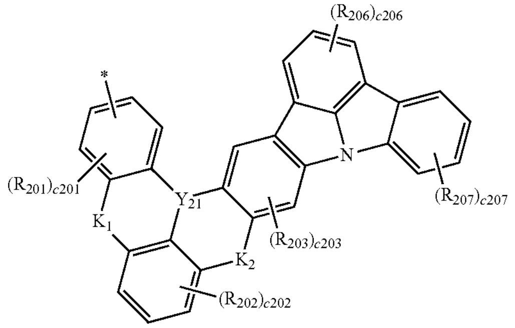

2-8

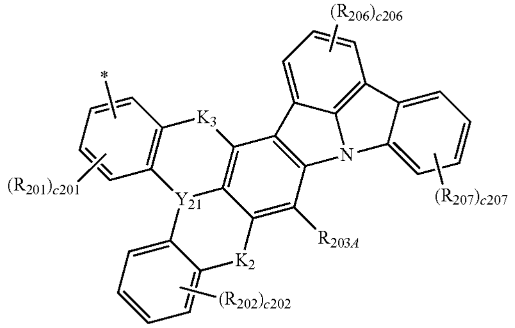

wherein, in Formulae 2-1 to 2-8, $R_{206}$ and $R_{207}$ may each be understood by referring to the description of $R_{201}$ provided herein, c201 and c206 may each be an integer from 1 to 3, c202, c203, and c207 may each be an integer from 1 to 4, $Y_{21}$, $K_1$ to $K_3$, and $R_{201}$ to $R_{203}$ may respectively be understood by referring to the descriptions of $Y_{21}$, $K_1$ to $K_3$, and $R_{201}$ to $R_{203}$ provided herein, and

* indicates a binding site to an adjacent atom.

In Formula 1-1 and 2, $R_{10}$, $R_{20}$, $R_{30}$, $R_{40}$, $R_{50}$, $R_{60}$, and $R_{201}$ to $R_{205}$ re each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(Q_8)(Q_9)$, or —$P(=O)(Q_8)(Q_9)$.

In Formula 1-1, c10, c20, c30, and c40 may each independently be an integer from 1 to 10, and in Formula 2, c201 to c203 may each independently be an integer from 1 to 10.

In one or more embodiments, in Formulae 1-1 and 2, $R_{10}$, $R_{20}$, $R_{30}$, $R_{40}$, $R_{50}$, $R_{60}$, and $R_{201}$ to $R_{205}$ may each independently be hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, a group represented by one of Formulae 9-1 to 9-26, a group represented by one of Formulae 10-1 to 10-256, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(=O)(Q_8)(Q_9)$, but embodiments are not limited thereto:

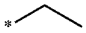
9-1

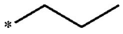
9-2

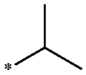
9-3

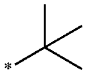
9-4

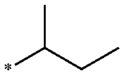
9-5

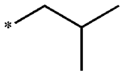
9-6

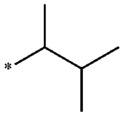
9-7

-continued

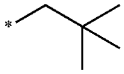
9-8

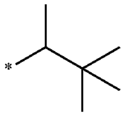
9-9

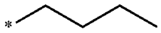
9-10

9-11

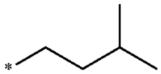
9-12

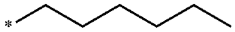
9-13

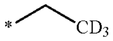
9-14

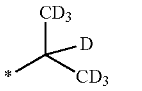
9-15

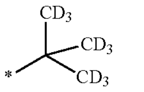
9-16

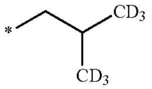
9-17

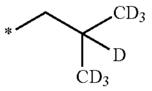
9-18

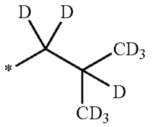
9-19

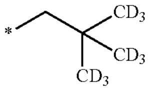
9-20

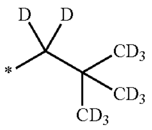
9-21

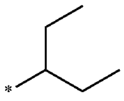
9-22

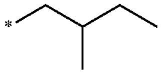
9-23

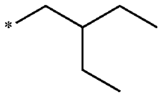
9-24

-continued
9-25
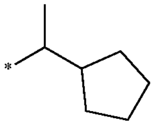
9-26
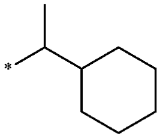
10-1
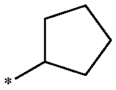
10-2
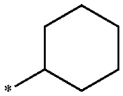
10-3
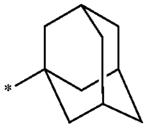
10-4
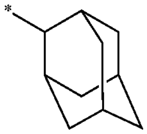
10-5
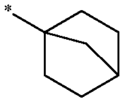
10-6
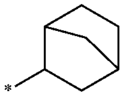
10-7
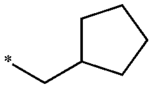
10-8
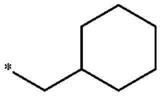
10-9
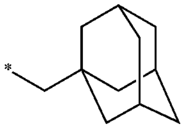
10-10
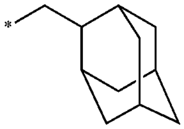
10-11
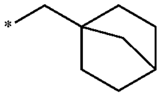
-continued
10-12
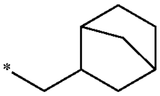
10-13
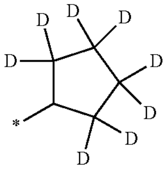
10-14
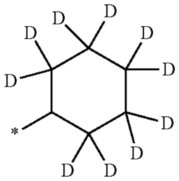
10-15
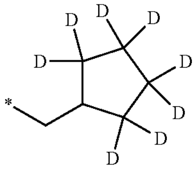
10-16
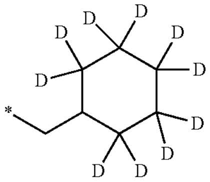
10-17
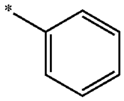
10-18
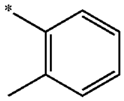
10-19
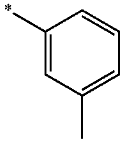
10-20
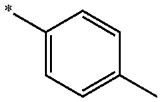
10-21
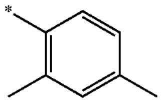
10-22
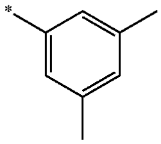

-continued
10-23
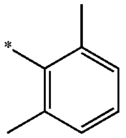
10-24
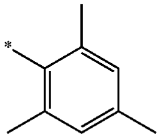
10-25
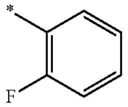
10-26
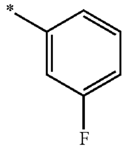
10-27
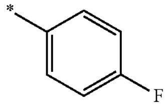
10-28
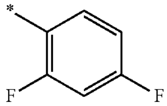
10-29
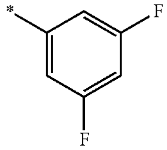
10-30
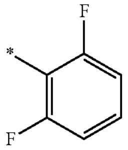
10-31
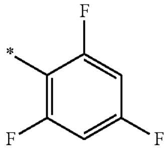
10-32
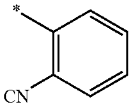
10-33
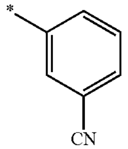
-continued
10-34
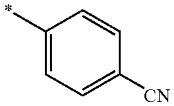
10-35
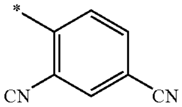
10-36
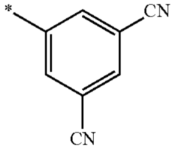
10-37
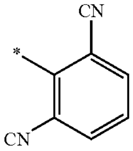
10-38
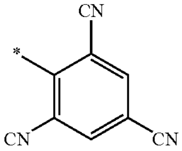
10-39
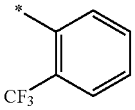
10-40
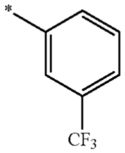
10-41
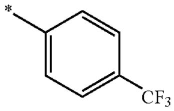
10-42
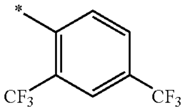
10-43
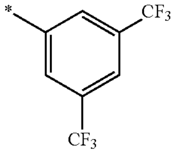
10-44
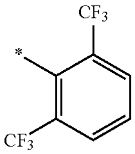

-continued
10-45
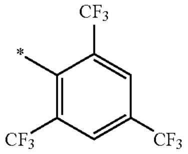
10-46
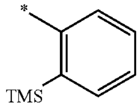
10-47
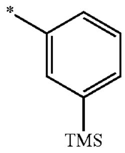
10-48
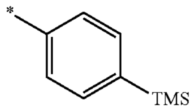
10-49
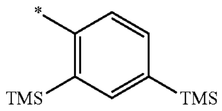
10-50
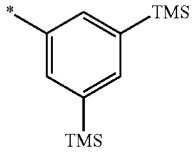
10-51
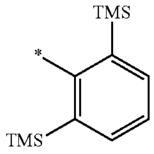
10-52
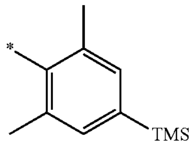
10-53
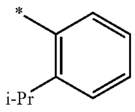
10-54
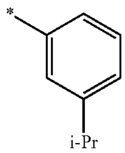
10-55
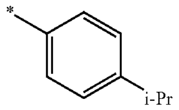
-continued
10-56
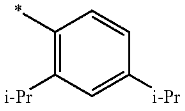
10-57
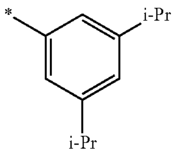
10-58
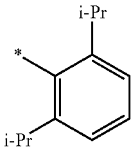
10-59
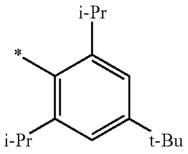
10-60
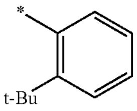
10-61
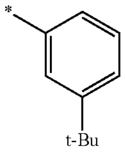
10-62
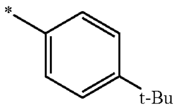
10-63
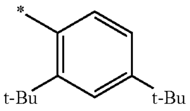
10-64
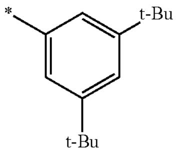
10-65
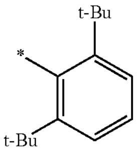
10-66
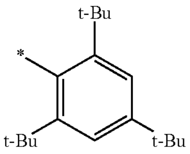

-continued
10-67
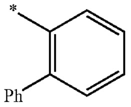
10-68
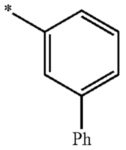
10-69
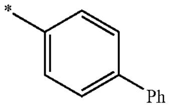
10-70
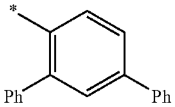
10-71
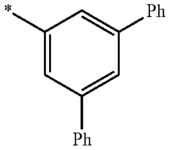
10-72
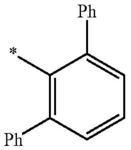
10-73
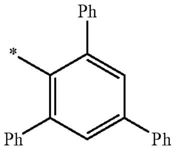
10-74
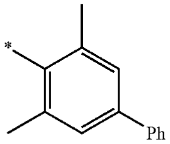
10-75
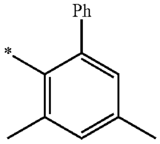
10-76
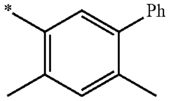
10-77
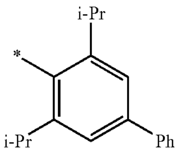
-continued
10-78
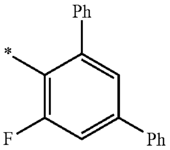
10-79
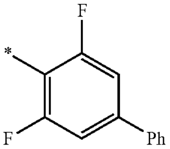
10-80
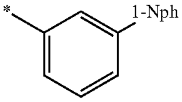
10-81
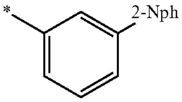
10-82
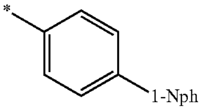
10-83
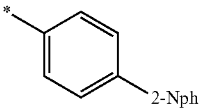
10-84
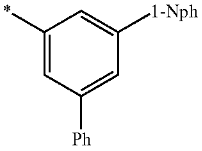
10-85
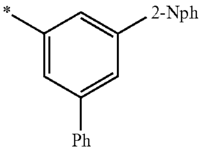
10-86
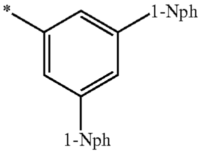
10-87
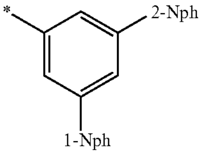
10-88
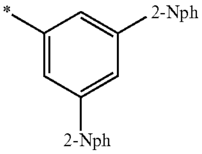

-continued
10-89
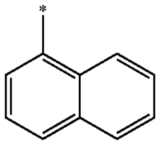
10-90
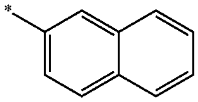
10-91
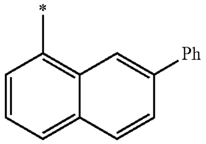
10-92
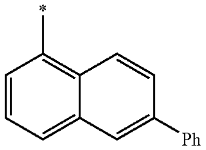
10-93
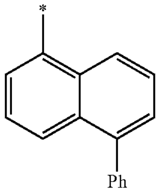
10-94
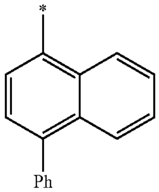
10-95
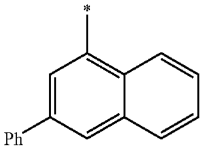
10-96
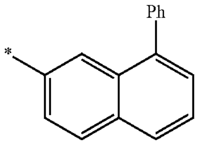
10-97
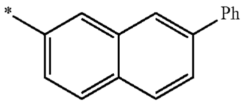
10-98
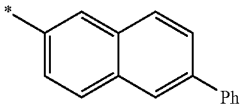
-continued
10-99
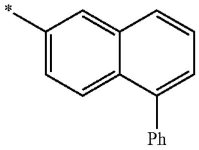
10-100
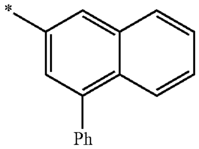
10-101
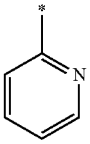
10-102
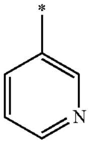
10-103
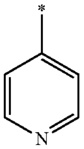
10-104
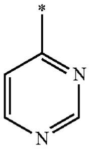
10-105
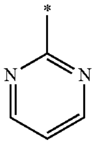
10-106
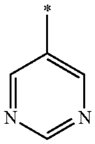
10-107
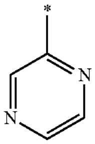
10-108
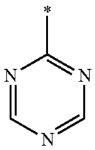

-continued
10-109
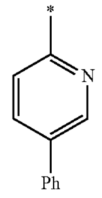
10-110
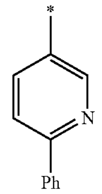
10-111
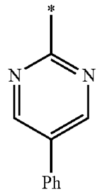
10-112
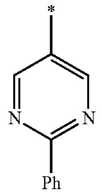
10-113
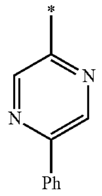
10-114
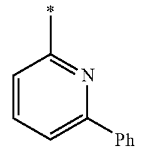
10-115
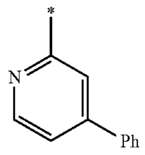
10-116
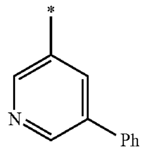
-continued
10-117
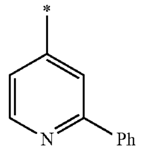
10-118
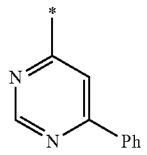
10-119
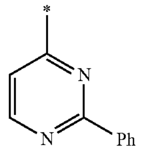
10-120
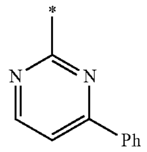
10-121
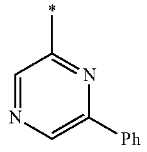
10-122
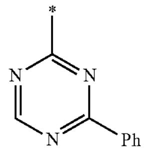
10-123
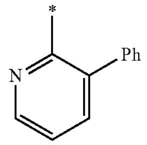
10-124
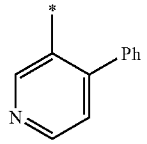
10-125
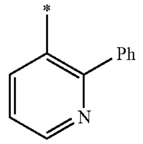
10-126
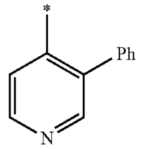

-continued
10-127
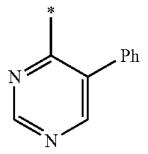
10-128
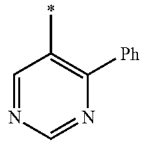
10-129
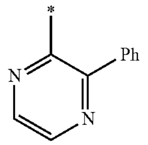
10-130
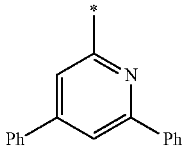
10-131
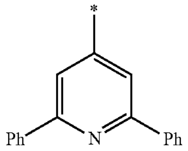
10-132
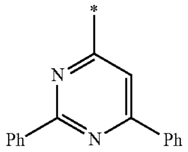
10-133
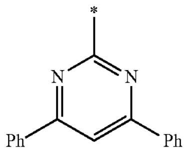
10-134
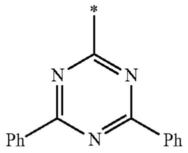
10-135
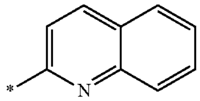
10-136
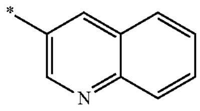
-continued
10-137
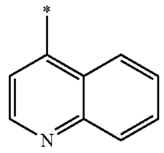
10-138
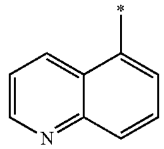
10-139
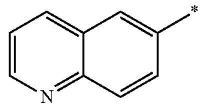
10-140
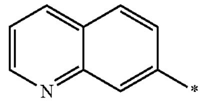
10-141
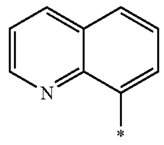
10-142
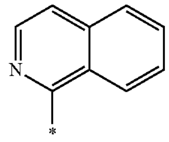
10-143
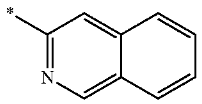
10-144
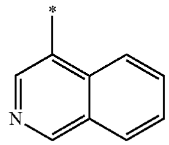
10-145
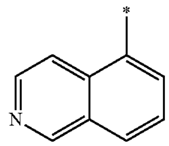
10-146
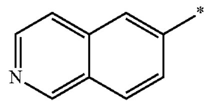
10-147
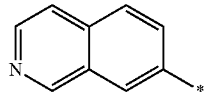

-continued
10-148
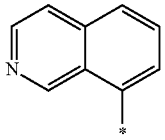
10-149
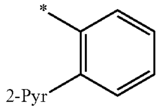
10-150
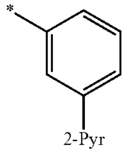
10-151
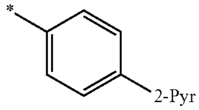
10-152
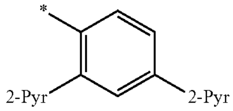
10-153
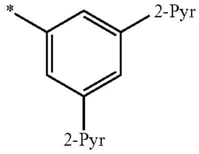
10-154
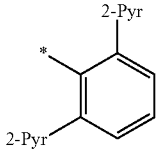
10-155
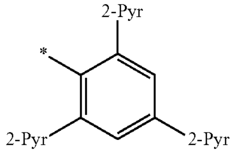
10-156
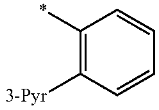
10-157
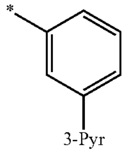
10-158
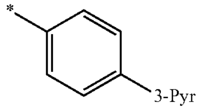
-continued
10-159
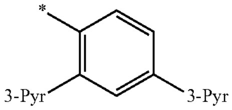
10-160
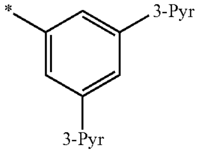
10-161
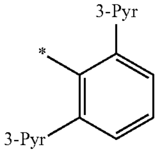
10-162
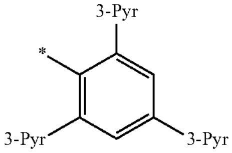
10-163
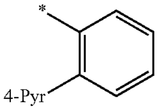
10-164
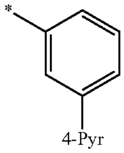
10-165
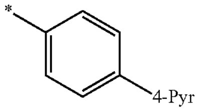
10-166
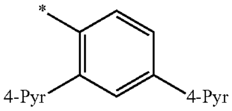
10-167
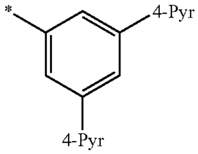
10-168
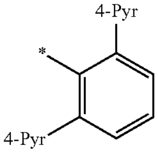

-continued
10-169
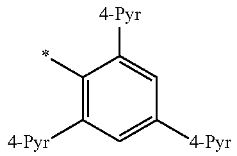
10-170
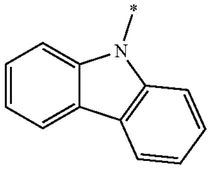
10-171
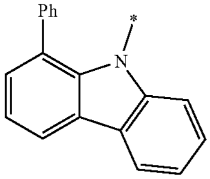
10-172
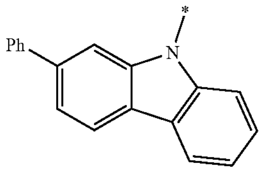
10-173
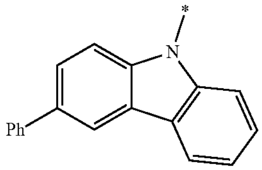
10-174
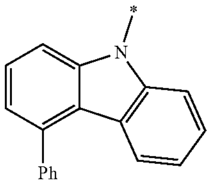
10-175
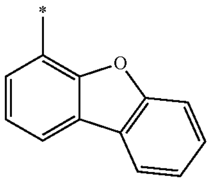
10-176
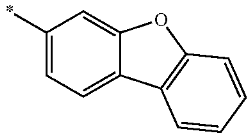
10-177
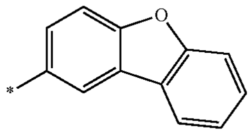
-continued
10-178
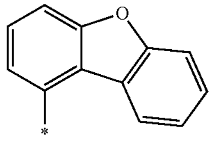
10-179
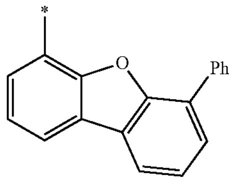
10-180
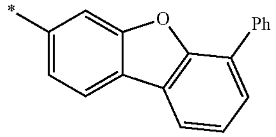
10-181
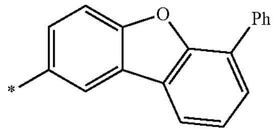
10-182
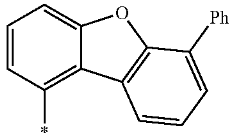
10-183
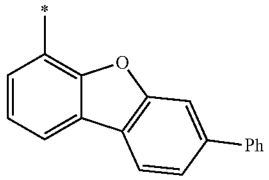
10-184
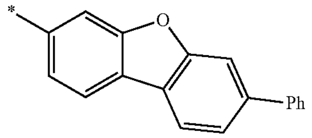
10-185
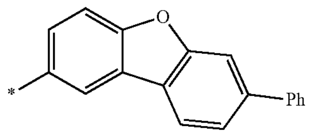
10-186
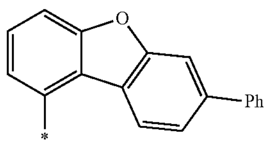

-continued
10-187
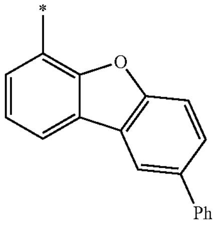
10-188
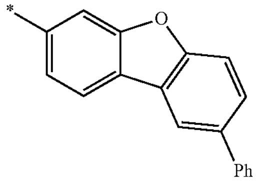
10-189
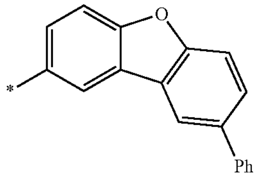
10-190
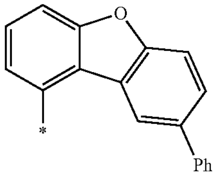
10-191
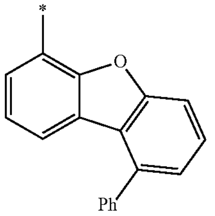
10-192
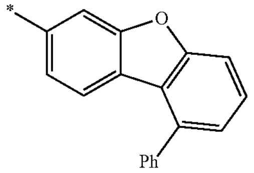
10-193
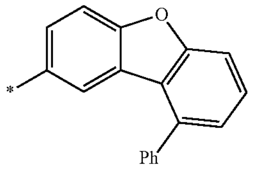
10-194
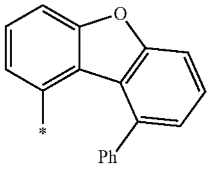
-continued
10-195
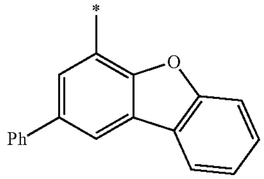
10-196
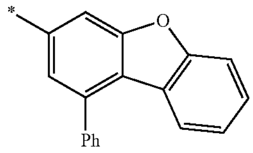
10-197
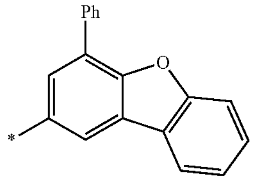
10-198
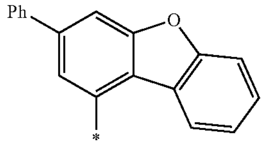
10-199
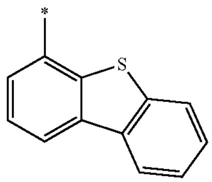
10-200
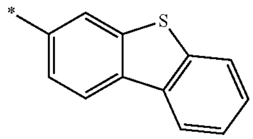
10-201
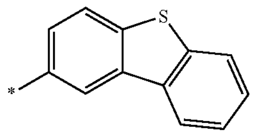
10-202
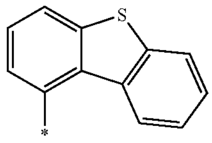
10-203
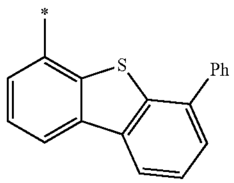

-continued
10-204
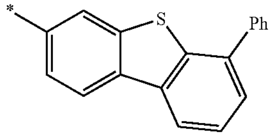
10-205
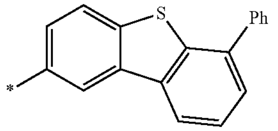
10-206
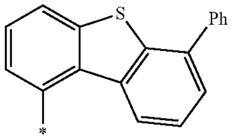
10-207
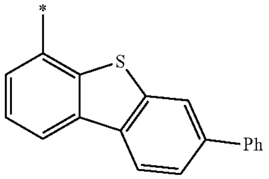
10-208
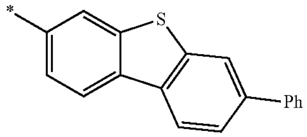
10-209
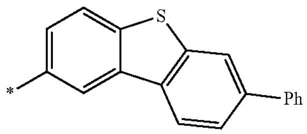
10-210
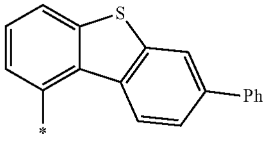
10-211
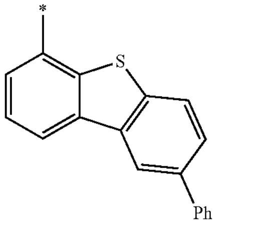
10-212
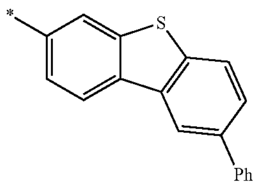
-continued
10-213
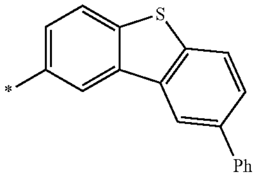
10-214
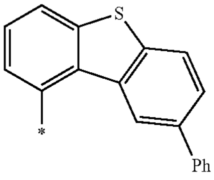
10-215
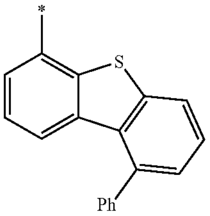
10-216
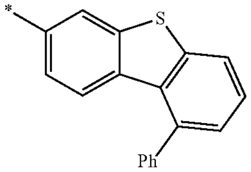
10-217
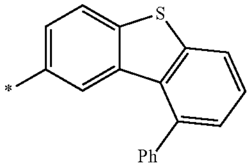
10-218
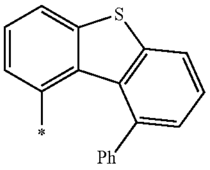
10-219
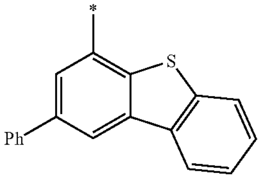
10-220
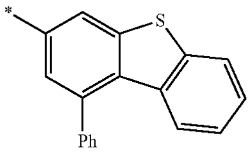

-continued
10-221
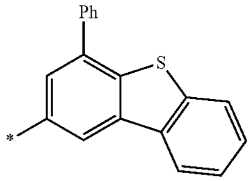
10-222
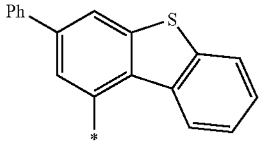
10-223
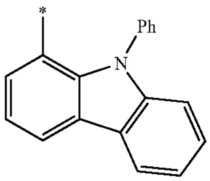
10-224
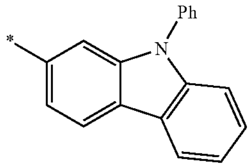
10-225
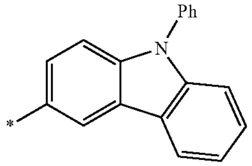
10-226
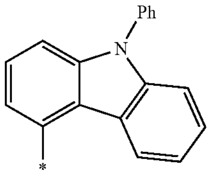
10-227
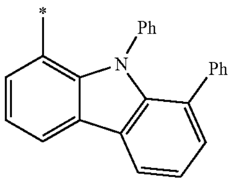
10-228
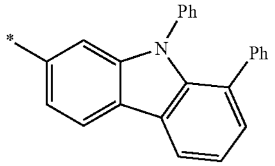
10-229
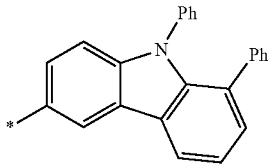
-continued
10-230
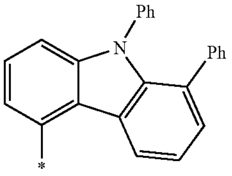
10-231
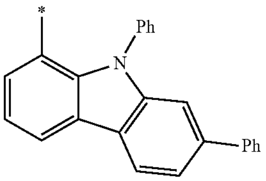
10-232
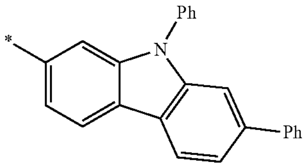
10-233
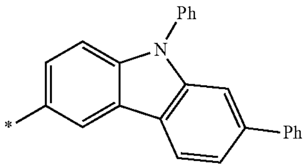
10-234
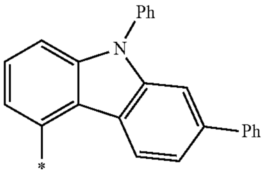
10-235
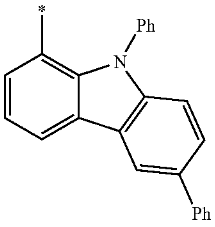
10-236
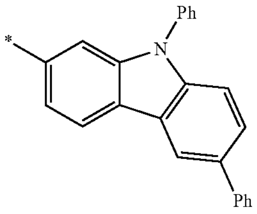
10-237
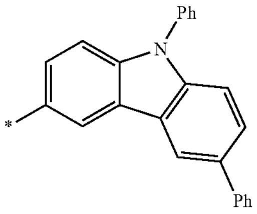

-continued
10-238
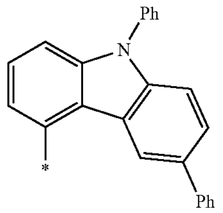
10-239
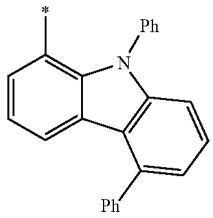
10-240
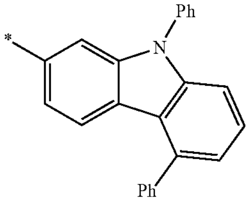
10-241
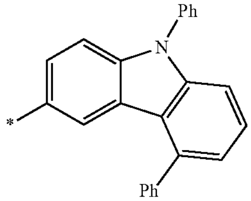
10-242
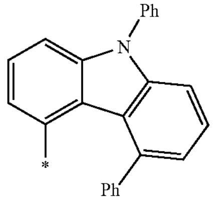
10-243
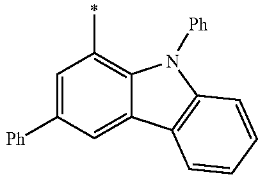
10-244
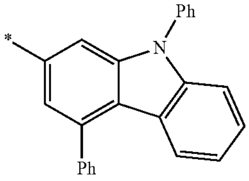
-continued
10-245
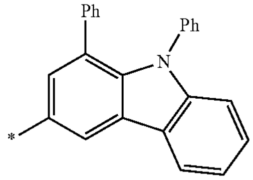
10-246
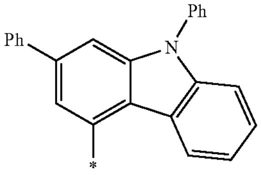
10-247
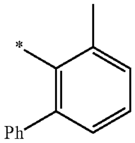
10-248
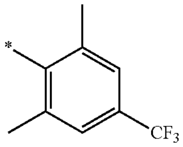
10-249
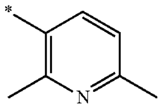
10-250
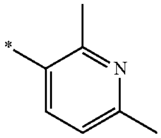
10-251
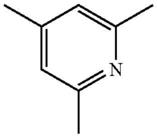
10-252
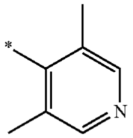
10-253
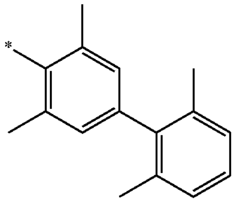
10-254
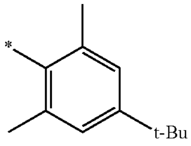

-continued 10-255

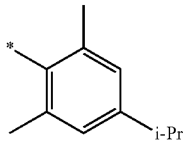

10-256

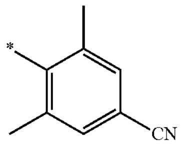

wherein $Q_1$ to $Q_9$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each unsubstituted or substituted with at least one of deuterium, a $C_1$-$C_{10}$ alkyl group, or a phenyl group.

In Formulae 9-1 to 9-26 and 10-1 to 10-256,

* indicates a binding site to an adjacent atom, and

"i-Pr" represents an iso-propyl group,

"t-Bu" represents a t-butyl group,

"Ph" represents a phenyl group, and the term "1-Nph" represents a 1-naphthyl group, the term "2-Nph" represents a 2-naphthyl group, the term "2-Pyr" represents a 2-pyridyl group, the term "3-Pyr" represents a 3-pyridyl group, the term "4-Pyr" represents a 4-pyridyl group, and the term "TMS" represents a trimethylsilyl group.

In one embodiment, the organometallic compound may be represented by any one of Formulae 1-1A to 1-1E:

Formula 1-1A

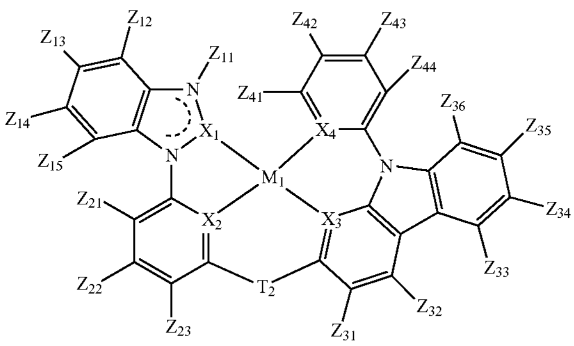

-continued

Formula 1-1B

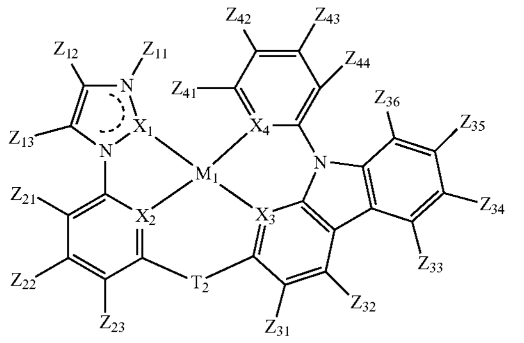

Formula 1-1C

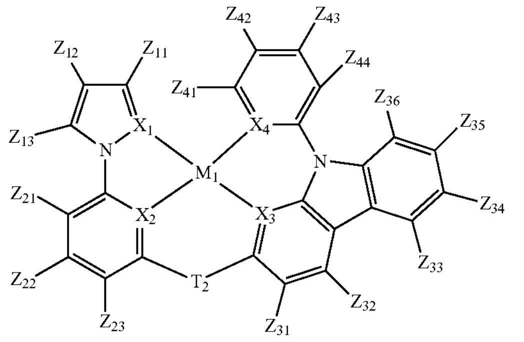

Formula 1-1D

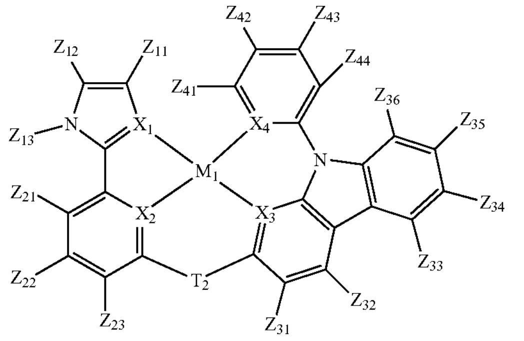

Formula 1-1E

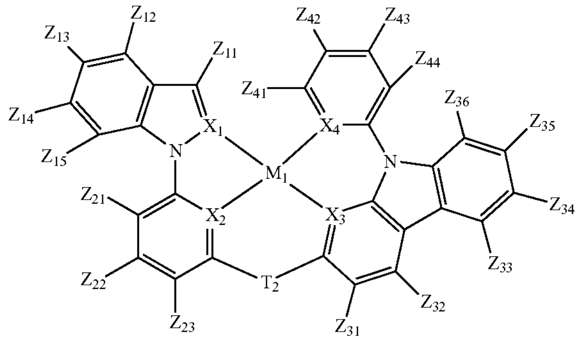

wherein, in Formulae 1-1A and 1-1B, $X_1$ may be C, and $X_2$ to $X_4$ may each independently be C or N, in Formulae 1-1C to 1-1E, $X_1$ to $X_4$ may each independently be C or N, in Formulae 1-1A to 1-1E, $Z_{11}$ to $Z_{15}$ may each independently be $R_{10}$ or $E_1$, $Z_{21}$ to $Z_{23}$ may each independently be $R_{20}$ or $E_1$, $Z_{31}$ to $Z_{36}$ may each independently be $R_{30}$ or $E_1$, and $Z_{41}$ to $Z_{44}$ may each independently be $R_{40}$ or $E_1$, in Formulae 1-1A and 1-1E, at least one of $Z_{11}$ to $Z_{15}$, $Z_{21}$ to $Z_{23}$, $Z_{31}$ to $Z_{36}$, and $Z_{41}$ to $Z_{44}$ may be $E_1$, in Formulae 1-1B to 1-1D, at least one of $Z_{11}$ to $Z_{13}$, $Z_{21}$ to $Z_{23}$, $Z_{31}$ to $Z_{36}$, and $Z_{41}$ to $Z_{44}$ may be $E_1$, and $M_1$, $T_2$, $R_{10}$, $R_{20}$, $R_{30}$, $R_{40}$, and $E_1$ may respectively be understood by referring to the descriptions of $M_1$, $T_2$, $R_{10}$, $R_{20}$, $R_{30}$, $R_{40}$, and $E_1$ provided herein.

In one or more embodiments, in Formulae 1-1A and 1-1E, $Z_{11}$ to $Z_{15}$ may each be $R_{10}$, and $Z_{11}$ to $Z_{15}$ may be identical to or different from one another, and, in Formulae 1-1B to 1-1D, $Z_{11}$ to $Z_{13}$ may each be $R_{10}$, and $Z_{11}$ to $Z_{13}$ may be identical to or different from one another.

In one or more embodiments, in Formulae 1-1A to 1-1E, $Z_{21}$ to $Z_{23}$ may each be $R_{20}$, and $Z_{21}$ to $Z_{23}$ may be identical to or different from one another.

In one or more embodiments, in Formulae 1-1A to 1-1E, $Z_{31}$ to $Z_{33}$, $Z_{35}$, and $Z_{36}$ may each be $R_{30}$, and $Z_{31}$ to $Z_{33}$, $Z_{35}$, and $Z_{36}$ may be identical to or different from one another.

In one or more embodiments, in Formulae 1-1A to 1-1E, $Z_{34}$ may be $E_1$.

In one or more embodiments, in Formulae 1-1A to 1-1E, $Z_{41}$ to $Z_{44}$ may each be $R_{40}$, and $Z_{41}$ to $Z_{44}$ may be identical to or different from one another.

A substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, or the substituted monovalent non-aromatic condensed heteropolycyclic group may be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, or a phosphoric acid group or a salt thereof;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alky aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(Q_{18})(Q_{19})$, $—P(=O)(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alky aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a C1-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(Q_{28})(Q_{29})$, $—P(=O)(Q_{28})(Q_{29})$, or a combination thereof;

$—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(Q_{38})(Q_{39})$, or $—P(=O)(Q_{38})(Q_{39})$; or a combination thereof, wherein $Q_1$ to $Q_9$, $Q_{11}$ to $Q_{19}$, $Q_{21}$ to $Q_{29}$, and $Q_{31}$ to $Q_{39}$ are each independently hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or a combination thereof; a $C_6$-$C_{60}$ aryloxy group; a C6-$C_{60}$ arylthio group; a $C_1$-$C_{60}$ heteroaryl group; a $C_1$-$C_{60}$ heteroaryloxy group; a $C_1$-$C_{60}$ heteroarylthio group; a monovalent non-aromatic condensed polycyclic group; or a monovalent non-aromatic condensed heteropolycyclic group.

In one or more embodiments, the organometallic compound may be one or more of Compounds Pt-1 to Pt-63, but embodiments are not limited thereto:

Pt-1
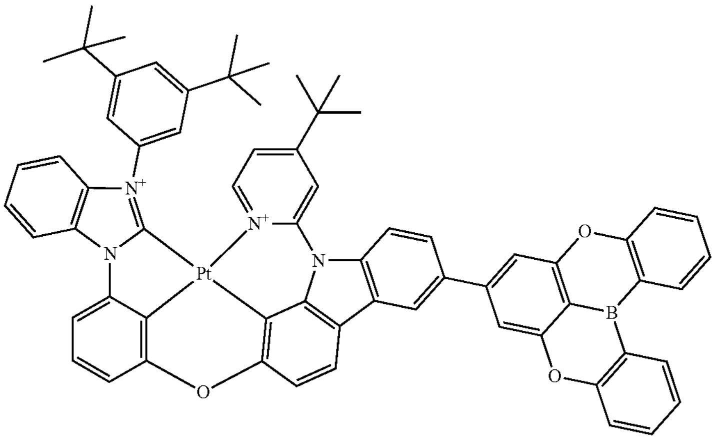
Pt-2
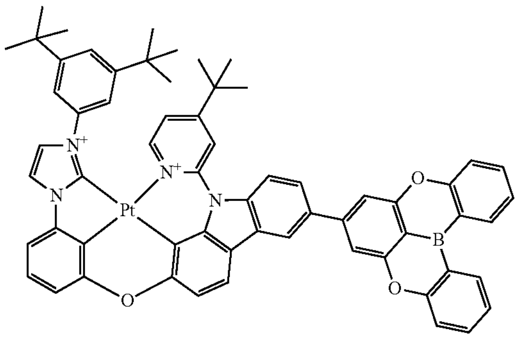
Pt-3
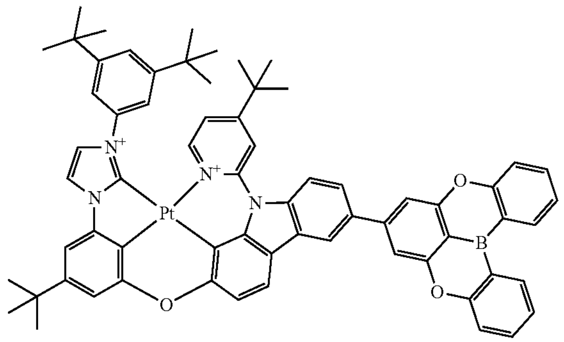
Pt-4
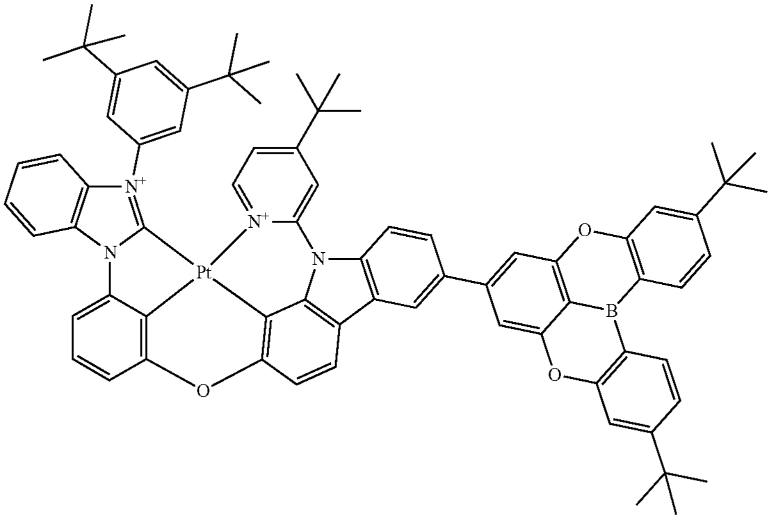

-continued
Pt-5
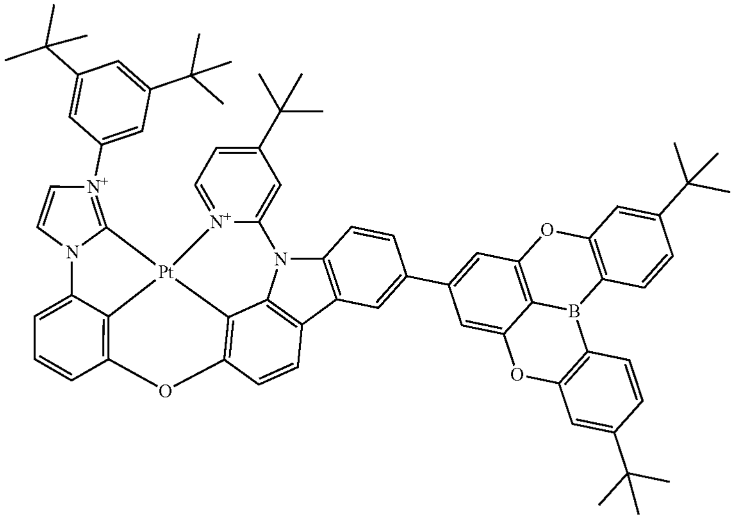
Pt-6
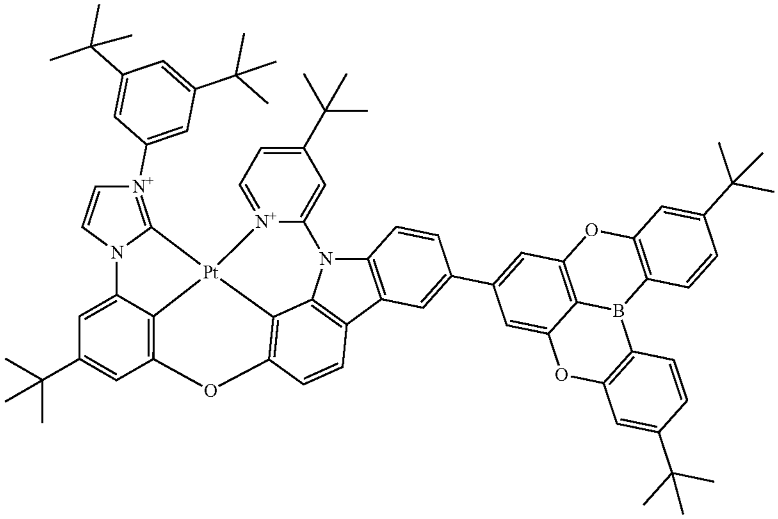
Pt-7
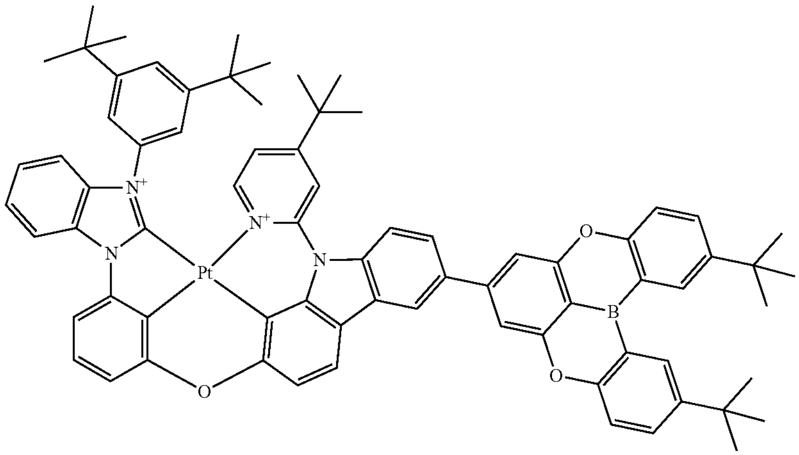

-continued
Pt-8
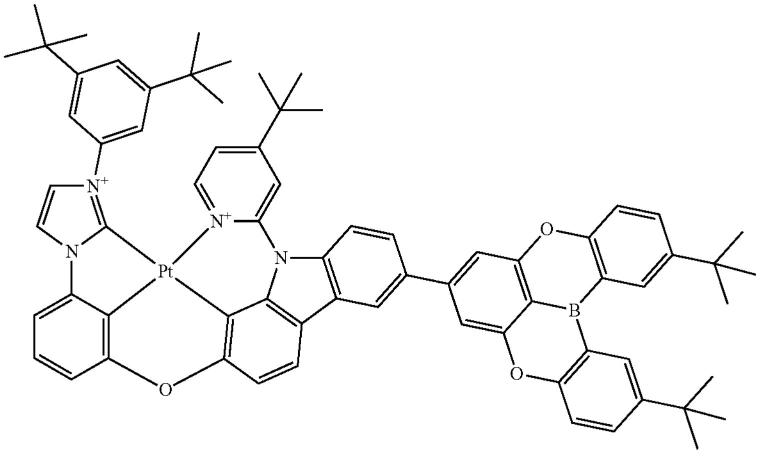
Pt-9
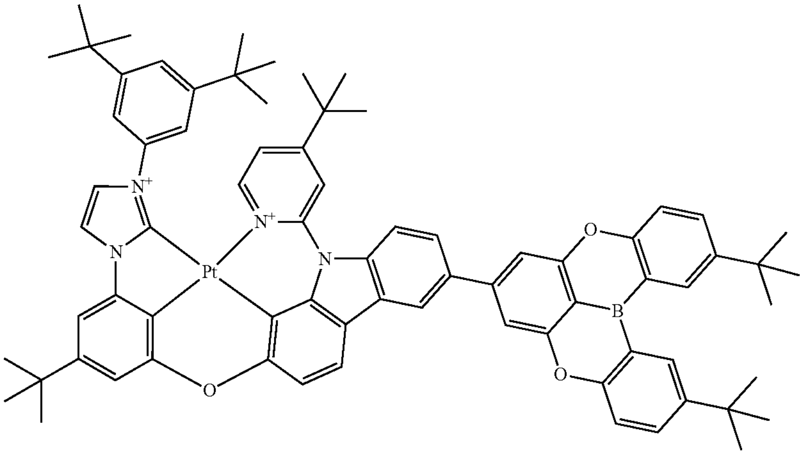
Pt-10
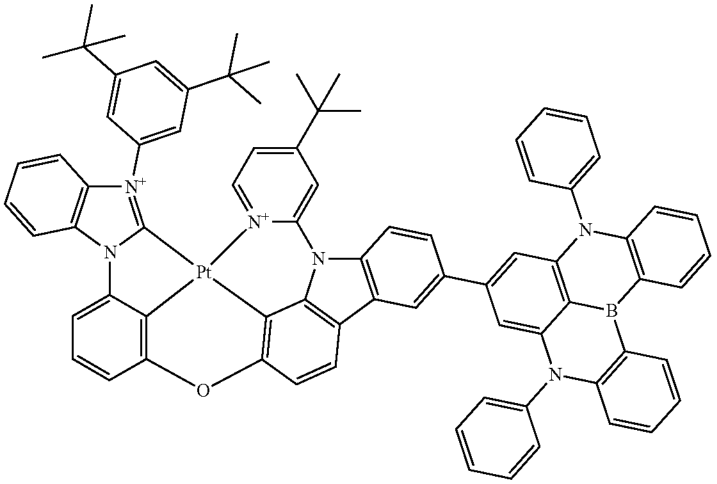

-continued
Pt-11
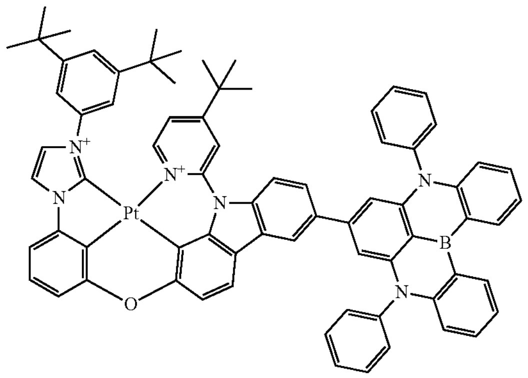
Pt-12
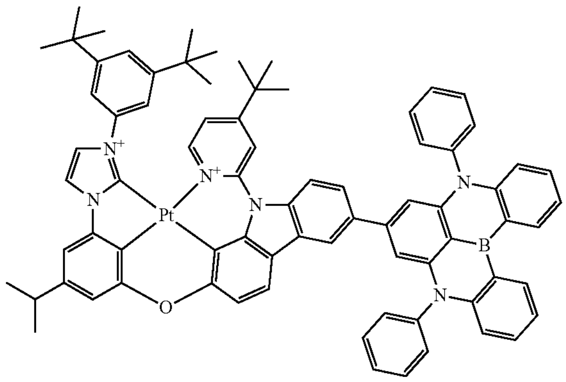
Pt-13
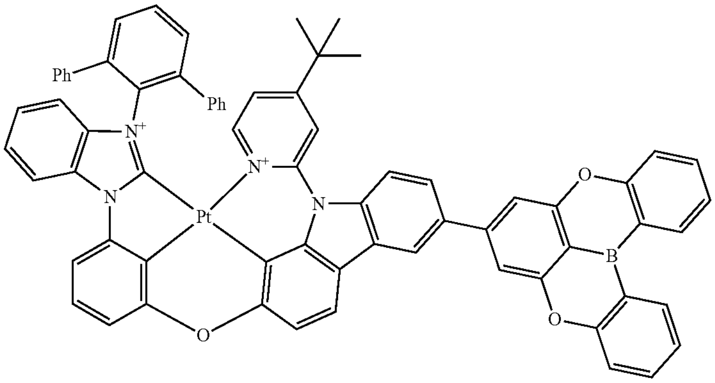
Pt-14
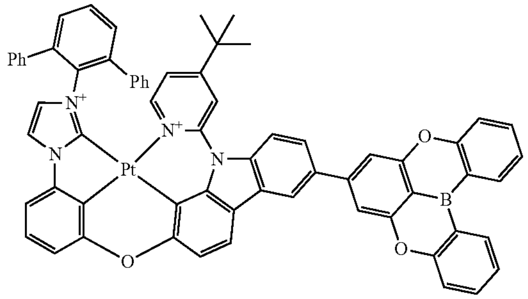
Pt-15
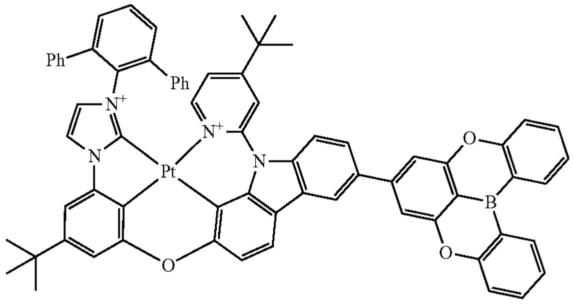
Pt-16
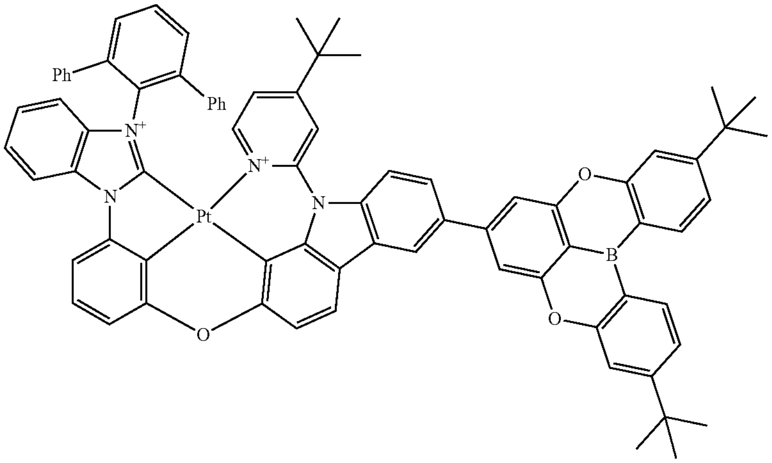

-continued
Pt-17
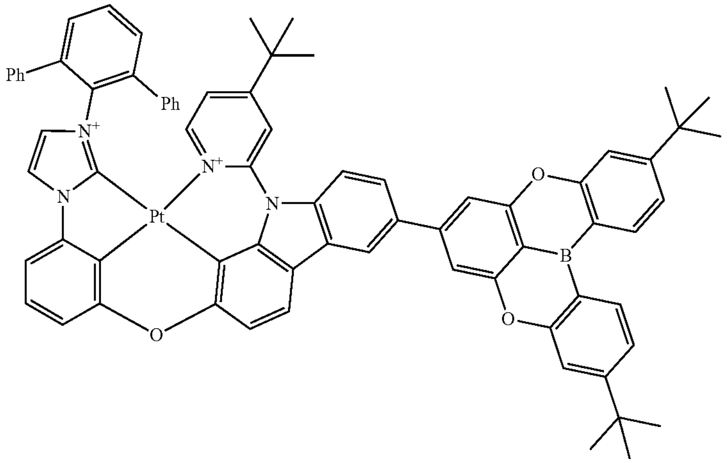
Pt-18
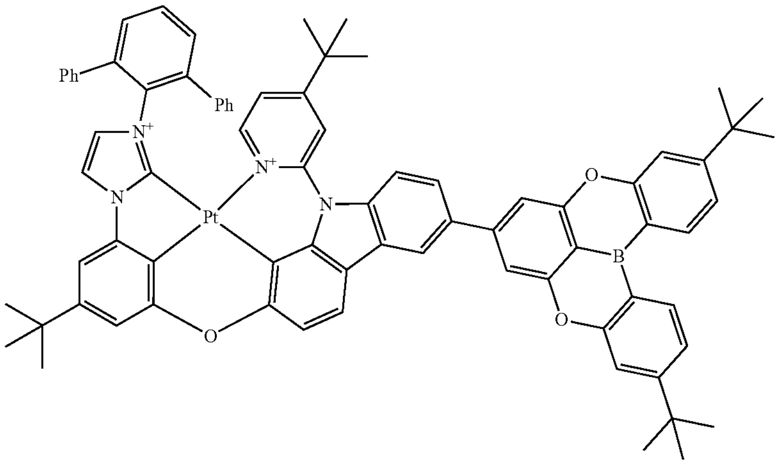
Pt-19
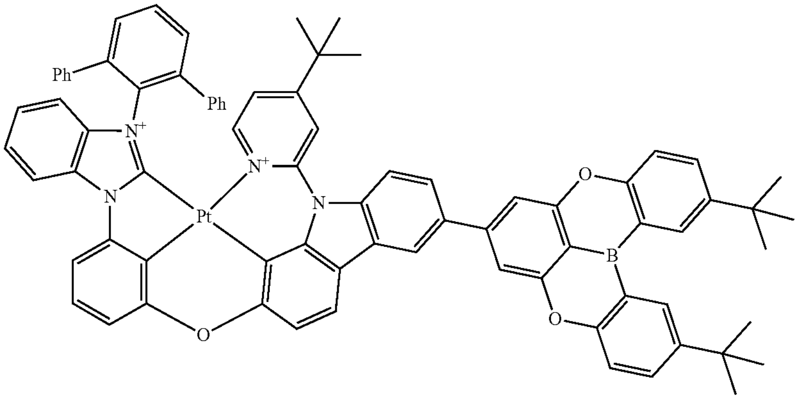

-continued
Pt-20
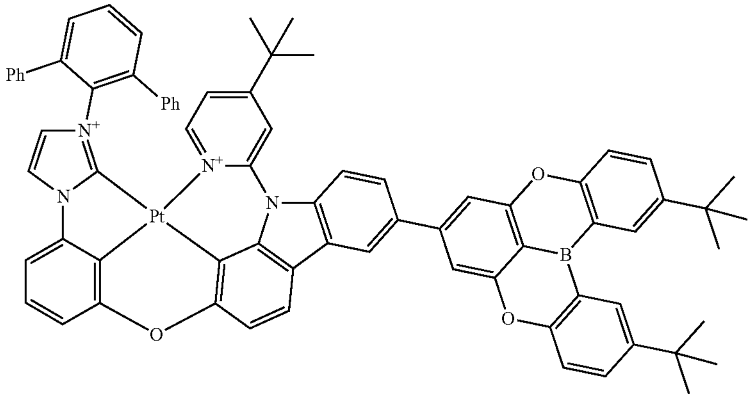
Pt-21
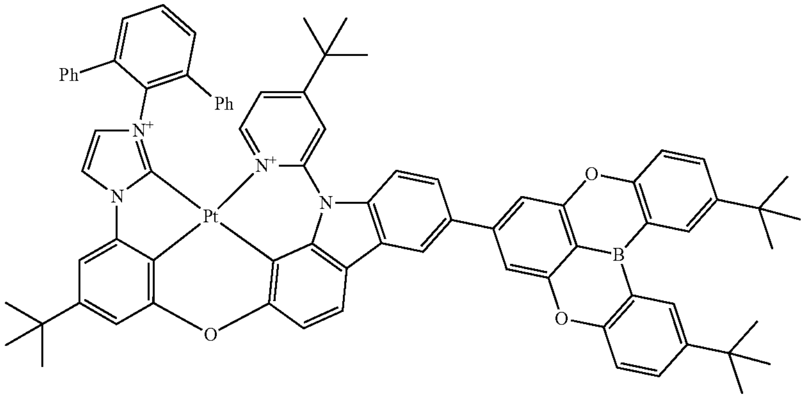
Pt-22
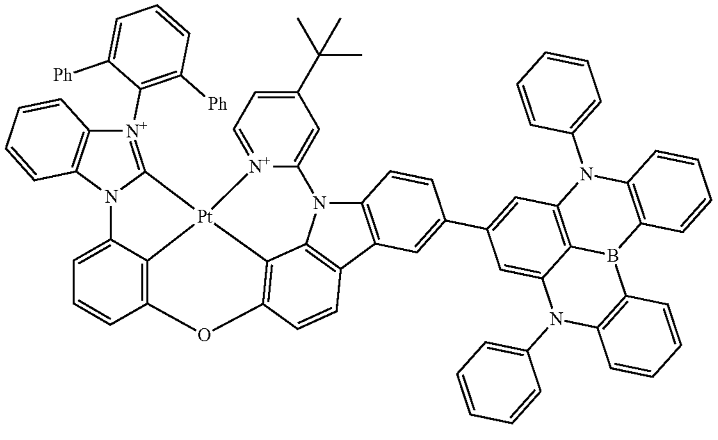
Pt-23
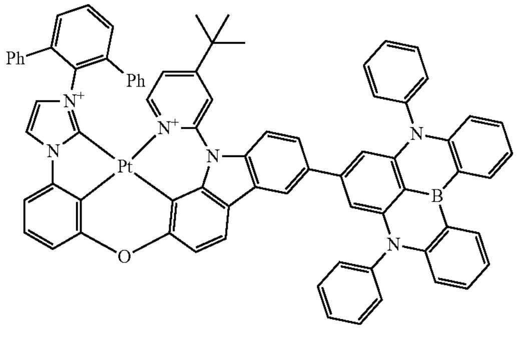
Pt-24
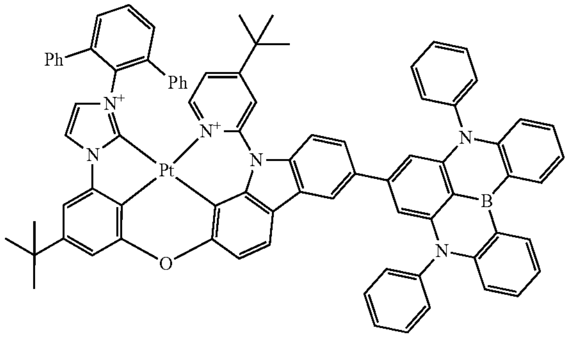

-continued
Pt-25
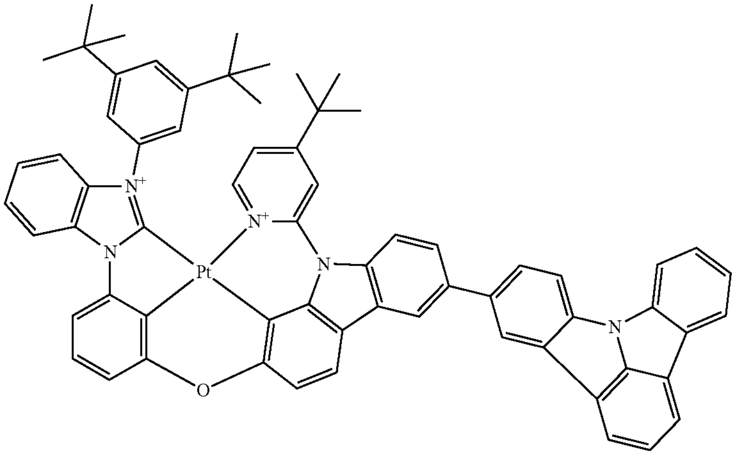
Pt-26
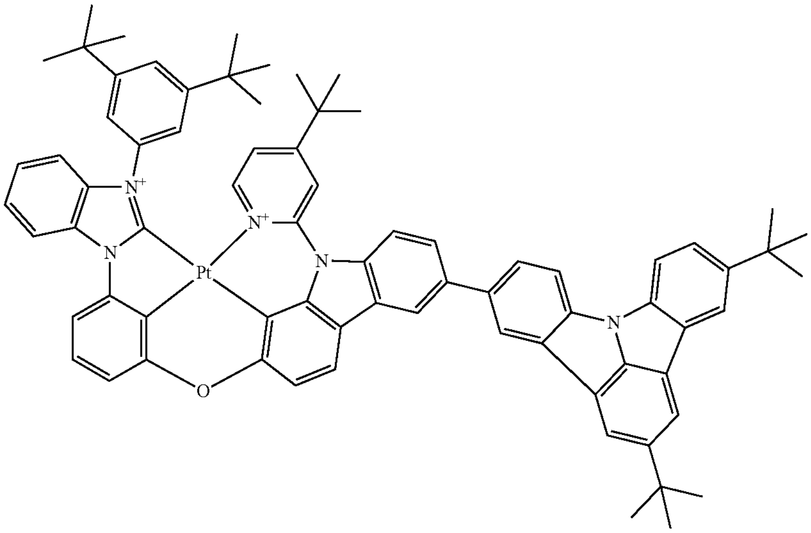
Pt-27
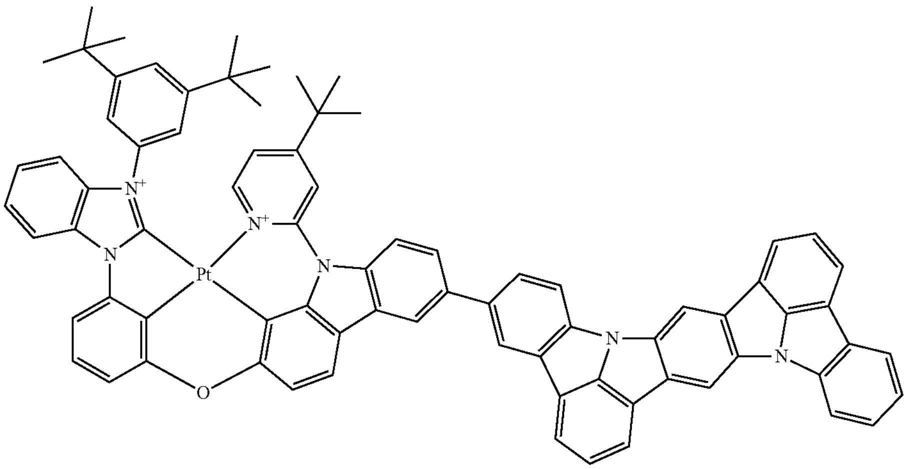

-continued
Pt-28
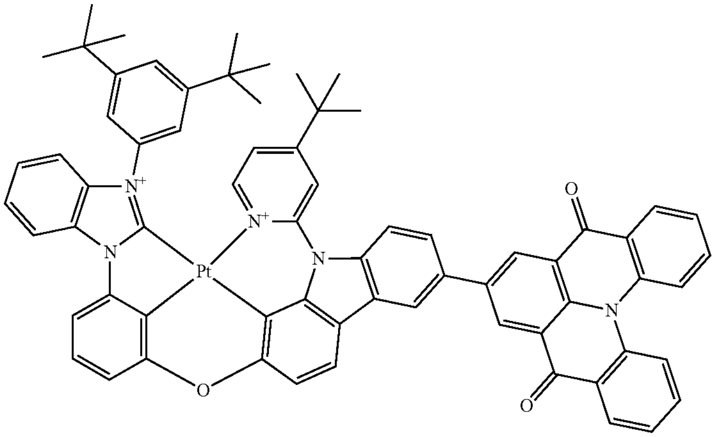
Pt-29
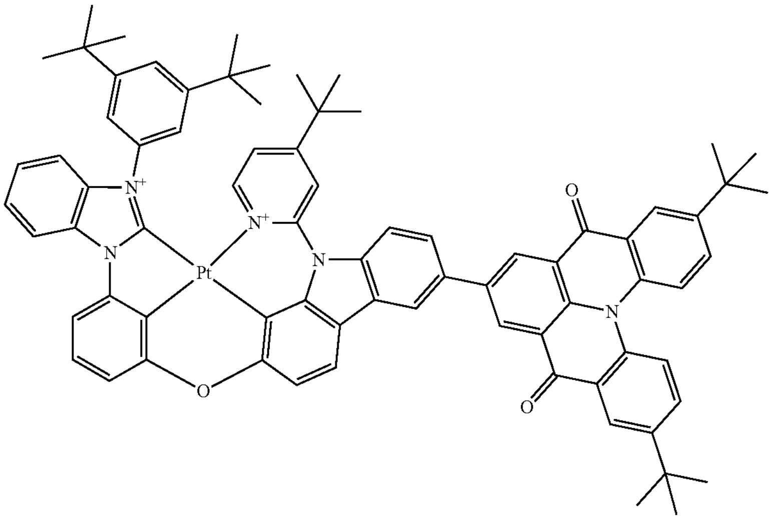
Pt-30
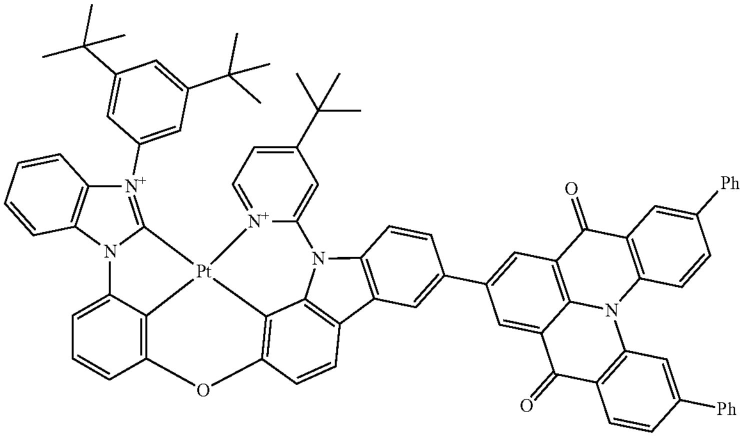

-continued
Pt-31
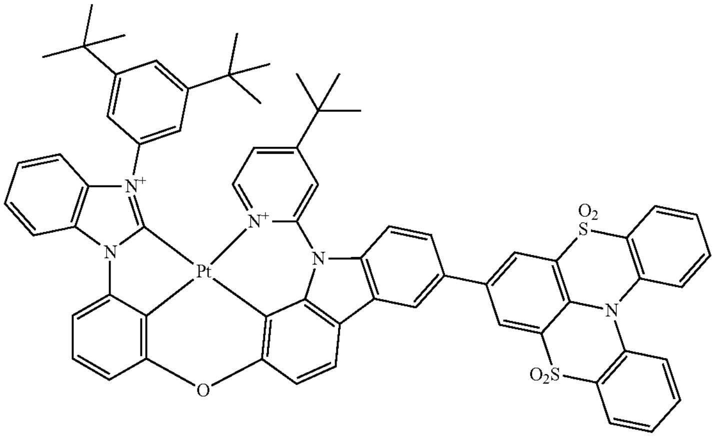
Pt-32
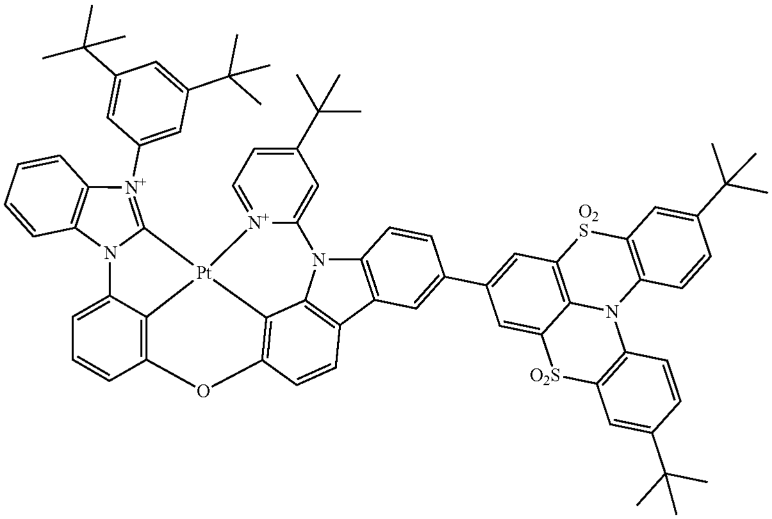
Pt-33
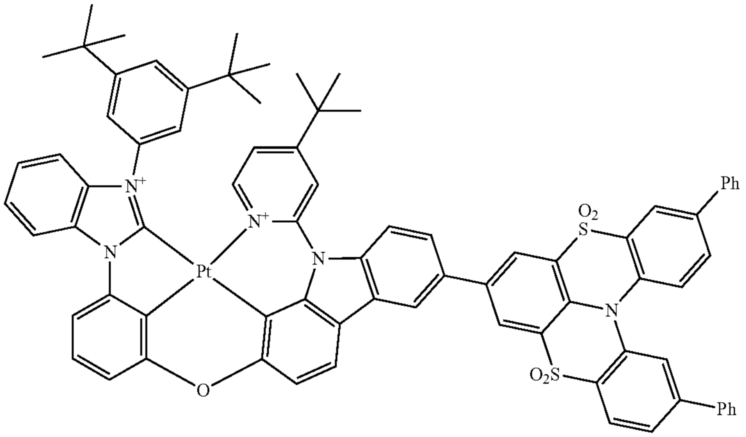

-continued
Pt-34
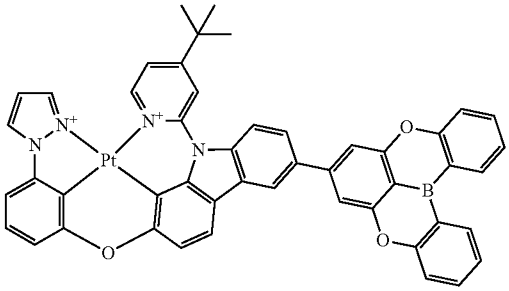
Pt-35
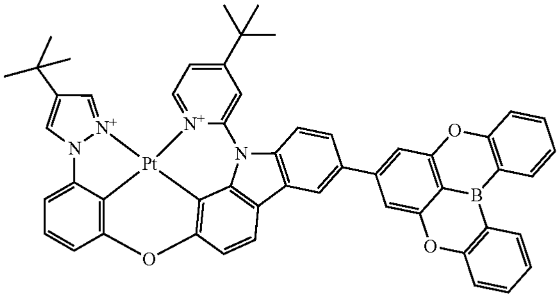
Pt-36
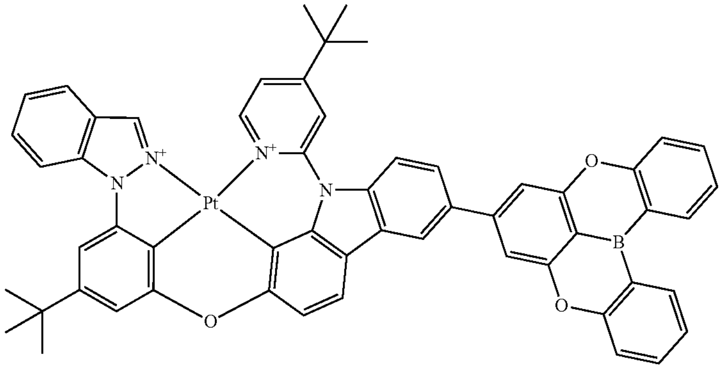
Pt-37
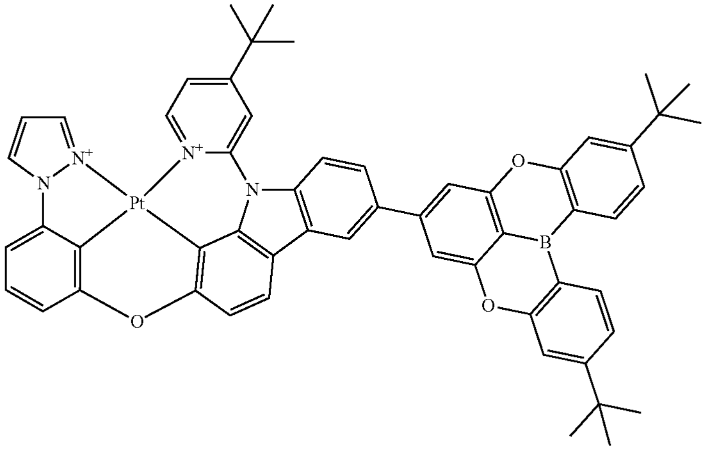
Pt-38
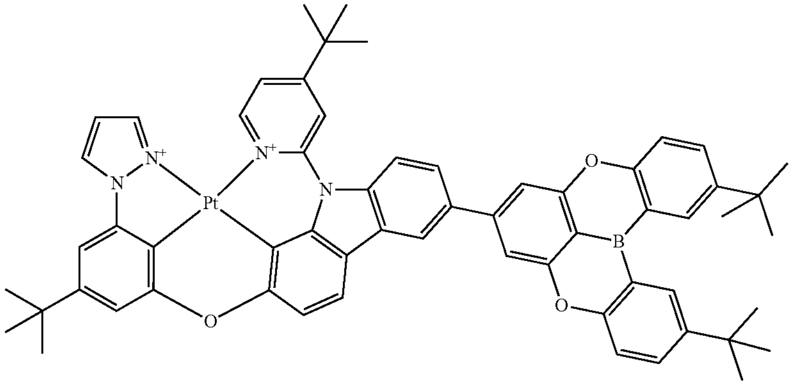

-continued
Pt-39
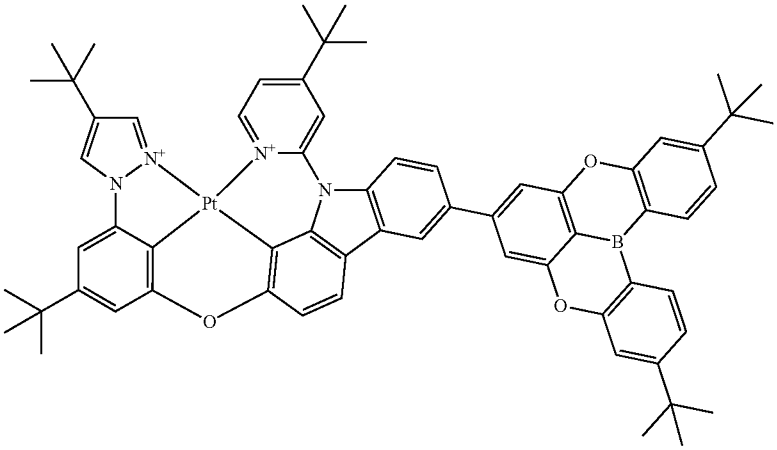
Pt-40
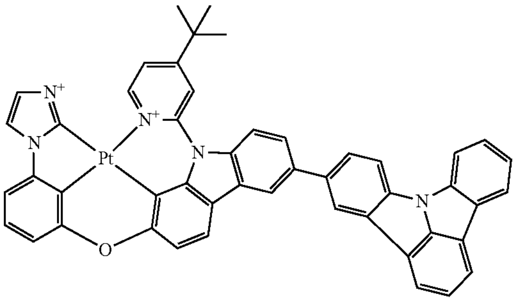
Pt-41
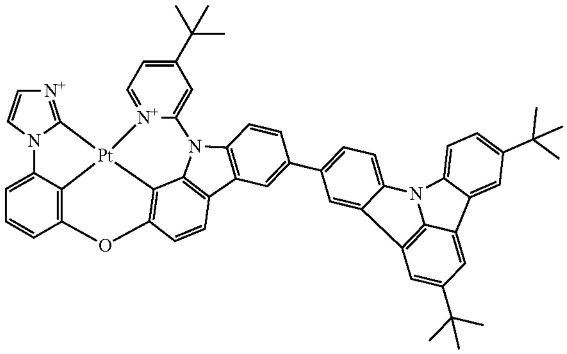
Pt-42
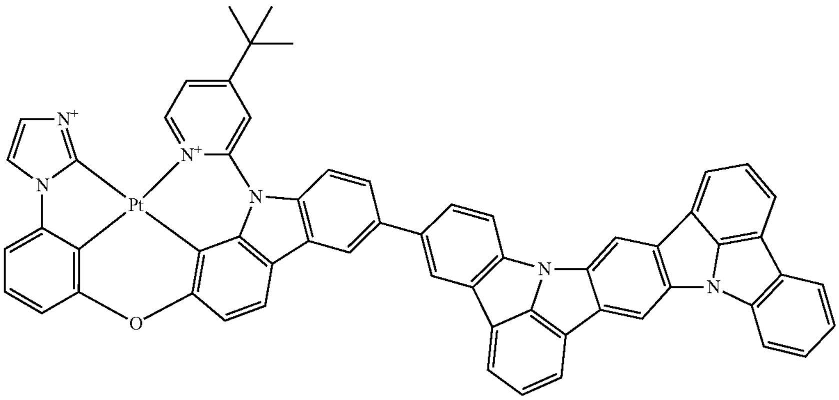
Pt-43
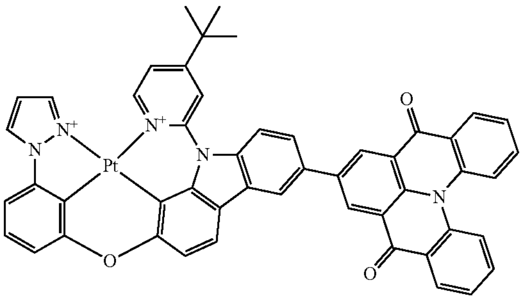
Pt-44
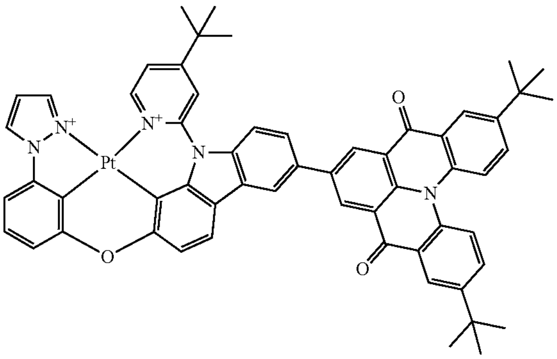

-continued
Pt-45
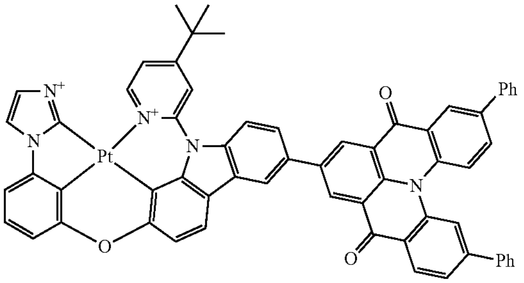
Pt-46
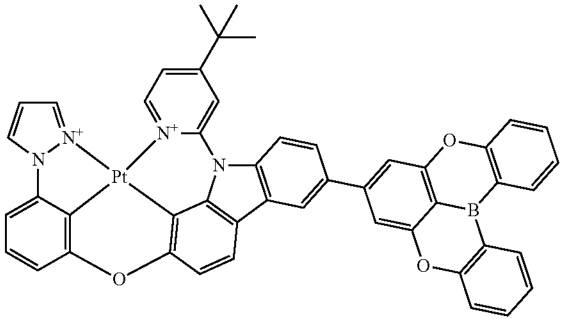
Pt-47
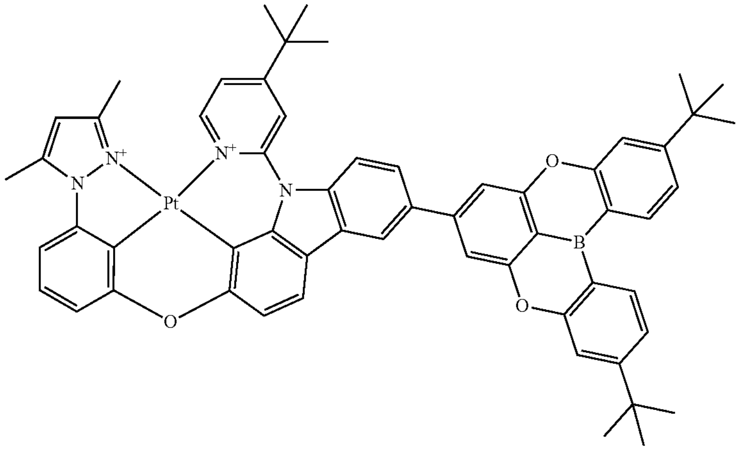
Pt-48
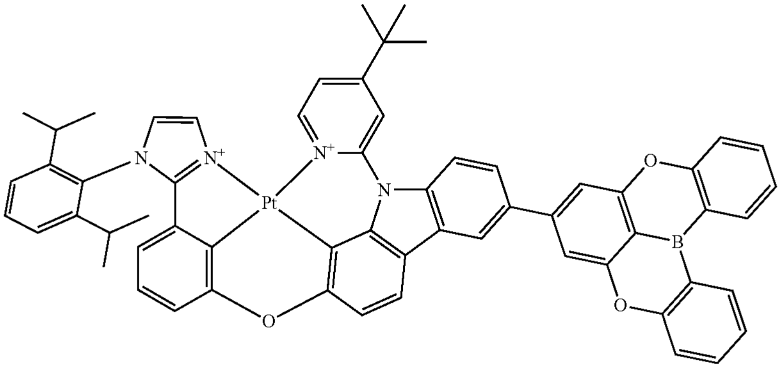
Pt-49
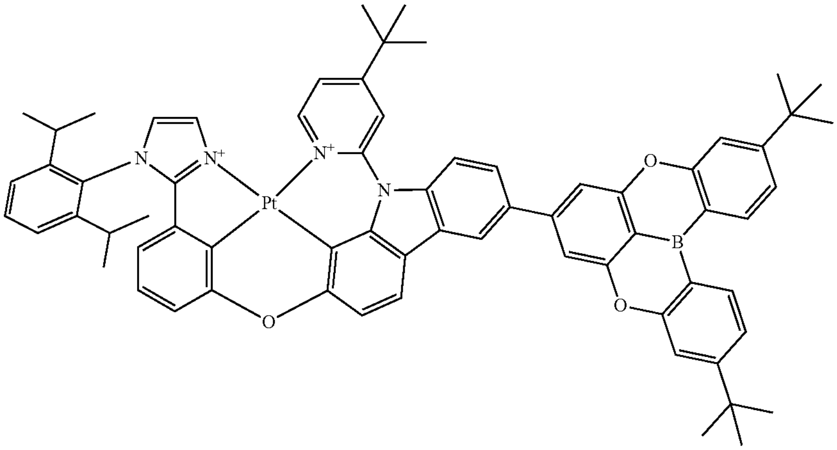

-continued
Pt-50
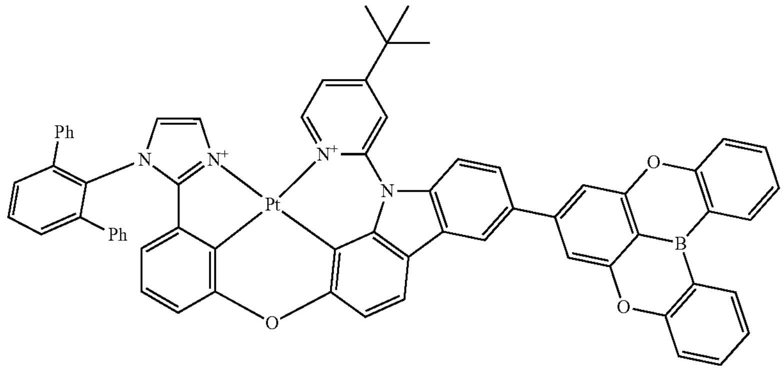
Pt-51
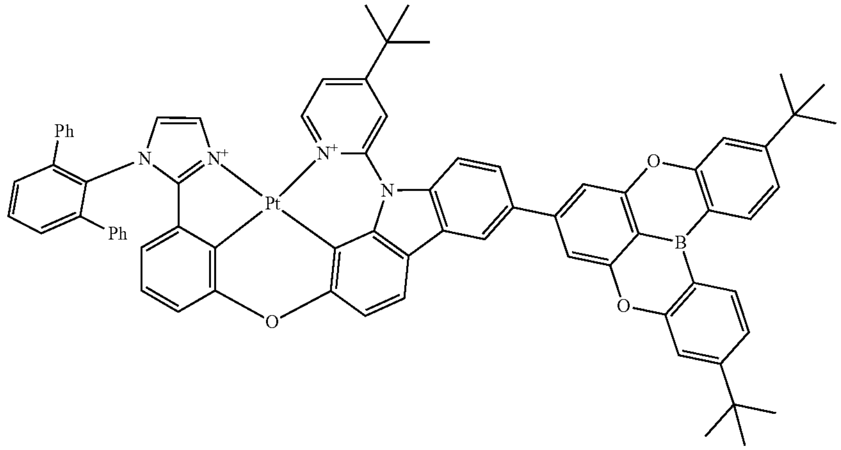
Pt-52
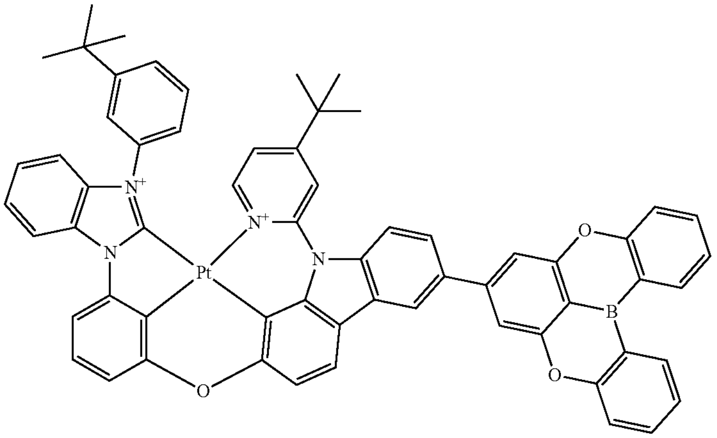
Pt-53
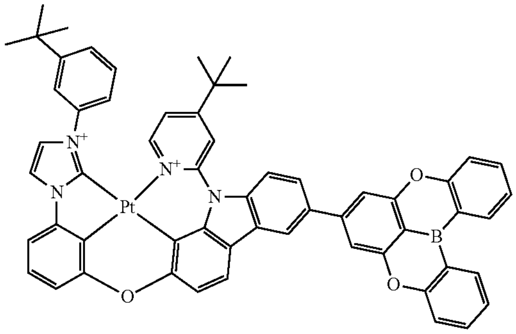
Pt-54
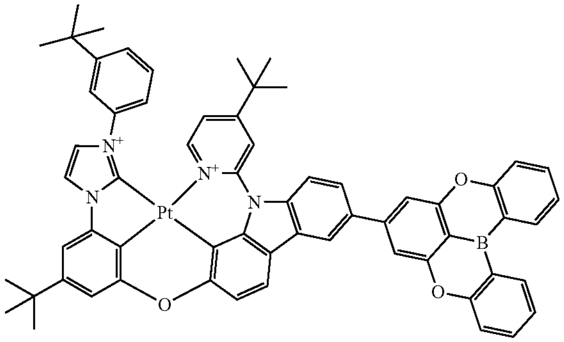

-continued
Pt-55
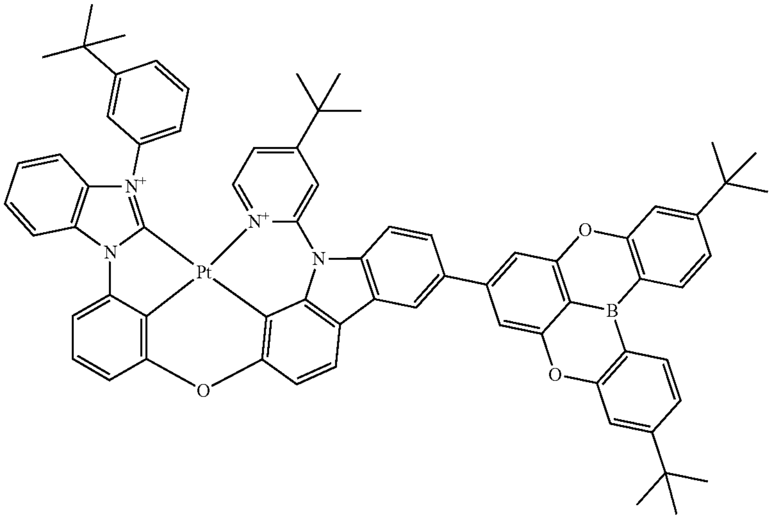
Pt-56
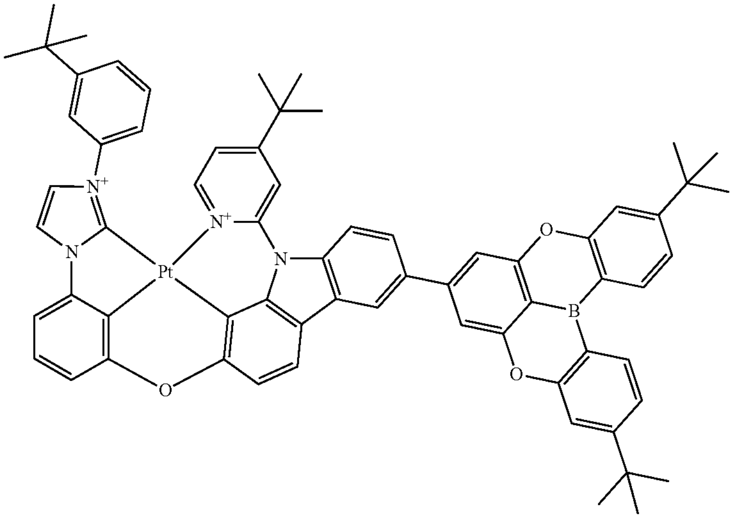
Pt-57
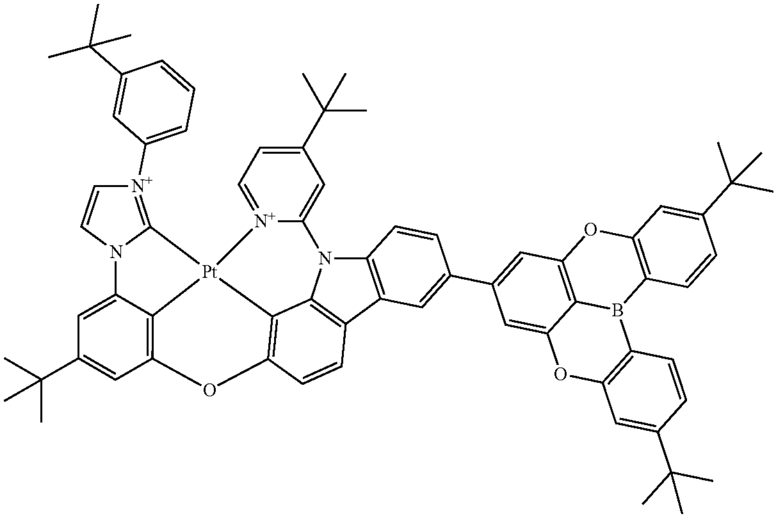

-continued
Pt-58
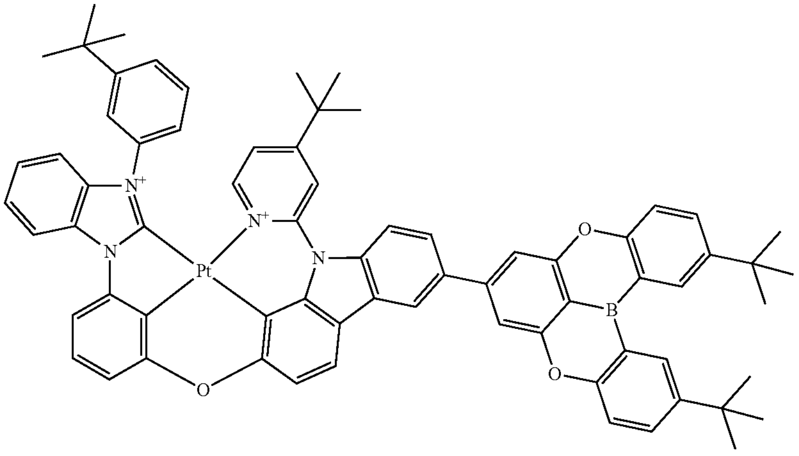
Pt-59
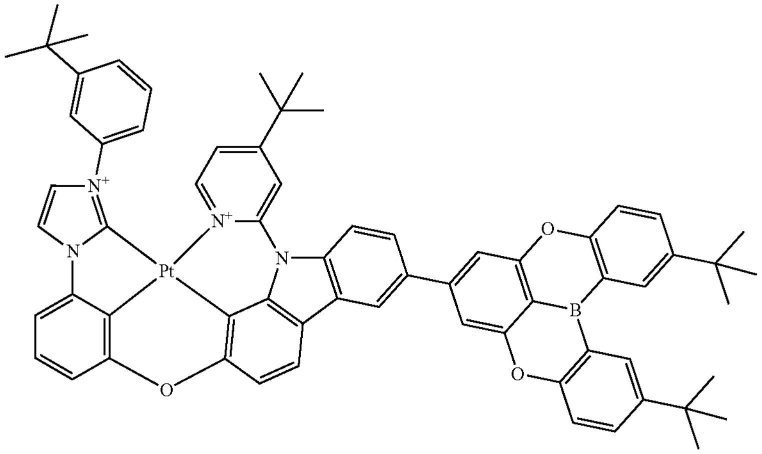
Pt-60
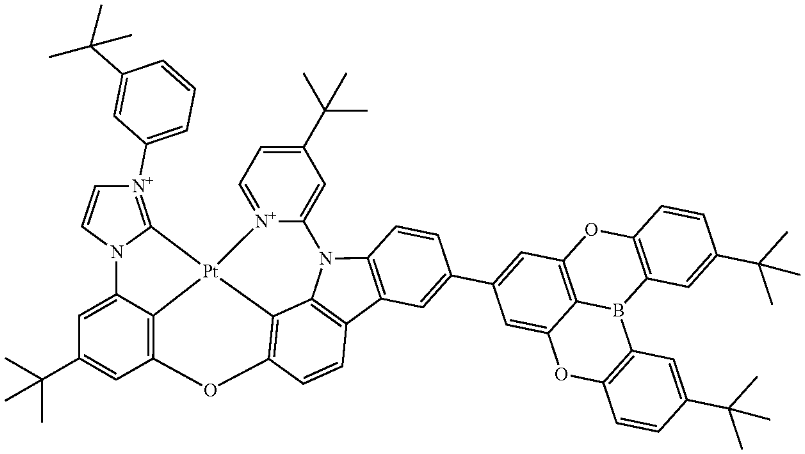

-continued

Pt-61

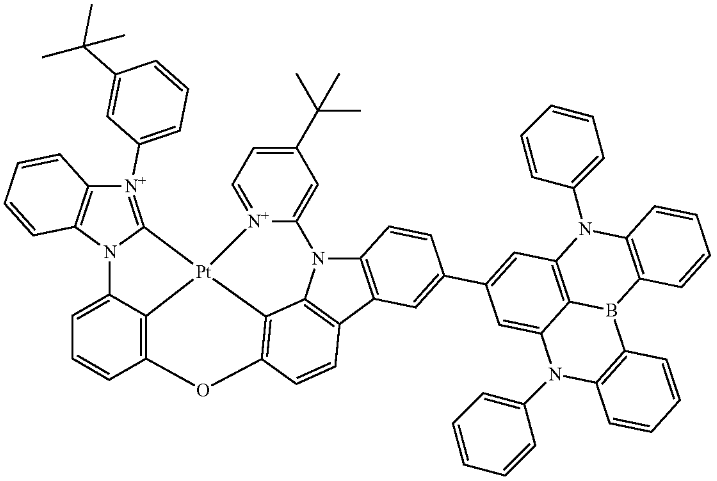

Pt-62

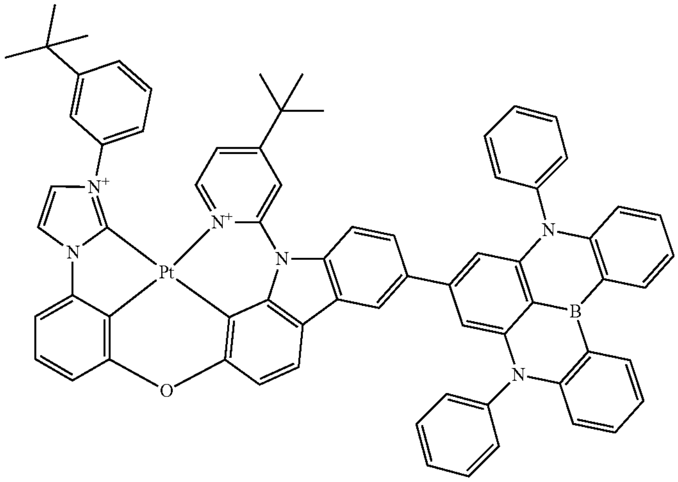

Pt-63

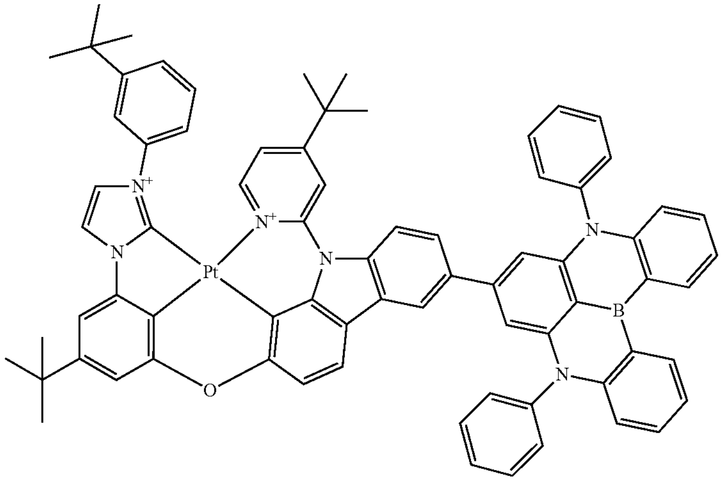

The organometallic compound represented by Formula 1 may include a group represented by Formula 2 as a substituent, and, without withing to be bound to theory, a localized excited state ($^3$LC) energy of a ligand may be stabilized. Accordingly, a level of contribution of emission from $^3$LC may increase upon emission of the organometallic compound, and thus an intensity of a second emission peak of an emission spectrum of the organometallic compound may decrease, and accordingly, colorimetric purity may be improved.

Further, the organometallic compound represented by Formula 1 may include the group represented by Formula 2, and thus, intermolecular aggregation may be substantially suppressed. Accordingly, quenching of the organometallic compound may be substantially suppressed, and thus, an organic light-emitting device including the organometallic compound may have improved efficiency and lifespan. In addition, the organometallic compound represented by Formula 1 may include the group represented by Formula 2, and thus, formation of an intermolecular exciplex and excimer formation may be substantially suppressed. Accordingly, an organic light-emitting device including the organometallic compound may have improved colorimetric purity.

A method of synthesizing the organometallic compound represented by Formula 1 may be apparent to one of ordinary skill in the art by referring to Synthesis Examples provided herein.

The highest occupied molecular orbital (HOMO) energy level (electron Volts (eV)), lowest unoccupied molecular orbital (LUMO) energy level (eV), lowest excitation triplet (T1) energy level (eV), of selected organometallic compounds represented by Formula 1 according to one or more embodiments and Comparative Compounds C1 and C2 were calculated using a density functional theory (DFT) method of the Gaussian 09 program with molecular structure optimized at the B3LYP level. In addition, the decay time (τ, microseconds (μs)), full width at half maximum (FWHM, nanometers (nm)), and maximum emission wavelength ($\lambda_{max}$, nm) were measured for each of these compounds. The results thereof are shown in Table 1.

TABLE 1

| Compound No. | HOMO (eV) | LUMO (eV) | T1 (eV) | (τ) (μs) | FWHM (nm) | Maximum emission wavelength ($\lambda_{max}$) (nm) |
|---|---|---|---|---|---|---|
| Pt-1 | −4.72 | −1.65 | 2.66 | 0.58 | 28 | 461 |
| Pt-2 | −4.67 | −1.63 | 2.68 | 0.99 | 27 | 458 |
| Pt-3 | −4.63 | −1.62 | 2.67 | 0.88 | 27 | 459 |
| Pt-4 | −4.70 | −1.52 | 2.66 | 0.54 | 29 | 461 |
| Pt-5 | −4.65 | −1.50 | 2.70 | 0.91 | 27 | 459 |
| Pt-6 | −4.62 | −1.50 | 2.69 | 0.77 | 27 | 456 |
| Pt-7 | −4.70 | −1.60 | 2.66 | 0.57 | 28 | 461 |
| Pt-8 | −4.65 | −1.58 | 2.69 | 0.95 | 26 | 456 |
| Pt-9 | −4.61 | −1.57 | 2.68 | 0.79 | 27 | 457 |
| Pt-25 | −4.68 | −1.26 | 2.66 | 0.54 | 29 | 460 |
| Pt-26 | −4.66 | −1.23 | 2.66 | 0.56 | 28 | 461 |
| Pt-46 | −4.86 | −1.68 | 2.70 | 1.53 | 15 | 455 |
| Pt-47 | −4.75 | −1.54 | 2.70 | 0.76 | 20 | 455 |
| Pt-48 | −4.66 | −1.63 | 2.60 | 1.07 | 50 | 469 |
| Pt-49 | −4.64 | −1.50 | 2.60 | 1.05 | 50 | 470 |
| Pt-50 | −4.67 | −1.63 | 2.58 | 1.16 | 52 | 473 |
| Pt-51 | −4.65 | −1.50 | 2.57 | 1.16 | 53 | 473 |
| C1 | −4.65 | −1.22 | 2.65 | 0.58 | 32 | 461 |
| C2 | −4.43 | −1.59 | 1.91 | 3.72 | 41 | 648 |

Compound C1

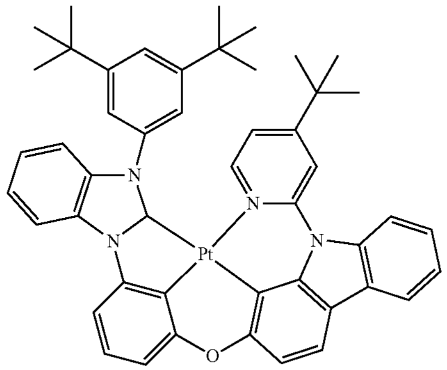

Compound C2

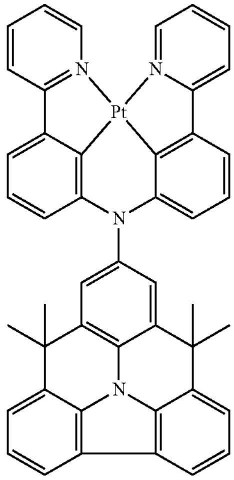

.

Referring to the results of Table 1, the organometallic compound according to one or more embodiments was found to have a high T1 energy level and a maximum emission wavelength that is blue-shifted, as compared with Comparative Compound C2. Thus, the organometallic compound may have suitable electrical characteristics for use as an emission layer material, e.g., a blue light-emitting material.

According to another aspect, an organic light-emitting device includes a first electrode; a second electrode; and an organic layer located between the first electrode and the second electrode, wherein the organic layer includes an emission layer and at least one organometallic compound described above.

Since the organic light-emitting device has an organic layer including the organometallic compound, the organic light-emitting device may have a low driving voltage, high efficiency, high luminance, high quantum efficiency, and long lifespan.

As used herein, the expression the "(organic layer) includes at least one organometallic compound" may be construed as meaning the "(organic layer) may include one organometallic compound of Formula 1 or two different organometallic compounds of Formula 1".

For example, Compound 1 may only be included in the organic layer as an organometallic compound. In this embodiment, Compound 1 may be included in the emission layer of the organic light-emitting device. In one or more embodiments, Compounds 1 and 2 may be included in the organic layer as organometallic compounds. In this embodiment, Compounds 1 and 2 may both be included in the same layer (for example, both Compounds 1 and 2 may be included in the emission layer).

In one or more embodiments, the at least one organometallic compound may be included in the emission layer of the organic light-emitting device.

In the emission layer, the at least one organometallic compound may serve as an emitter. In one or more embodiments, an emission layer including the at least one organometallic compound represented by Formula 1 may emit phosphorescence produced upon transition of triplet excitons to a ground state of the organometallic compound.

For example, the emission layer in the organic light-emitting device may include a host and a dopant, and the dopant may include the at least one organometallic compound. The host may be selected from suitable hosts. That is, the organometallic compound may serve as a dopant. The emission layer may emit blue light having a maximum emission wavelength in a range of about 440 nm to about 480 nm, for example, about 440 nm to about 470 nm.

In one or more embodiments, the emission layer may include a host and a dopant, wherein the host may be chosen from any suitable hosts, the dopant may include the organometallic compound represented by Formula 1, and the emission layer may further include a fluorescent dopant. For example, the emission layer may emit fluorescence produced upon transition of triplet excitons of the organometallic compound to the fluorescent dopant.

The first electrode may be an anode, which is a hole injection electrode, and the second electrode may be a cathode, which is an electron injection electrode. Alternatively, the first electrode may be a cathode, which is an electron injection electrode, and the second electrode may be an anode, which is a hole injection electrode.

In one or more embodiments, the first electrode may be an anode, the second electrode may be a cathode, and the organic layer may include a hole transport region located between the first electrode and the emission layer, and an electron transport region located between the emission layer and the second electrode, wherein the hole transport region may include a hole injection layer, a hole transport layer, an electron blocking layer, or a combination thereof, and the electron transport region may include a hole blocking layer, an electron transport layer, an electron injection layer, or a combination thereof.

For example, the organometallic compound may be included in at least one of the hole transport region and the electron transport region.

Description of FIG. 1

FIG. 1 illustrates a schematic cross-sectional view of an organic light-emitting device 10 according to one or more embodiments. Hereinafter, a structure of an organic light-emitting device according to one or more embodiments and a method of manufacturing the organic light-emitting device according to one or more embodiments will be described with reference to FIG. 1.

The organic light-emitting device 10 in FIG. 1 may include a first electrode 11, an organic layer 15, and a second electrode 19, which may be sequentially layered in this stated order.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and water repellency.

The first electrode 11 may be produced by depositing or sputtering, onto the substrate, a material for forming the first electrode 11. The first electrode 11 may be an anode. The material for forming the first electrode 11 may be selected from materials with a high work function for easy hole injection.

The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be a metal, such as magnesium (Mg), aluminum (Al), silver (Ag), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. In one or more embodiments, the first electrode 11 may include a triple-layered structure of ITO/Ag/ITO, but embodiments are not limited thereto.

The organic layer 15 may be located on the first electrode 11.

The organic layer 15 may include a hole transport region, an emission layer, and an electron transport region.

The hole transport region may be located between the first electrode 11 and the emission layer.

The hole transport region may include at least one of a hole injection layer, a hole transport layer, an electron blocking layer, or a buffer layer.

The hole transport region may include a hole injection layer only, or a hole transport layer only. In one or more embodiments, the hole transport region may include a hole injection layer and a hole transport layer which are sequentially stacked on the first electrode 11. In one or more embodiments, the hole transport region may include a hole injection layer, a hole transport layer, and an electron blocking layer, which are sequentially stacked on the first electrode 11.

When the hole transport region includes a hole injection layer, the hole injection layer may be formed on the first electrode 11 by using one or more suitable methods, such as vacuum deposition, spin coating, casting, and Langmuir-Blodgett (LB) deposition.

When a hole injection layer is formed by vacuum-deposition, for example, the vacuum deposition may be performed at a temperature in a range of about 100° C. to about 500° C., at a vacuum degree in a range of about $10^{-8}$ torr to about $10^{-3}$ torr, and at a rate in a range of about 0.01 Angstroms per second (Å/sec) to about 100 Å/sec, though the conditions may vary depending on a compound used as a hole injection material and a structure and thermal properties of a desired hole injection layer, but embodiments are not limited thereto.

When a hole injection layer is formed by spin coating, the spin coating may be performed at a rate in a range of about 2,000 revolutions per minute (rpm) to about 5,000 rpm and at a temperature in a range of about 80° C. to 200° C. to facilitate removal of a solvent after the spin coating, though the conditions may vary depending on a compound used as a hole injection material and a structure and thermal properties of a desired hole injection layer, but embodiments are not limited thereto.

The conditions for forming a hole transport layer and an electron blocking layer may be inferred from the conditions for forming the hole injection layer.

The hole transport region may include at least one of 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), N,N'-di(1-naphthyl)-N,N'-diphenylbenzidine (NPB), R—NPB, N,N'-bis(3-methylphenyl)-N,N'-diphenyl-[1,1-biphenyl]-4,4'-diamine (TPD), spiro-TPD, spiro-NPB, methylated NPB, 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), (polyaniline)/poly(4-styrenesulfonate) (PANI/PSS), a compound represented by Formula 201, or a compound represented by Formula 202:

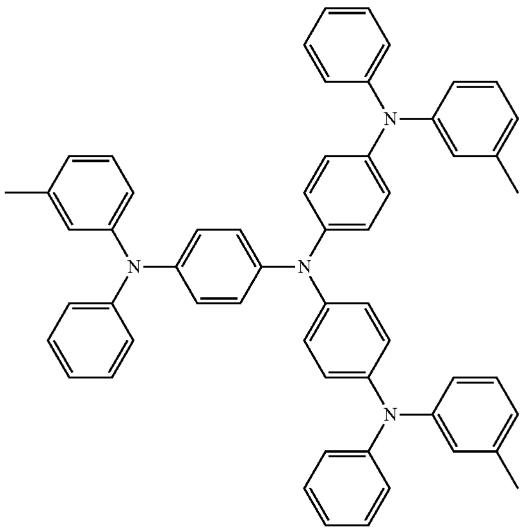

m-MTDATA

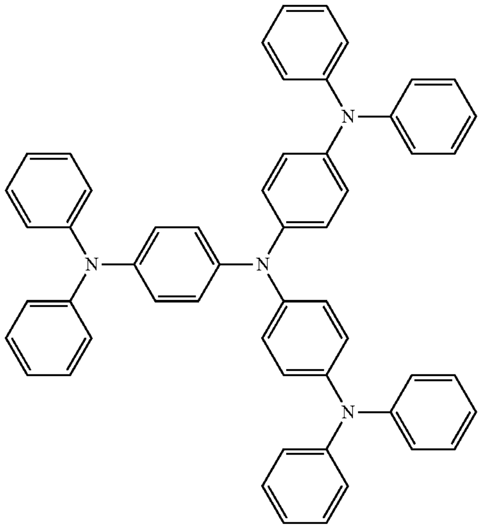

TDATA

-continued

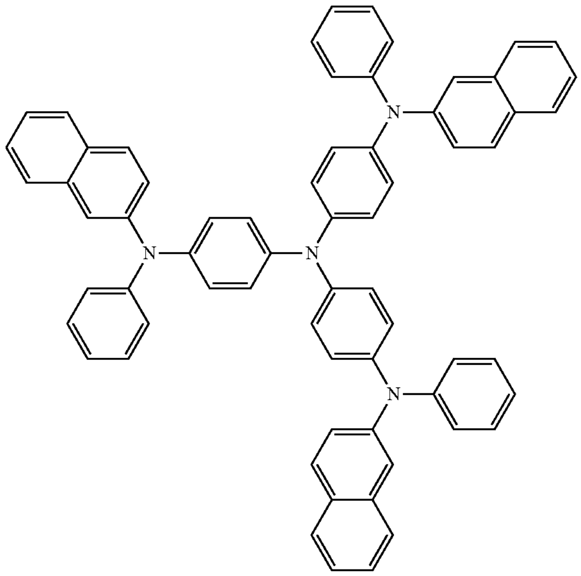

2-TNATA

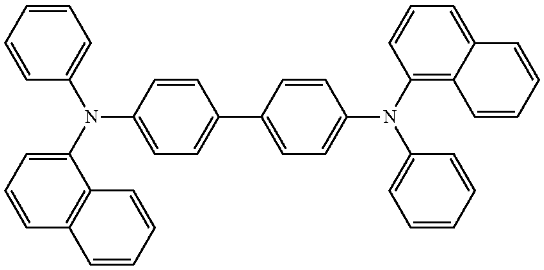

NPB

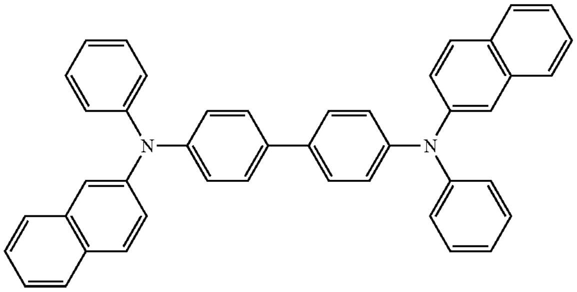

β-NPB

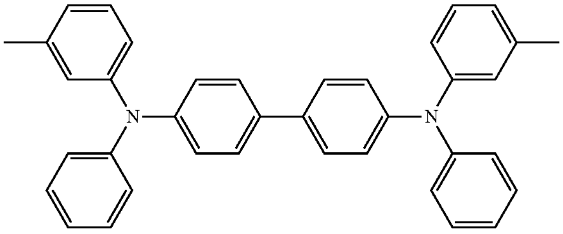

TPD

-continued

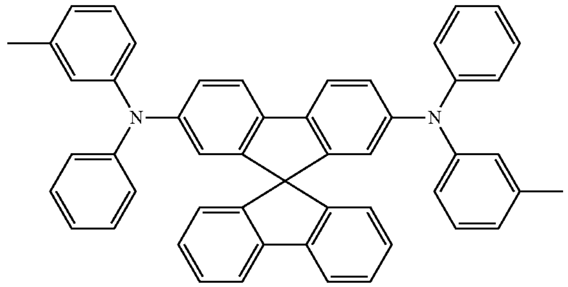

Spiro-TPD

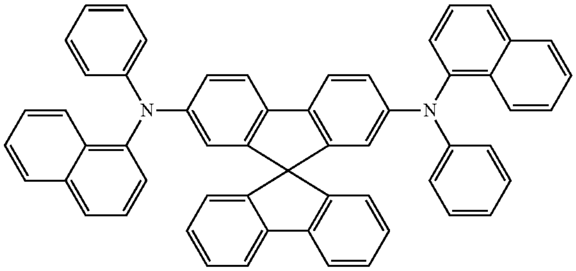

Spiro-NPB

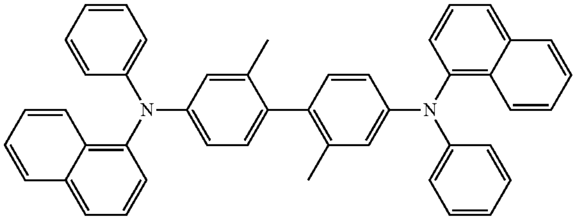

methylated NPB

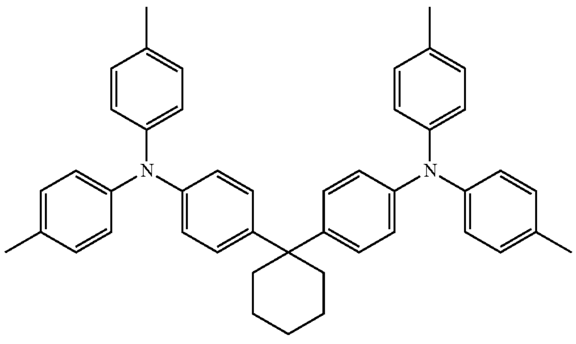

TAPC

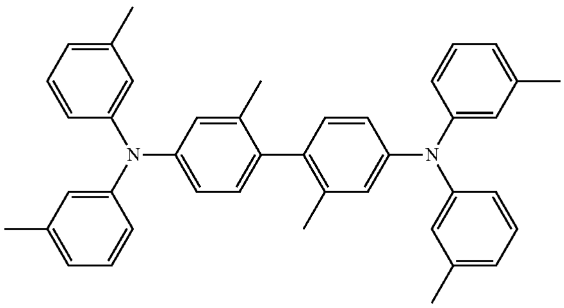

HMTPD

-continued

Formula 201

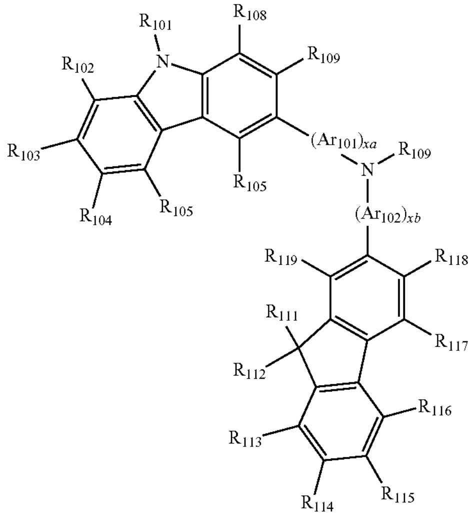

Formula 202

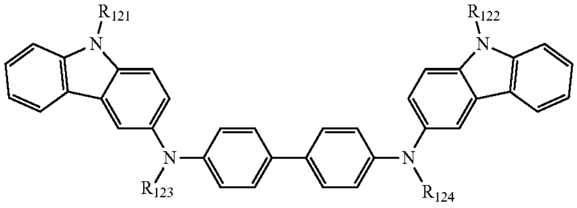

wherein, in Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or a combination thereof.

In Formula 201, xa and xb may each independently be an integer from 0 to 5. In one or more embodiments, xa and xb may each independently be 0, 1, or 2. In one or more embodiments, xa may be 1, and xb may be 0, but embodiments are not limited thereto.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, pentyl group, or a hexyl group), or a $C_1$-$C_{10}$ alkoxy group (e.g., a methoxy group, an ethoxy group, a propoxy group, a butoxy group, or a pentoxy group);

a $C_1$-$C_{10}$ alkyl group, a $C_1$-$C_{10}$ alkoxy group, or a $C_1$-$C_{10}$ alkylthio group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_1$-$C_{10}$ alkylthio group, or a combination thereof.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a naphthyl group, an anthracenyl group, a pyridinyl group, or a combination thereof.

In one or more embodiments, the compound represented by Formula 201 may be represented by Formula 201A:

Formula 201A

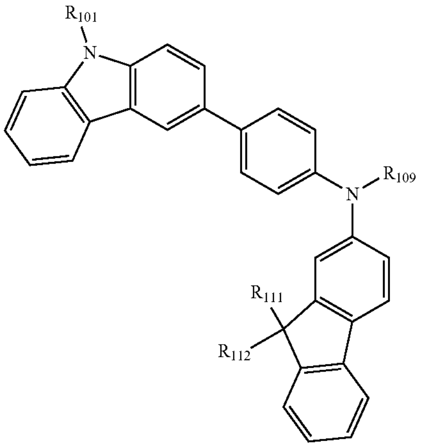

wherein, in Formula 201A, $R_{101}$, $R_{111}$, $R_{112}$, and $R_{109}$ may respectively be understood by referring to the descriptions of $R_{101}$, $R_{111}$, $R_{112}$, and $R_{109}$ provided herein.

In one or more embodiments, the hole transport region may include one of Compounds HT1 to HT20 or a combination thereof:

HT1

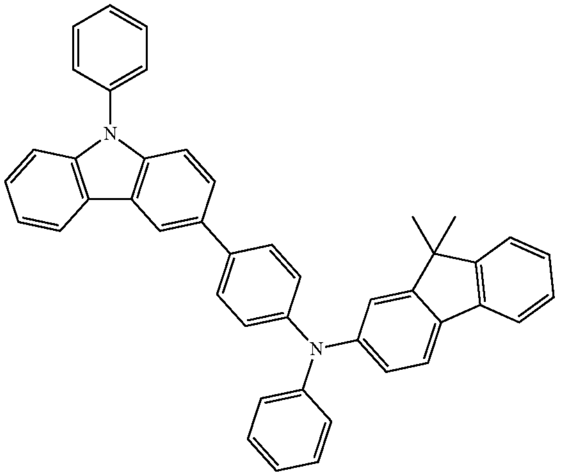

HT2

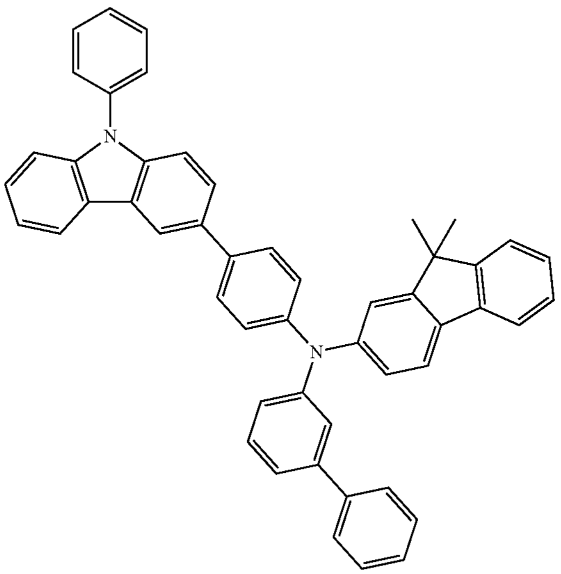

-continued
HT3
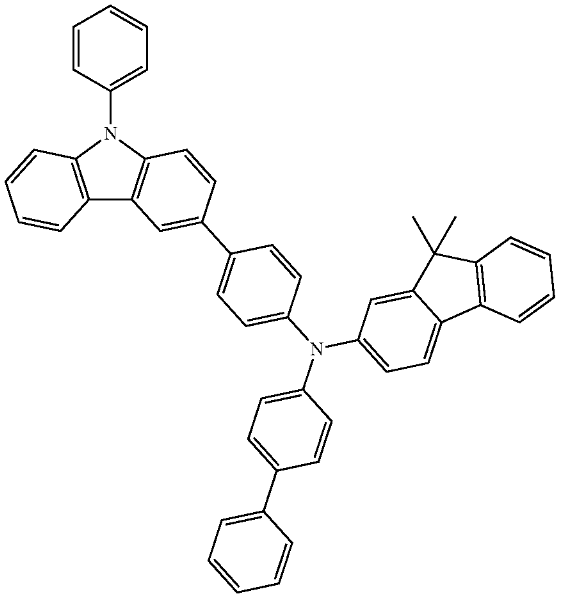
HT4
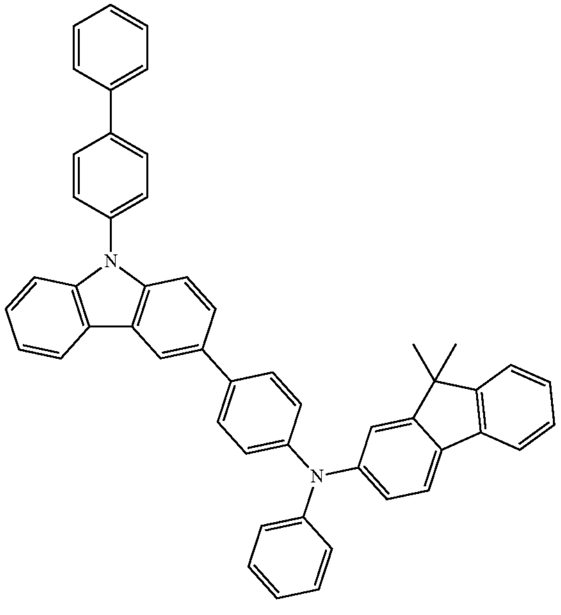
-continued
HT5
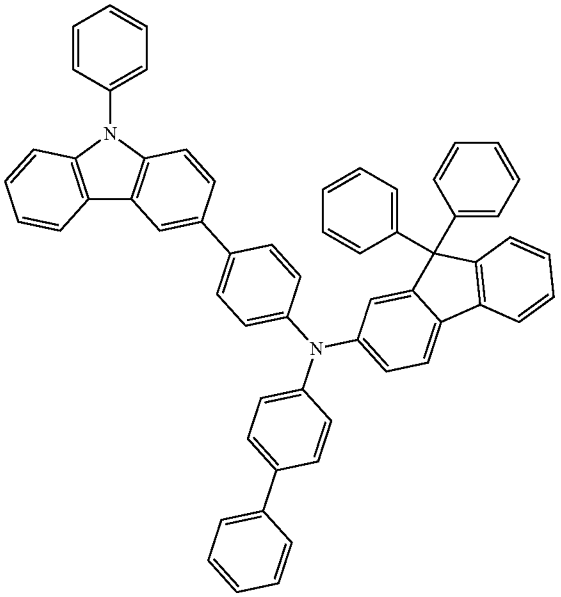
HT6
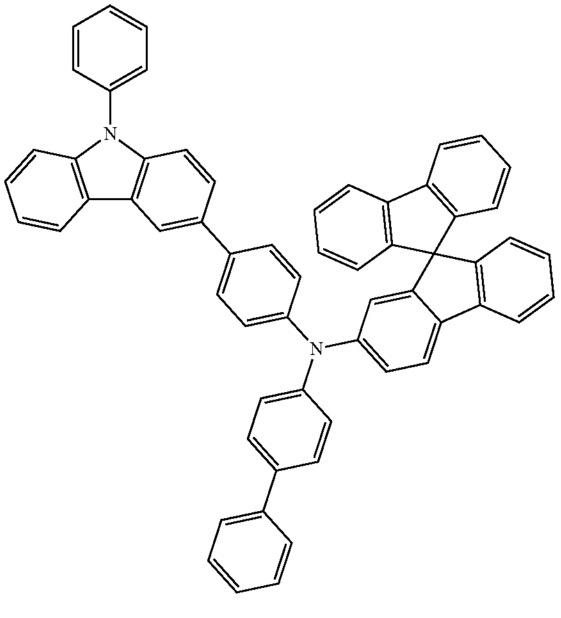

-continued
HT7
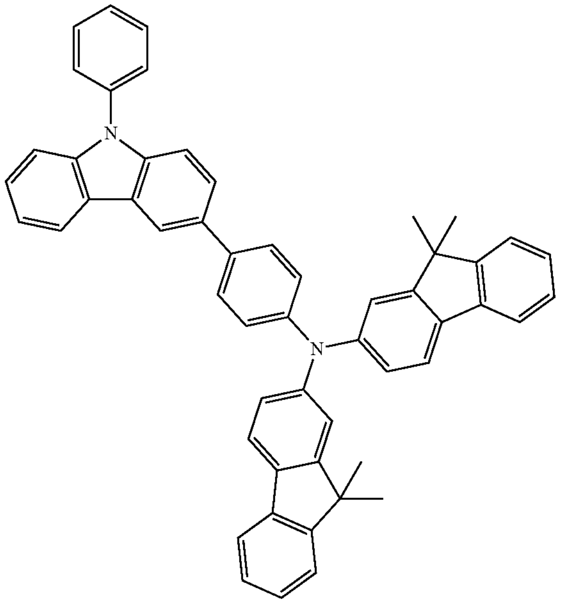
HT8
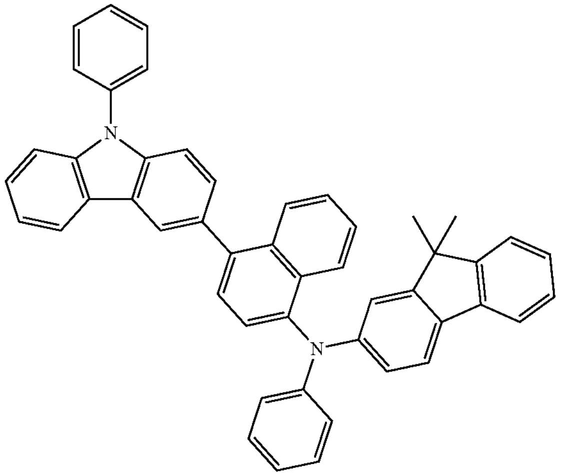
-continued
HT9
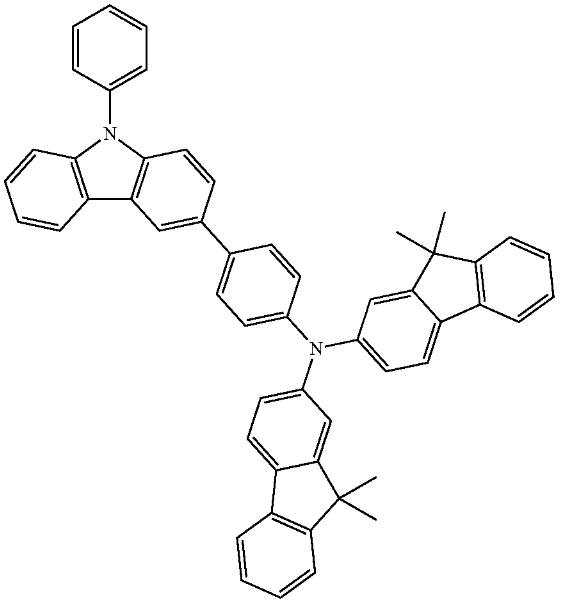
HT10
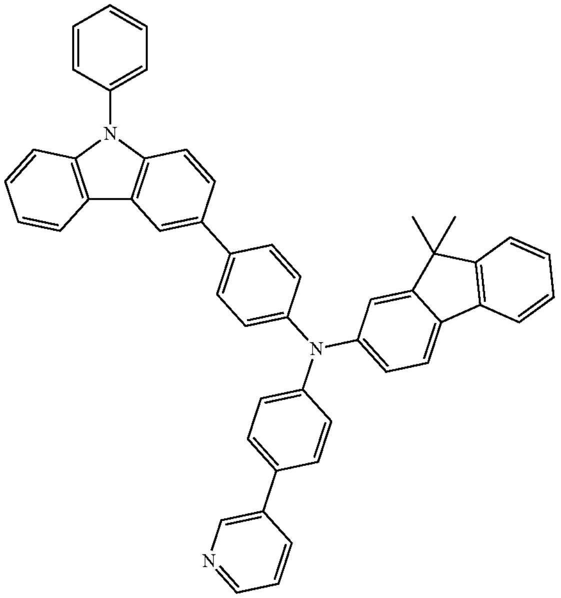

-continued
HT11
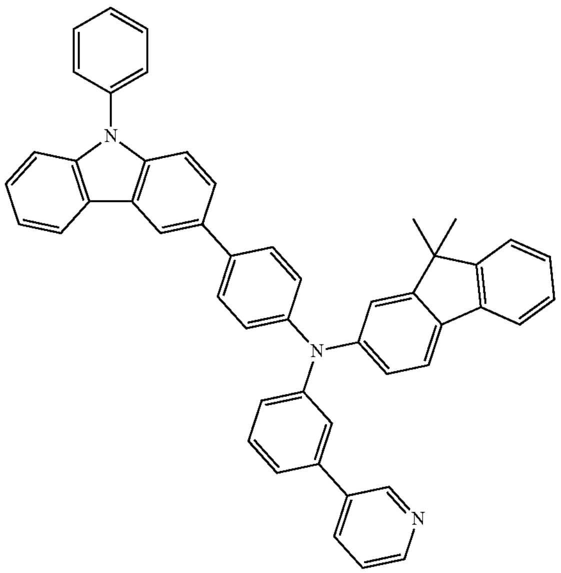
HT12
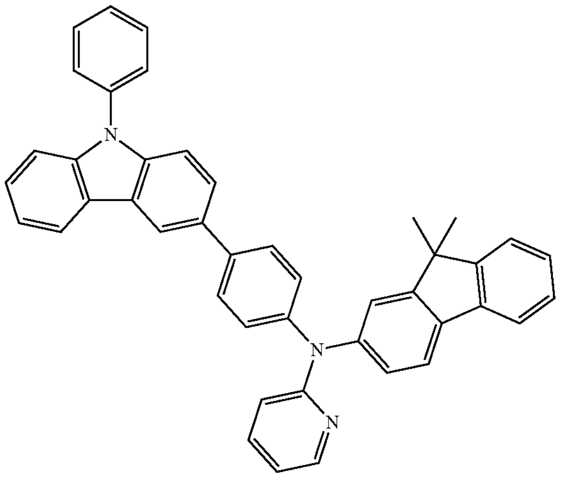
HT13
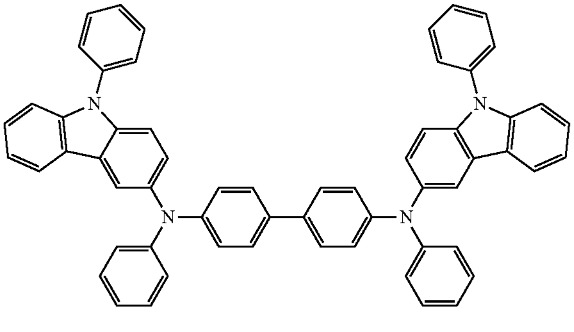
-continued
HT14
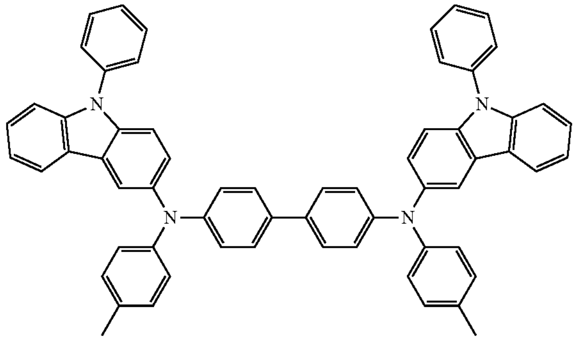
HT15
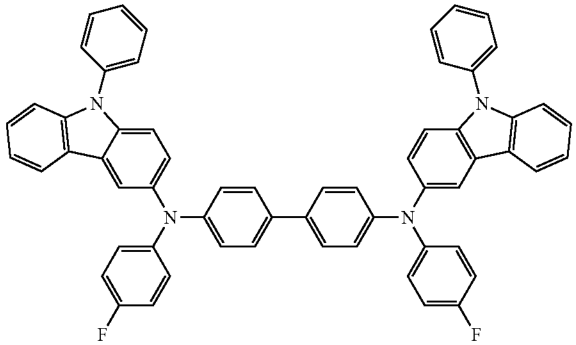
HT16
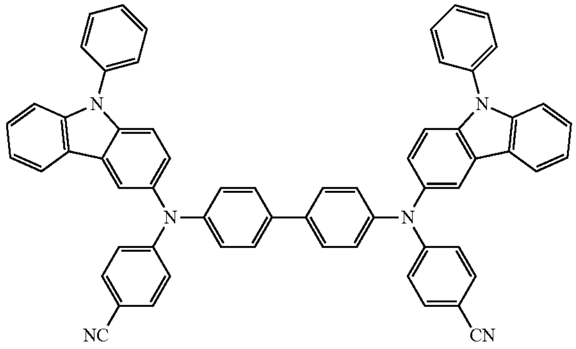
HT17
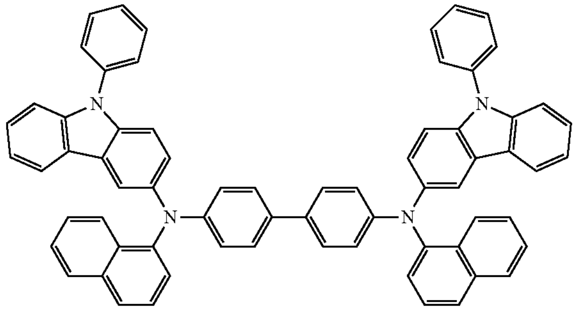

-continued

HT18

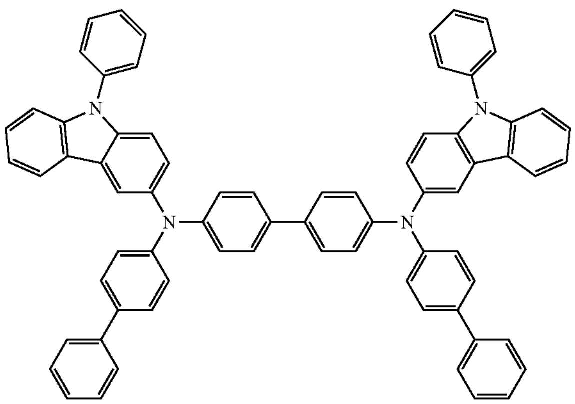

HT19

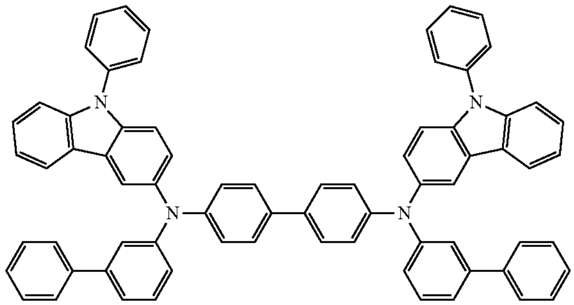

HT20

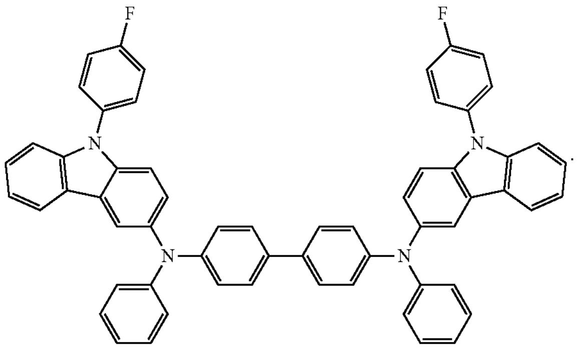

The thickness of the hole transport region may be in a range of about 100 Angstroms (Å) to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, for example, about 100 Å to about 1,000 Å, the thickness of the hole transport layer may be in a range of about 50 Å to about 2,000 Å, for example, about 100 Å to about 1,500 Å. When the thicknesses of the hole transport region, the hole injection layer, and the hole transport layer are within any of these ranges, excellent hole transport characteristics may be obtained without a substantial increase in driving voltage.

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant. The p-dopant may be a quinone derivative, a metal oxide, a compound containing a cyano group, or a combination thereof, but embodiments are not limited thereto. For example, non-limiting examples of the p-dopant include a quinone derivative, such as tetracyanoquinodimethane (TCNQ), 2,3,5,6-tetrafluoro-tetracyano-1,4-benzoquinonedimethane (F4-TCNQ), or F6-TCNNQ; a metal oxide, such as a tungsten oxide or a molybdenum oxide; and a compound containing a cyano group, such as Compound HT-D1 or Compound HT-D2, but embodiments are not limited thereto:

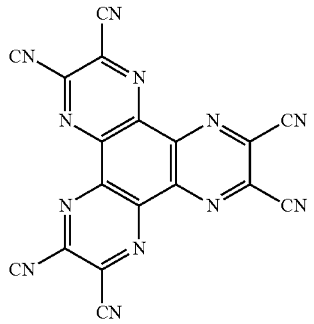

HT-D1

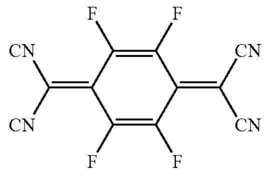

F4-TCNQ

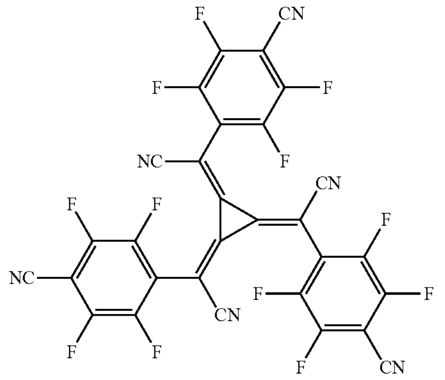

HT-D2

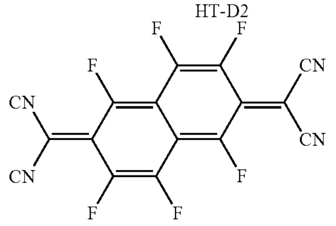

F6-TCNNQ

The hole transport region may further include a buffer layer.

Without wishing to be limited to theory, the buffer layer may compensate for an optical resonance distance depending on a wavelength of light emitted from the emission layer to improve the efficiency of an organic light-emitting device.

The emission layer may be formed on the hole transport region by using one or more suitable methods, such as vacuum deposition, spin coating, casting, or Langmuir- Blodgett (LB) film deposition. When the emission layer is formed by vacuum deposition or spin coating, vacuum deposition and coating conditions for forming the emission layer may be generally similar to those conditions for forming a hole injection layer, though the conditions may vary depending on a compound that is used.

The hole transport region may further include an electron blocking layer. The electron blocking layer may include any suitable known material, e.g., mCP, but embodiments are not limited thereto:

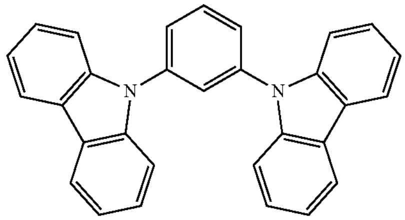

mCP

The thickness of the electron blocking layer may be in a range of about 50 Å to about 1,000 Å, and in one or more embodiments, about 70 Å to about 500 Å. When the thickness of the electron blocking layer is within any of these ranges, excellent electron blocking characteristics may be obtained without a substantial increase in driving voltage.

When the organic light-emitting device 10 is a full-color organic light-emitting device, the emission layer may be patterned into a red emission layer, a green emission layer, and a blue emission layer. In one or more embodiments, the emission layer may have a structure wherein the red emission layer, the green emission layer, and/or the blue emission layer are layered to emit white light. In one or more embodiments, the structure of the emission layer may be different.

The emission layer may include the organometallic compound represented by Formula 1. For example, the emission layer may include one or more organometallic compounds represented by Formula 1.

The emission layer may include a host and a dopant, and the dopant may include the organometallic compound represented by Formula 1.

The host may include 1,3,5-tri(1-phenyl-1H-benzo[d]imidazol-2-yl)phenyl (TPBi), 3-tert-butyl-9,10-di(naphth-2-yl) anthracene (TBADN), 9,10-di(naphthalene-2-yl)anthracene (ADN) (also known as "DNA"), 4,4'-bis(N-carbazolyl)-1,1'-biphenyl (CBP), 4,4'-bis(9-carbazolyl)-2,2'-dimethyl-biphenyl (CDBP), TCP, mCP, Compound H50, Compound H51, Compound H52, or a combination thereof:

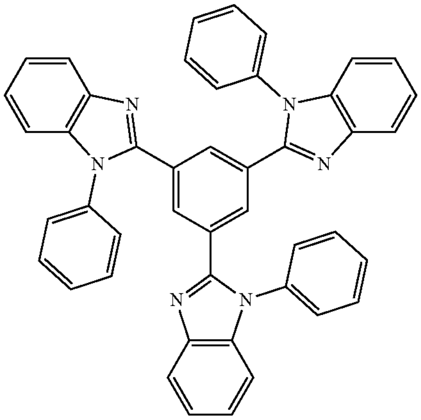

TPBi

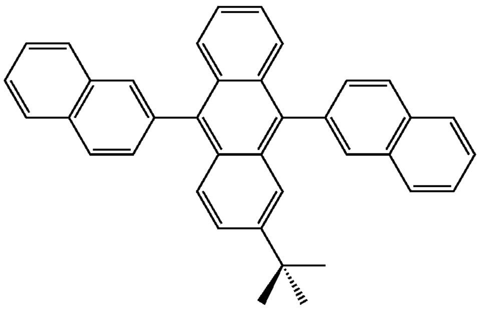

TBADN

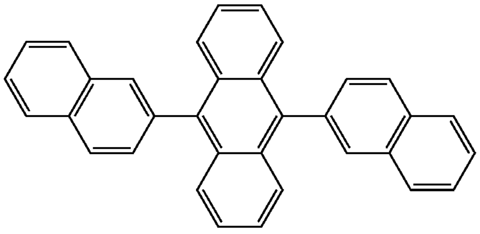

ADN

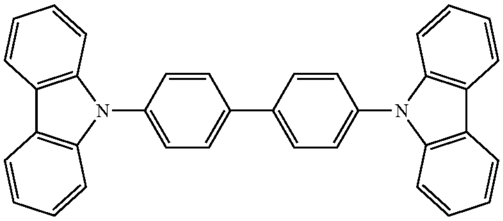

CBP

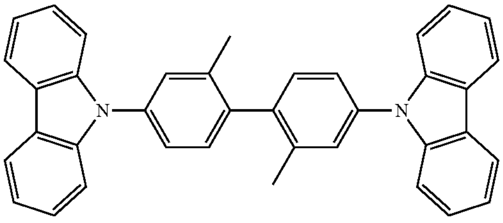

CDBP

-continued

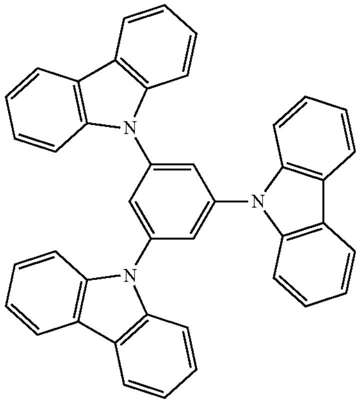

TCP

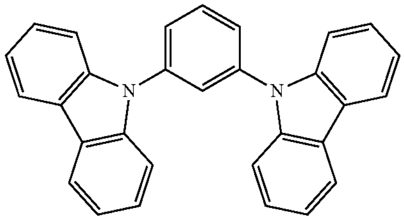

mCP

H50

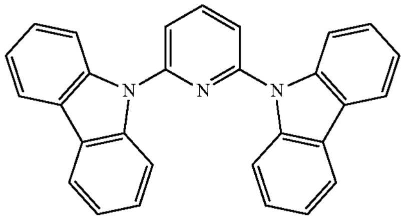

H51

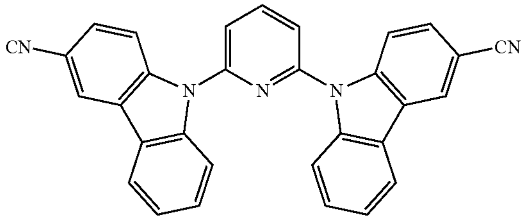

H52

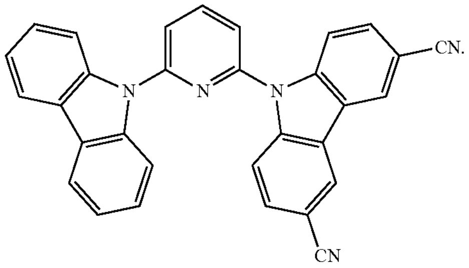

In one or more embodiments, the host may further include a compound represented by Formula 301:

Formula 301

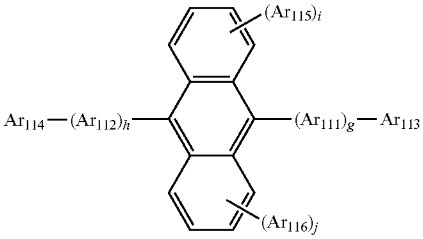

wherein, in Formula 301, $Ar_{111}$ and $Ar_{112}$ may each independently be:

a phenylene group, a naphthylene group, a phenanthrenylene group, or a pyrenylene group; or a phenylene group, a naphthylene group, a phenanthrenylene group, or a pyrenylene group, each substituted with a phenyl group, a naphthyl group, an anthracenyl group, or a combination thereof.

In Formula 301, $Ar_{113}$ to $Ar_{116}$ may each independently be:

a $C_1$-$C_{10}$ alkyl group, a phenyl group, a naphthyl group, a phenanthrenyl group, or a pyrenyl group; or a phenyl group, a naphthyl group, a phenanthrenyl group, or a pyrenyl group, each substituted with a phenyl group, a naphthyl group, an anthracenyl group, or a combination thereof.

In Formula 301, g, h, i, and j may each independently be 0, 1, 2, 3, or 4, for example, 0, 1, or 2.

In Formula 301, $Ar_{113}$ to $Ar_{116}$ may each independently be:

a $C_1$-$C_{10}$ alkyl group substituted with a phenyl group, a naphthyl group, an anthracenyl group, or a combination thereof;

a phenyl group, a naphthyl group, an anthracenyl group, a pyrenyl group, a phenanthrenyl group, or a fluorenyl group;

a phenyl group, a naphthyl group, an anthracenyl group, a pyrenyl group, a phenanthrenyl group, or a fluorenyl group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a phenyl group, a naphthyl group, an anthracenyl group, a pyrenyl group, a phenanthrenyl group, a fluorenyl group, or a combination thereof, or

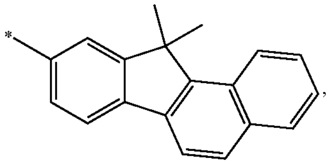 [SMILES: Cc1ccc2c(c1)C(C)(C)c1c-2ccc2ccccc12]

but embodiments are not limited thereto.

In one or more embodiments, the host may include a compound represented by Formula 302:

Formula 302

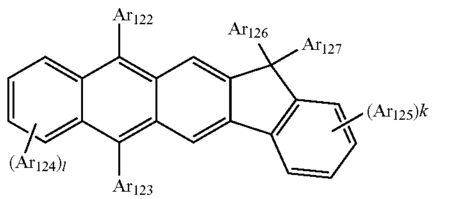

In Formula 302, $Ar_{122}$ to $Ar_{125}$ may each be understood by referring to the description of $Ar_{113}$ in Formula 301.

In Formula 302, $Ar_{126}$ and $Ar_{127}$ may each independently be a $C_1$-$C_{10}$ alkyl group, e.g., a methyl group, an ethyl group, or a propyl group.

In Formula 302, k and l may each independently be an integer of 0, 1, 2, 3, or 4. In one or more embodiments, k and l may each be 0, 1, or 2.

When the organic light-emitting device 10 is a full-color organic light-emitting device, the emission layer may be patterned into a red emission layer, a green emission layer, and a blue emission layer. In one or more embodiments, the emission layer may have a structure wherein the red emission layer, the green emission layer, and/or the blue emission layer are layered to emit white light. In one or more embodiments, the structure of the emission layer may vary.

When the emission layer includes the host and the dopant, an amount of the dopant may be from a range of about 0.01 parts to about 20 parts by weight based on about 100 parts by weight of the emission layer, but embodiments are not limited thereto. When the amount of the dopant is within this range, light emission without quenching may be realized.

In one or more embodiments, the organic layer in organic light-emitting device may further include, in addition to the organometallic compound represented by Formula 1, a fluorescent dopant.

In one or more embodiments, the fluorescent dopant may be a condensed polycyclic compound, a styryl-based compound, or a combination thereof.

According to one or more embodiments, the fluorescent dopant may include a compound represented by Formula 501:

Formula 501

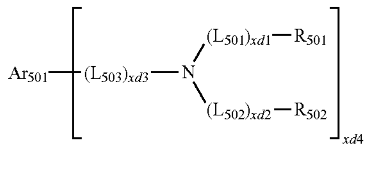

wherein, in Formula 50, $Ar_{501}$ may be:

a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-18; or naphthalene, fluorene, spiro-bifluorene, benzofluorene, dibenzofluorene, phenanthrene, anthracene, fluoranthene, triphenylene, pyrene, chrysene, naphthacene, picene, perylene, pentaphene, indenoanthracene, tetracene, bisanthracene, or a group represented by Formulae 501-1 to 501-18, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$Si(Q_{501})(Q_{502})(Q_{503})$, or a combination thereof, wherein $Q_{501}$ to $Q_{503}$ may each independently be hydrogen, a $C_1$-$C_{60}$ alkyl group, a $C_1$-$C_{60}$ alkoxy group, a $C_1$-$C_{60}$ alkylthio group, a $C_6$-$C_{60}$ aryl group, a $C_7$-$C_{60}$ alky aryl group, a $C_7$-$C_{60}$ aryl alkyl group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, $L_{501}$ to $L_{503}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, $R_{501}$ and $R_{502}$ may each independently be:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, or a dibenzothiophenyl group; or a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, or a combination thereof, xd1 to xd3 may each independently be 0, 1, 2, or 3, and xd4 may be 0, 1, 2, 3, 4, 5, or 6.

In one or more embodiments, in Formula 50, $Ar_{501}$ may be:

a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-18; or naphthalene, fluorene, spiro-bifluorene, benzofluorene, dibenzofluorene, phenanthrene, anthracene, fluoranthene, triphenylene, pyrene, chrysene, naphthacene, picene, perylene, pentaphene, indenoanthracene, tetracene, bisanthracene, or a group represented by Formulae 501-1 to 501-18, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, a fluorenyl group, a dibenzofuranyl group, a dibenzothiophenyl group, a carbazolyl group, a pyridinyl group, a pyrimidinyl group, a triazinyl group, a quinolinyl group, an isoquinolinyl group, —$Si(Q_{501})(Q_{502})(Q_{503})$, or a combination thereof, wherein $Q_{501}$ to $Q_{503}$ may each independently be hydrogen, a $C_1$-$C_{20}$alkyl group, a $C_1$-$C_{20}$ alkoxy group, a $C_1$-$C_{20}$ alkylthio group, a phenyl group, a biphenyl group, a terphenyl group, or a naphthyl group, $L_{501}$ to $L_{503}$ may each be understood by referring to the description of $L_{21}$ provided herein, xd1 to xd3 may be each independently 0, 1, or 2, and xd4 may be 0, 1, 2, or 3, but embodiments are not limited thereto.

The fluorescent dopant may include, for example, Compounds FD(1) to FD(16), Compounds FD1 to FD13, or a combination thereof:

FD(1)

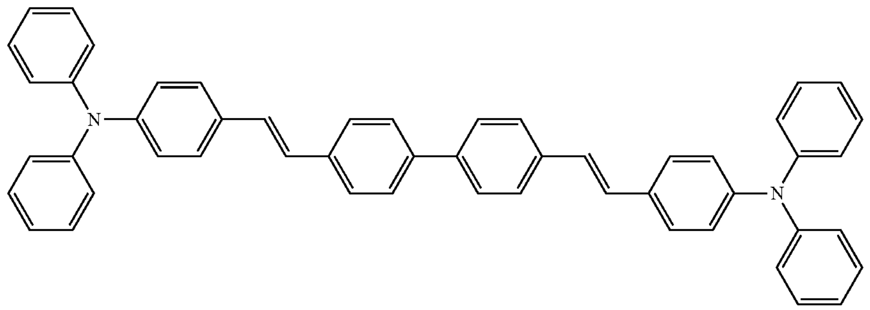

FD(2)

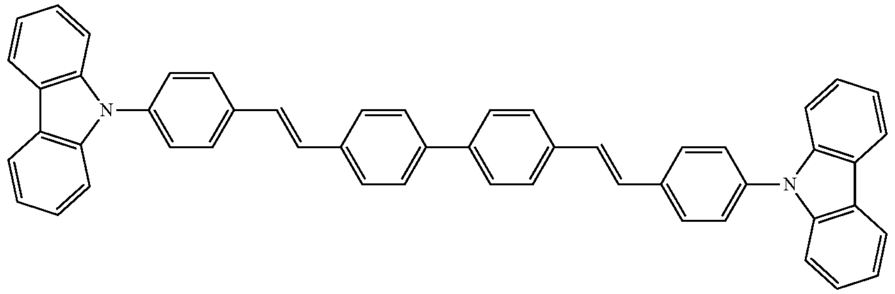

-continued
FD(3)
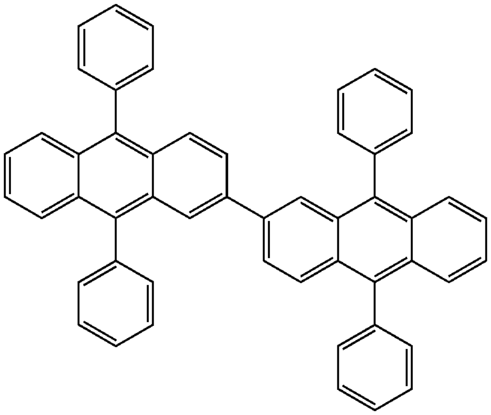
FD(4)
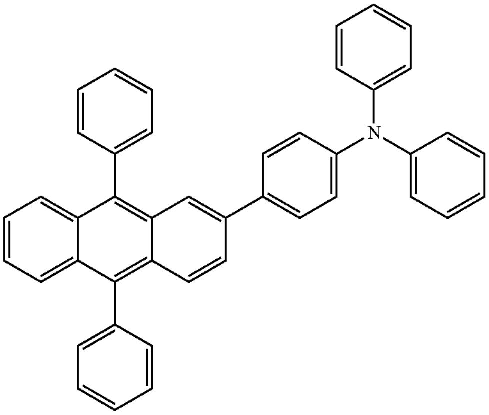
FD(5)
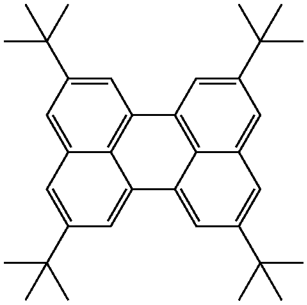
FD(6)
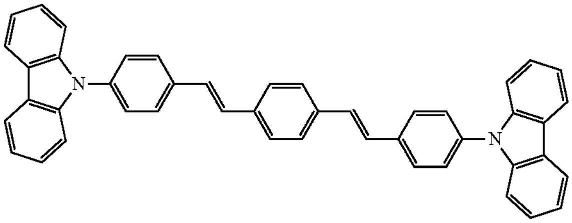
FD(7)
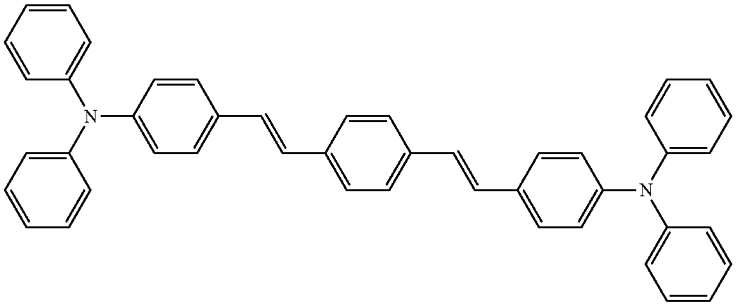
FD(8)
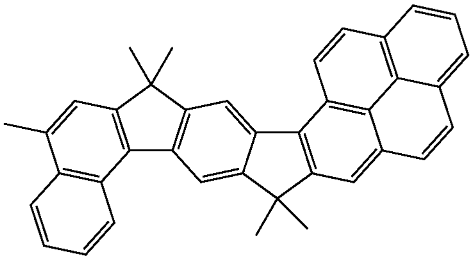
FD(9)
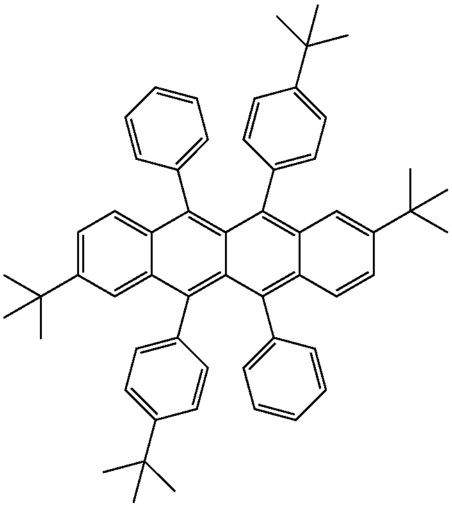

-continued
FD(10)
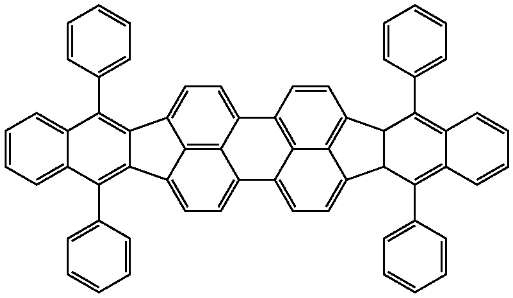
FD(11)
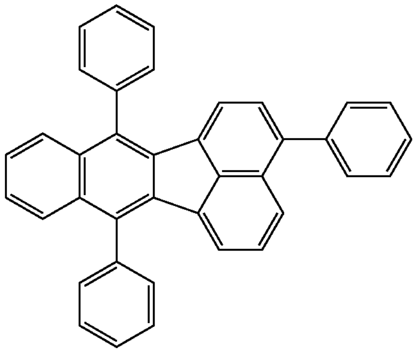
FD(12)
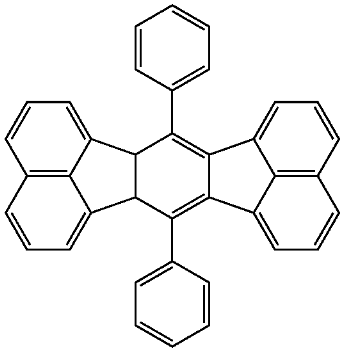
FD(13)
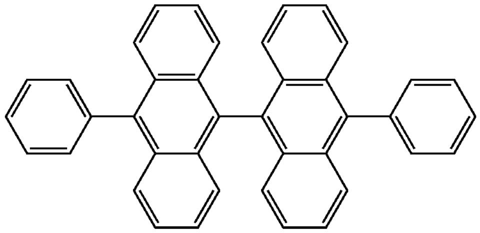
FD(14)
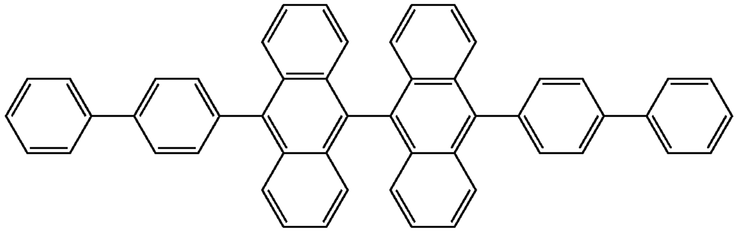
FD(15)
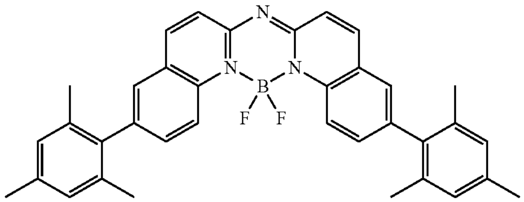
FD(16)
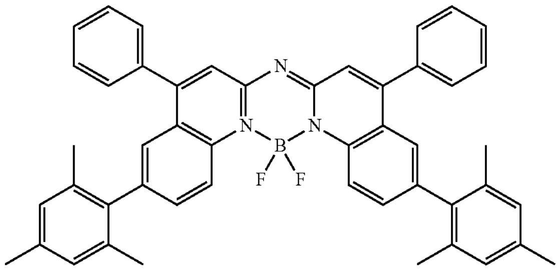

-continued
FD1
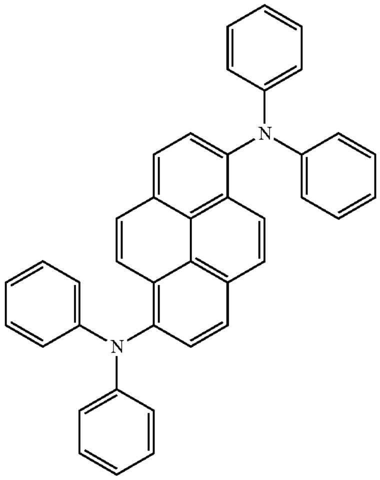
FD2
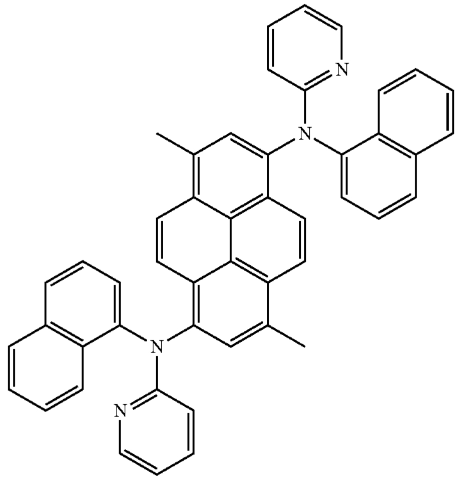
FD3
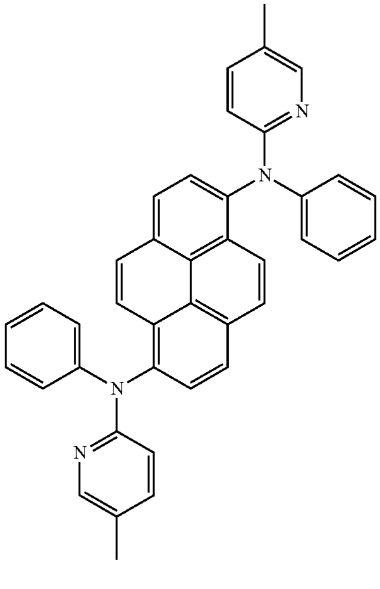
FD4
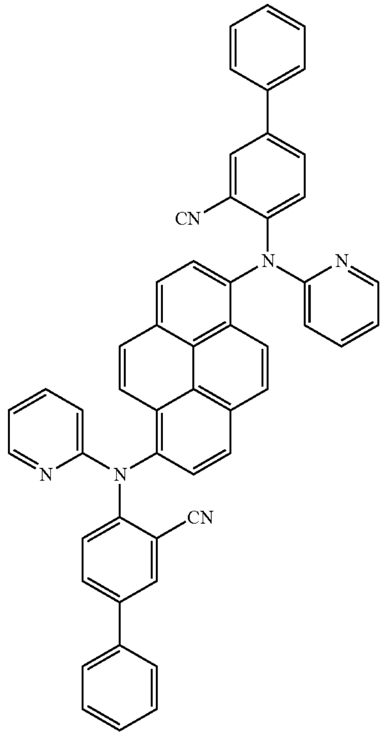

-continued
FD5
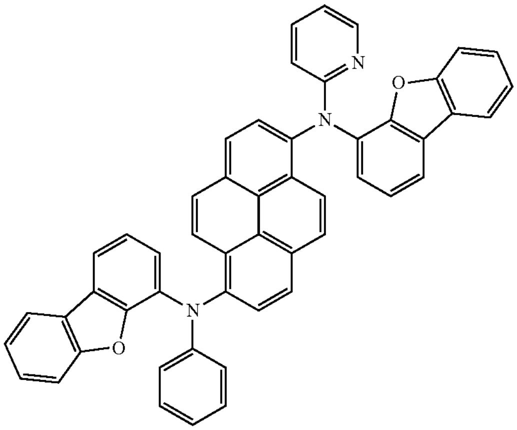
FD6
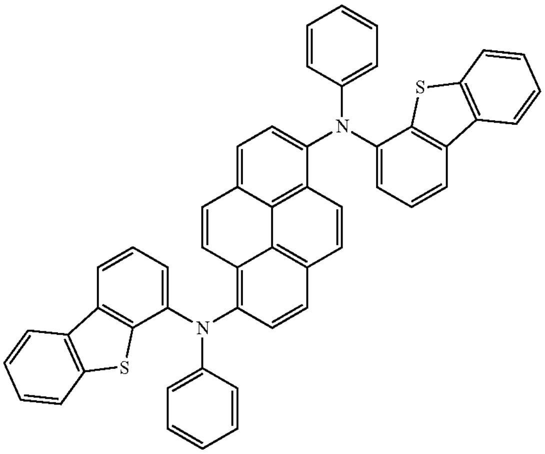
FD7
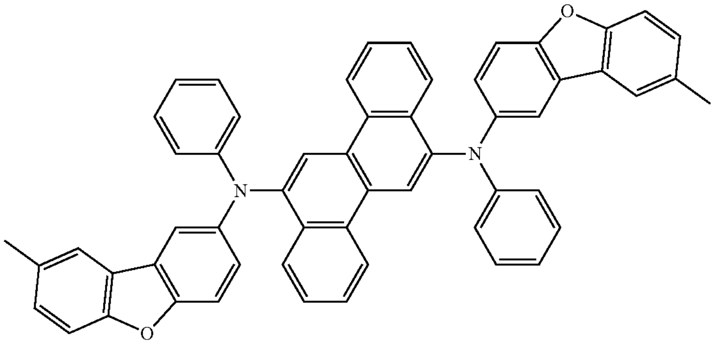
FD8
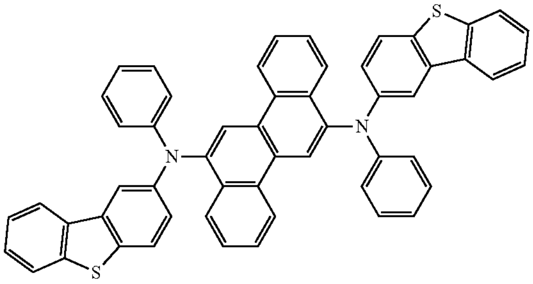
FD9
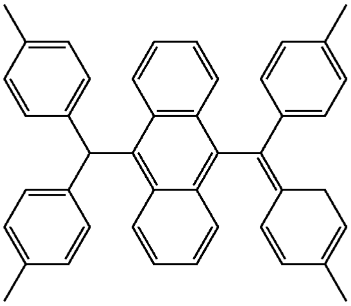
FD10
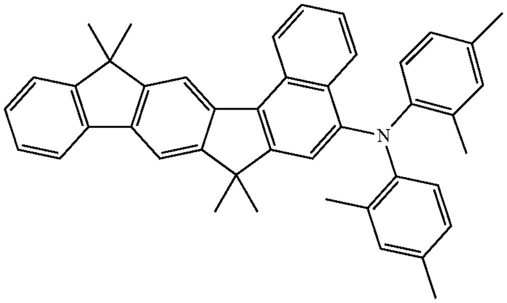
FD11
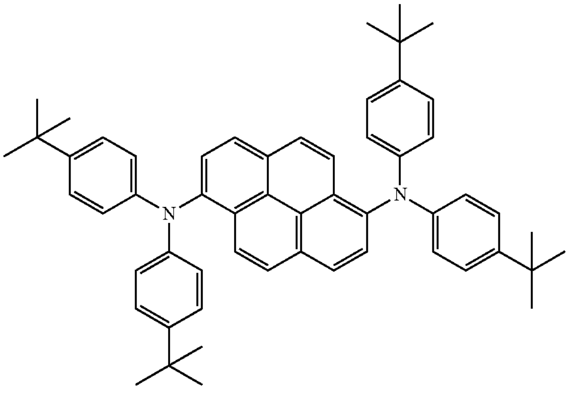

-continued

FD12

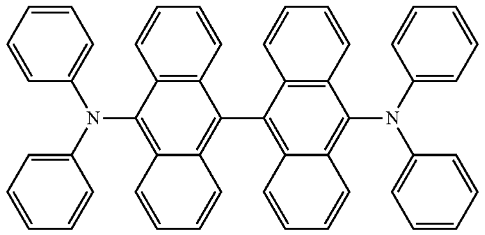

FD13

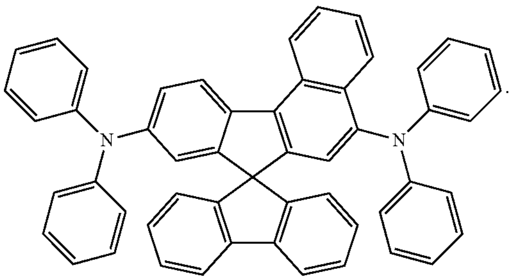

The thickness of the emission layer may be in a range of about 100 Å to about 1,000 Å, and in one or more embodiments, about 200 Å to about 600 Å. When the thickness of the emission layer is within any of these ranges, improved luminescence characteristics may be obtained without a substantial increase in driving voltage.

Next, an electron transport region may be formed on the emission layer.

The electron transport region may include at least one of a hole blocking layer, an electron transport layer, or an electron injection layer.

In one or more embodiments, the electron transport region may have a hole blocking layer/an electron transport layer/an electron injection layer structure or an electron transport layer/an electron injection layer structure, but embodiments are not limited thereto. The electron transport layer may have a single-layered structure or a multi-layered structure including two or more different materials.

The conditions for forming a hole blocking layer, an electron transport layer, and an electron injection layer may be inferred based on the conditions for forming the hole injection layer.

When the electron transport region includes a hole blocking layer, the hole blocking layer, for example, may include at least one of 2,9-dimethyl-4,7-diphenyl-1,10-phenanthroline (BCP) and 4,7-diphenyl-1,10-phenanthroline (Bphen), but embodiments are not limited thereto:

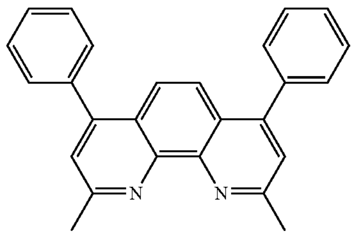

BCP

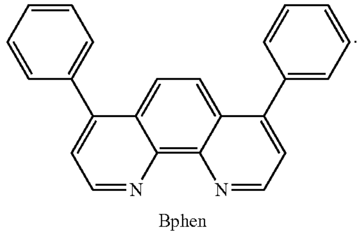

Bphen

The thickness of the hole blocking layer may be in a range of about 20 Å to about 1,000 Å, for example, about 30 Å to about 300 Å. When the thickness of the hole blocking layer is within any of these ranges, excellent hole blocking characteristics may be obtained without a substantial increase in driving voltage.

The electron transport layer may include at least one of BCP, BPhen, tris(8-hydroxyquinolinato)aluminum ($Alq_3$), bis(8-hydroxy-2-methylquinoline)-(4-phenylphenoxy)aluminum (Balq), 3-(4-biphenylyl)-4-phenyl-5-tert-butylphenyl-1,2,4-triazole (TAZ), and 4-(naphthalen-1-yl)-3,5-diphenyl-4H-1,2,4-triazole (NTAZ):

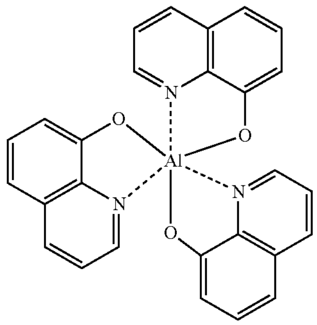

$Alq_3$

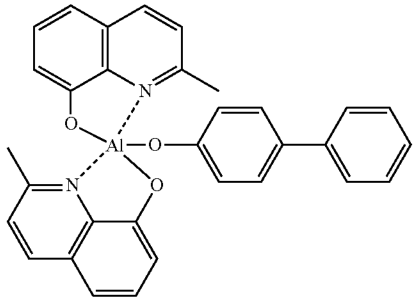

BAlq

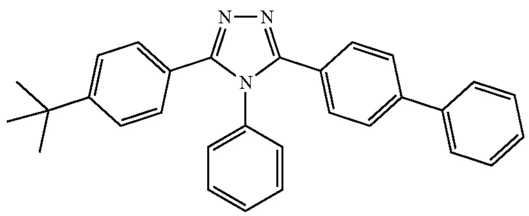

TAZ

-continued
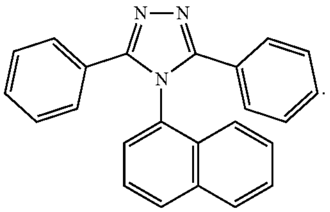
NTAZ
In one or more embodiments, the electron transport layer may include at least one of Compounds ET1 to ET25, but embodiments are not limited thereto:
ET1
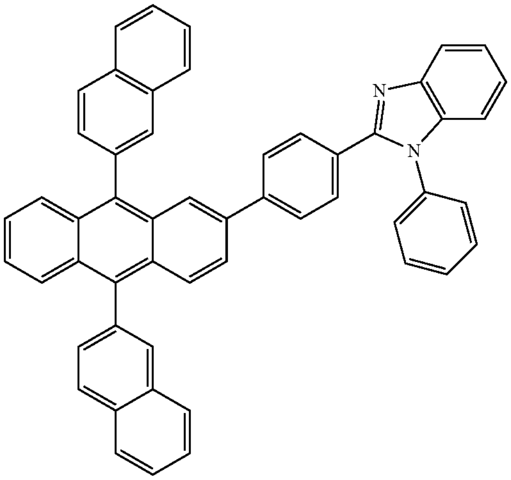
ET2
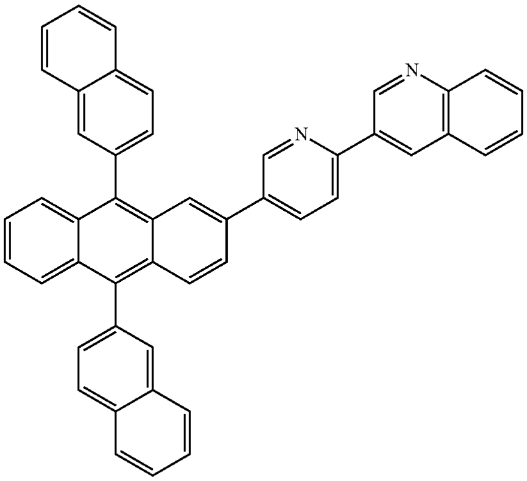
-continued
ET3
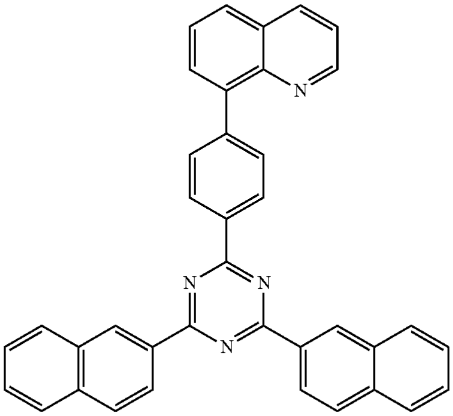
ET4
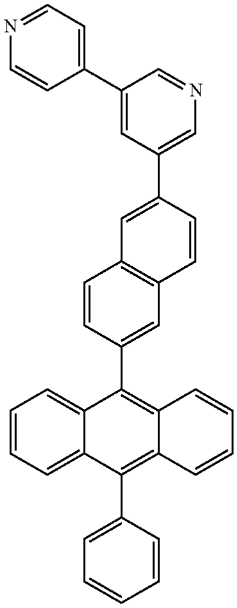
ET5
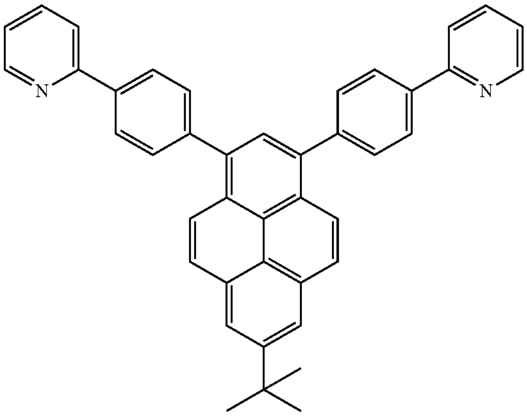

-continued
ET6
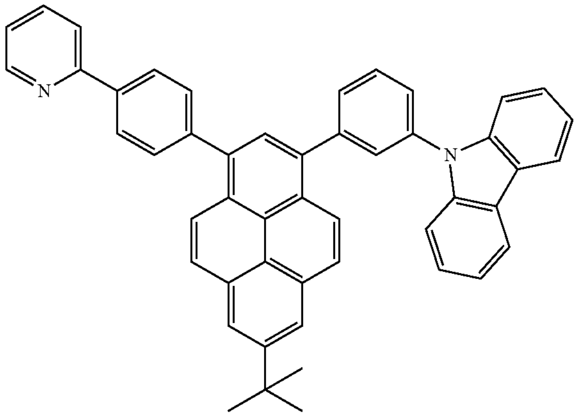
ET7
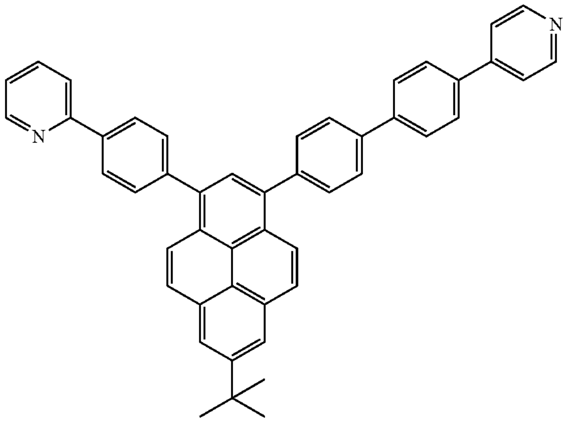
ET8
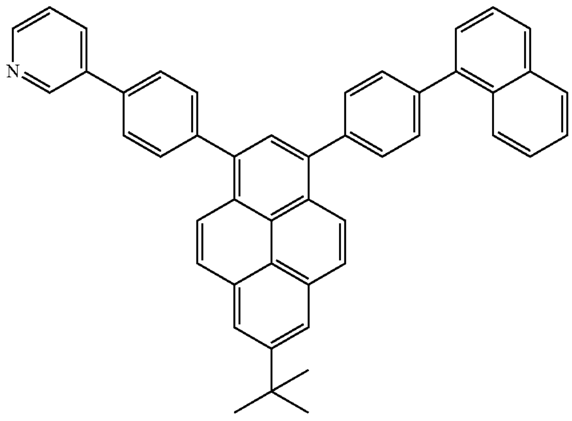
-continued
ET9
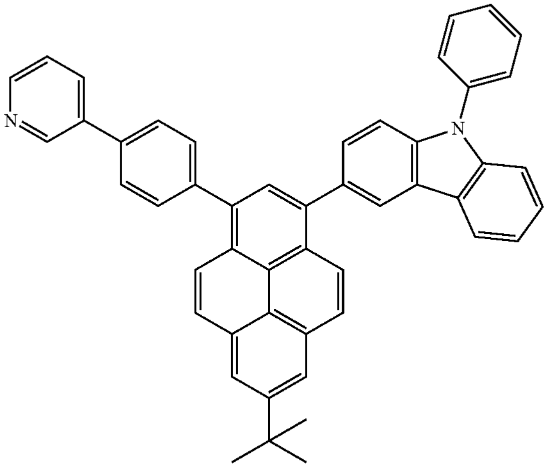
ET10
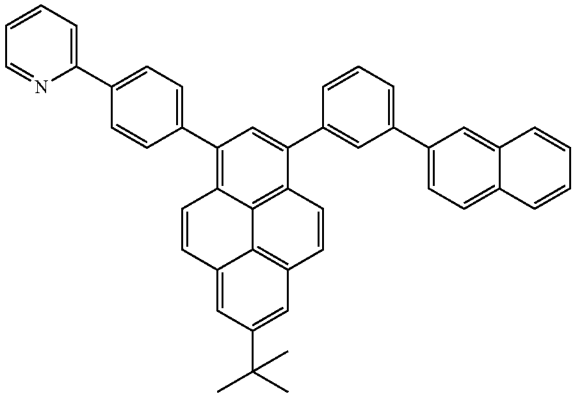
ET11
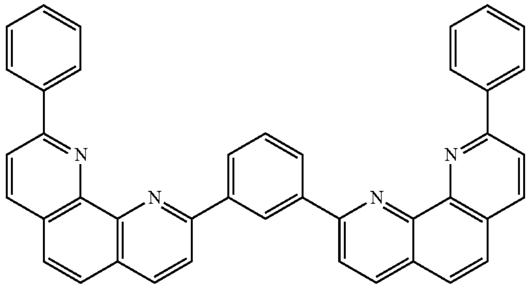
ET12
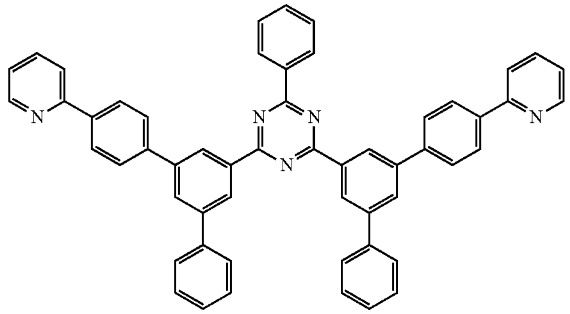

-continued
ET13
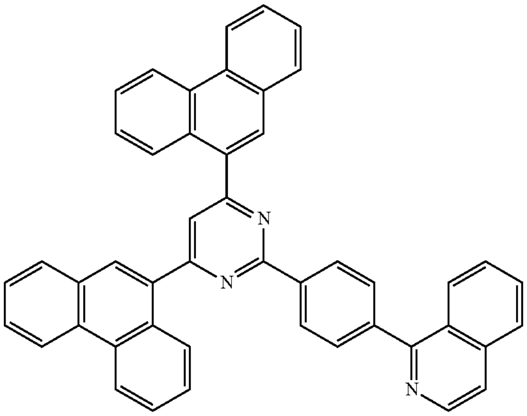
ET14
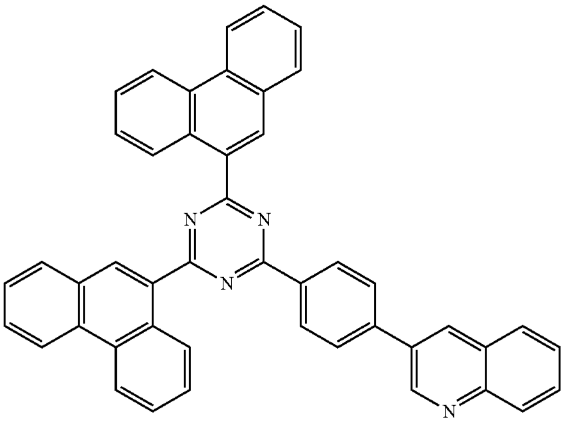
ET15
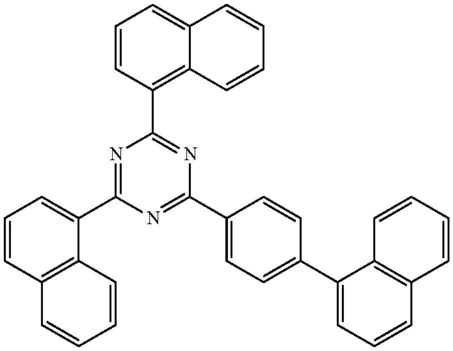
-continued
ET16
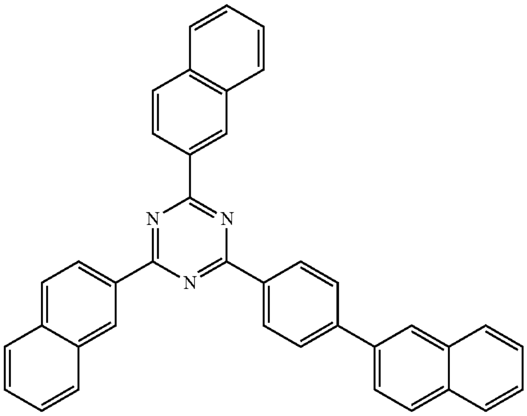
ET17
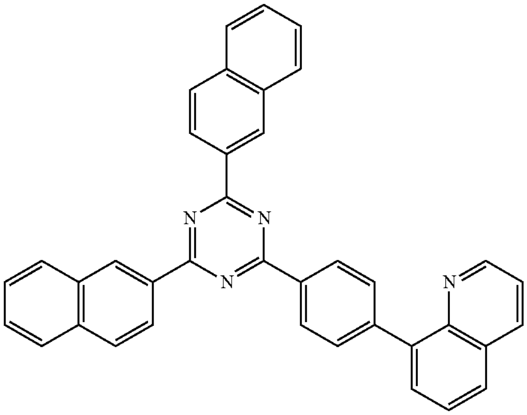
ET18
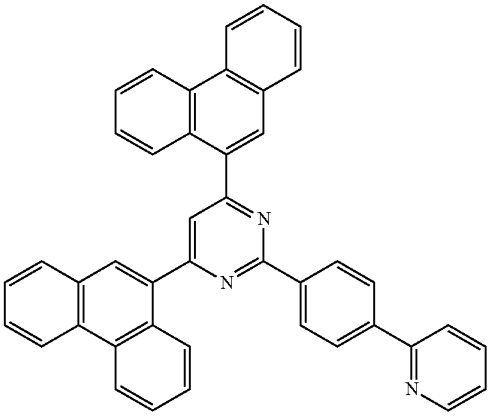

-continued
ET19
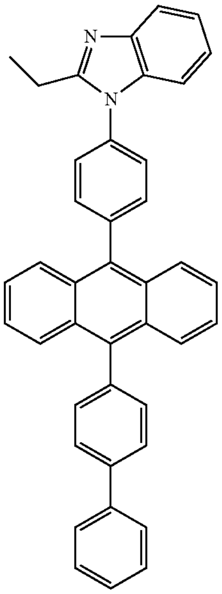
ET20
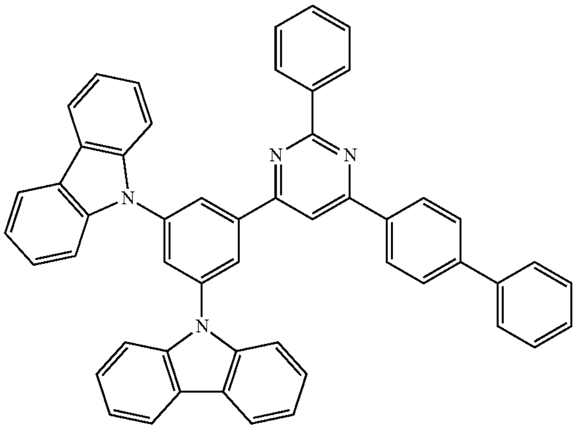
ET21
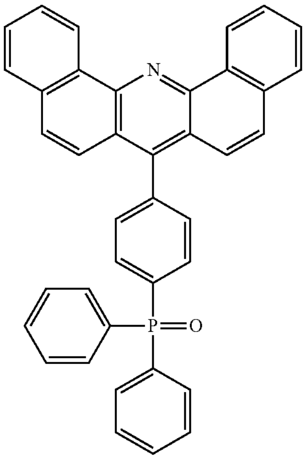
-continued
ET22
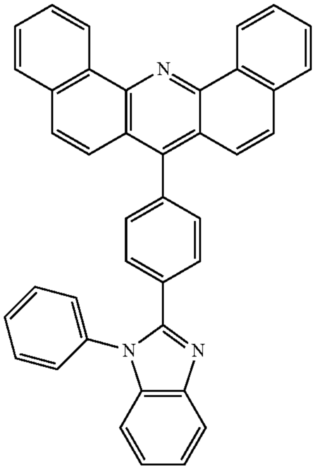
ET23
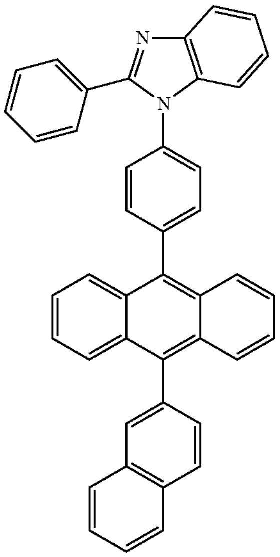
ET24
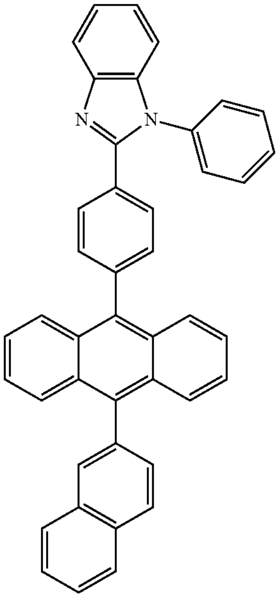

-continued

ET25

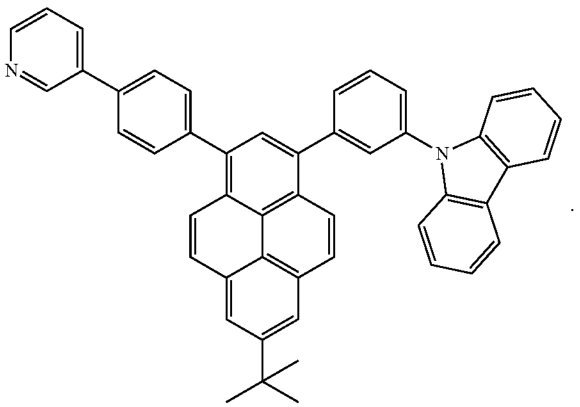

The thickness of the electron transport layer may be in a range of about 100 Å to about 1,000 Å, and in one or more embodiments, about 150 Å to about 500 Å. When the thickness of the electron transport layer is within any of these ranges, excellent electron transport characteristics may be obtained without a substantial increase in driving voltage.

The electron transport layer may further include a material containing metal, in addition to the materials described above.

The material containing metal may include a Li complex. The Li complex may include, e.g., Compound ET-D1 (LiQ) or Compound ET-D2:

ET-D1

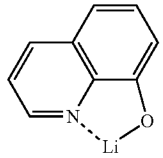

ET-D2

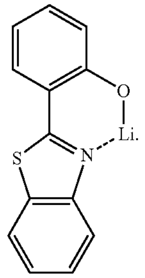

The electron transport region may include an electron injection layer that facilitates injection of electrons from the second electrode 19.

The electron injection layer may include at least one of LiQ, LiF, NaCl, CsF, $Li_2O$, and BaO.

The thickness of the electron injection layer may be in a range of about 1 Å to about 100 Å, and in one or more embodiments, about 3 Å to about 90 Å. When the thickness of the electron injection layer is within any of these ranges, excellent electron injection characteristics may be obtained without a substantial increase in driving voltage.

The second electrode 19 may be on the organic layer 15. The second electrode 19 may be a cathode. A material for forming the second electrode 19 may be a material with a relatively low work function, such as a metal, an alloy, an electrically conductive compound, and a mixture thereof. Examples of the material for forming the second electrode 19 may include lithium (Li), magnesium (Mg), aluminum (Al), silver (Ag), aluminum-lithium (Al—Li), calcium (Ca), magnesium-indium (Mg—In), and magnesium-silver (Mg—Ag). In one or more embodiments, ITO or IZO may be used to form a transmissive second electrode 19 to manufacture a top emission light-emitting device. In one or more embodiments, the material for forming the second electrode 19 may vary.

Hereinbefore the organic light-emitting device 10 has been described with reference to FIG. 1, but embodiments are not limited thereto.

According to another aspect, an electronic apparatus includes the organic light-emitting device. Thus, an electronic apparatus including the organic light-emitting device may be provided. The electronic apparatus may include, for example, a display, lighting, a sensor, or the like.

According to still another aspect, a diagnostic composition includes at least one organometallic compound represented by Formula 1.

Since the organometallic compound represented by Formula 1 provides high luminescence efficiency, the diagnostic efficiency of the diagnostic composition that includes the organometallic compound represented by Formula 1 may be excellent.

The diagnostic composition may be applied in various ways, such as in a diagnostic kit, a diagnostic reagent, a biosensor, or a biomarker.

General Definitions of Terms

The term "$C_1$-$C_{60}$ alkyl group" as used herein refers to a linear or branched saturated aliphatic hydrocarbon monovalent group having 1 to 60 carbon atoms. Examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having substantially the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, and an isopropyloxy group. The term "$C_1$-$C_{60}$ alkylthio group" as used herein indicates —$SA_{104}$ (wherein $A_{104}$ indicates the $C_1$-$C_{60}$ alkyl group).

The term "$C_2$-$C_{60}$ alkenyl group" as used herein refers to a group formed by including at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a group formed by including at least one carbon-carbon triple bond in the middle or at the terminus of the $C_2$-$C_{60}$ alkyl group. Examples thereof include an ethenyl group and a propenyl group. The term "$C_2$-$C_{60}$ alkynylene group" as used herein refers to a divalent group having substantially the same structure as the $C_2$-$C_{60}$ alkynyl group.

The term "$C_3$-$C_{10}$ cycloalkyl group" as used herein refers to a monovalent monocyclic saturated hydrocarbon group including 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent monocyclic group including at least one heteroatom selected from N, O, P, Si, S, Se, Ge, and B as a ring-forming atom and 1 to 10 carbon atoms. Examples thereof include a tetrahydrofuranyl group and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent monocyclic group including 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent monocyclic group including at least one heteroatom selected from N, O, P, Si, S, Se, Ge, and B as a ring-forming atom, 1 to 10 carbon atoms, and at least one carbon-carbon double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and a $C_6$-$C_{60}$ arylene group each include at least two rings, the at least two rings may be fused to each other.

The term "$C_7$-$C_{60}$ alkyl aryl group" as used herein refers to a $C_6$-$C_{60}$ aryl group substituted with at least one $C_1$-$C_{60}$ alkyl group. The term "$C_7$-$C_{60}$ aryl alkyl group" as used herein refers to a $C_1$-$C_{60}$ alkyl group substituted with at least one $C_6$-$C_{60}$ aryl group.

The term "$C_1$-$C_{60}$ heteroaryl group" as used herein refers to a monovalent group having a heterocyclic aromatic system having at least one heteroatom selected from N, O, P, Si, S, Se, Ge, and B as a ring-forming atom and 1 to 60 carbon atoms. The term "$C_1$-$C_{60}$ heteroarylene group" as used herein refers to a divalent group having a heterocyclic aromatic system having at least one heteroatom selected from N, O, P, S, Se, Ge, and B as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include at least two rings, the at least two rings may be fused to each other.

The term "$C_2$-$C_{60}$ alkylheteroaryl group" as used herein refers to a $C_1$-$C_{60}$ heteroaryl group substituted with at least one $C_1$-$C_{60}$ alkyl group. The term "$C_2$-$C_{60}$ heteroaryl alkyl group" as used herein refers to a $C_1$-$C_{60}$ alkyl group substituted with at least one $C_1$-$C_{60}$ heteroaryl group.

The term "$C_6$-$C_{60}$ aryloxy group" as used herein refers to —$OA_{102}$ (wherein $A_{102}$ is a $C_6$-$C_{60}$ aryl group). The term "$C_6$-$C_{60}$ arylthio group" as used herein refers to —$SA_{103}$ (wherein $A_{103}$ is a $C_6$-$C_{60}$ aryl group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and a heteroatom selected from N, O, P, Si, S, Se, Ge, and B, other than carbon atoms (e.g., the number of carbon atoms may be in a range of 1 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group.

The term "$C_1$-$C_{30}$ heterocyclic group" as used herein refers to saturated or unsaturated cyclic group including 1 to 30 carbon atoms and at least one heteroatom selected from N, O, P, Si, S, Se, Ge, and B as ring-forming atoms instead of carbon, and 1-60 carbon atoms. The $C_1$-$C_{30}$ heterocyclic group may be a monocyclic group or a polycyclic group.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alky aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P($Q_{18}$)($Q_{19}$), —P(=O)($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alky aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alky aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a C1-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P($Q_{28}$)($Q_{29}$), —P(=O)($Q_{28}$)($Q_{29}$), or a combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P($Q_{38}$)($Q_{39}$), , or —P(=O)($Q_{38}$)($Q_{39}$), or a combination thereof wherein $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_1$-$C_{60}$ heteroaryl group; a $C_1$-$C_{60}$ heteroaryloxy group; a $C_1$-$C_{60}$ heteroarylthio group; a monovalent non-aromatic condensed polycyclic group; or a monovalent non-aromatic condensed heteropolycyclic group.

For example, $Q_1$ to $Q_9$, $Q_{11}$ to $Q_{19}$, $Q_{21}$ to $Q_{29}$, and $Q_{31}$ to $Q_{39}$ described herein may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or a combination thereof.

The term "room temperature" as used herein refers to a temperature of about 25° C.

The terms "a biphenyl group, a terphenyl group, and a tetraphenyl group" as used herein each refer to a monovalent group having two, three, and four phenyl groups linked via a single bond, respectively.

Hereinafter, a compound and an organic light-emitting device according to one or more embodiments will be described in detail with reference to Synthesis Examples and Examples, however, the present disclosure is not limited thereto. The wording "B was used instead of A" used in describing Synthesis Examples means that an amount of B used was identical to an amount of A used based on molar equivalence.

EXAMPLES
Synthesis Example 1: Synthesis of Compound Pt-4
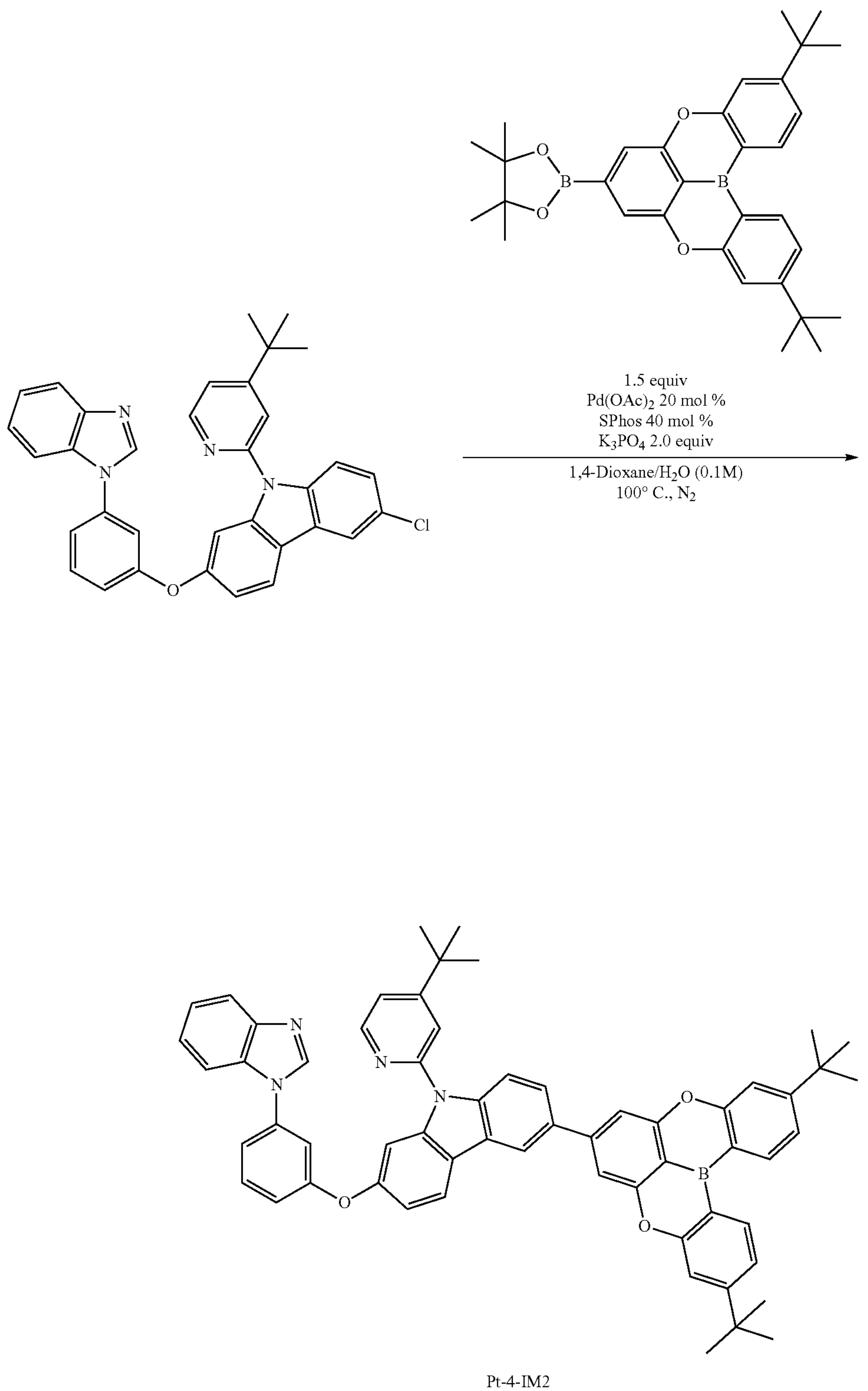
Pt-4-IM2

-continued
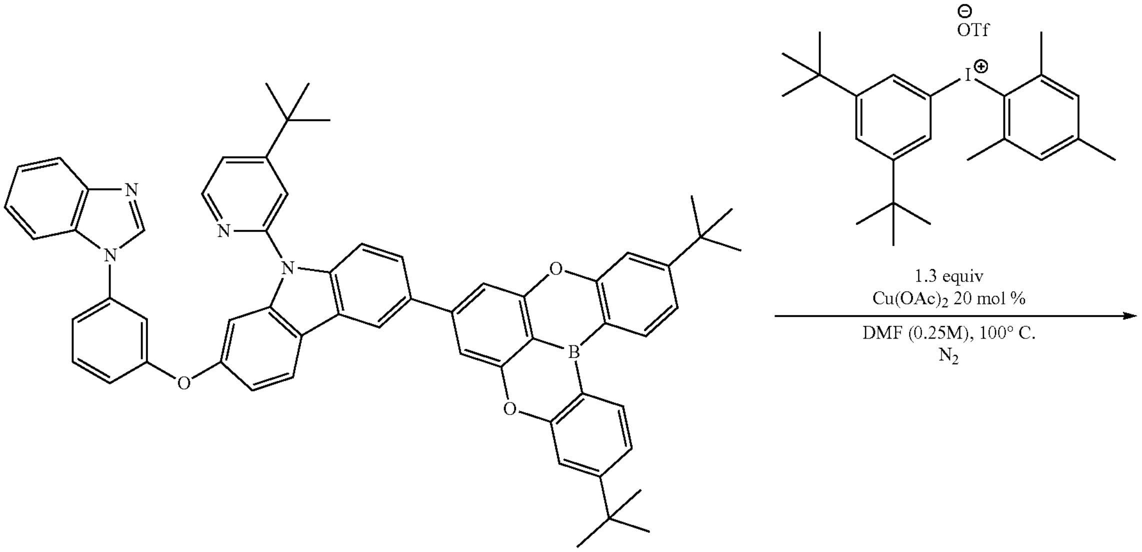
Pt-4-IM2
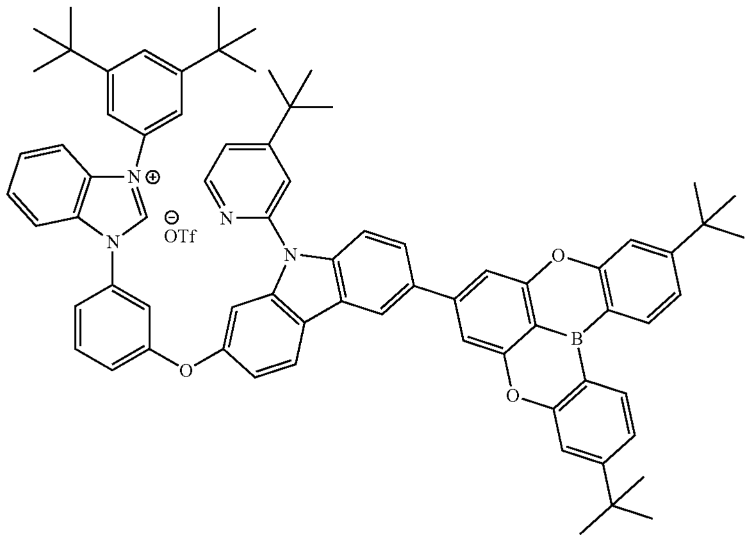
Pt-4-IM1

-continued

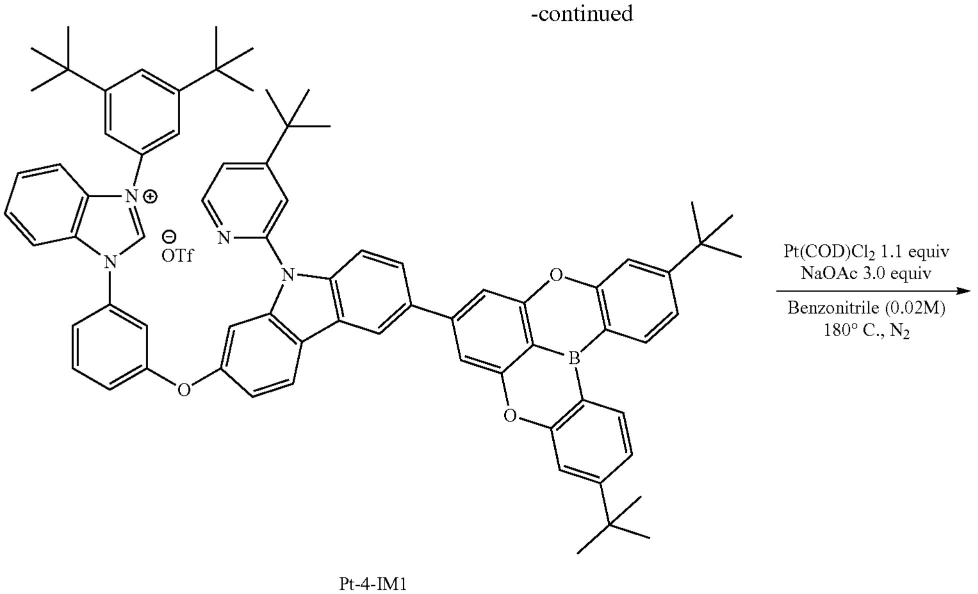

Pt-4-IM1

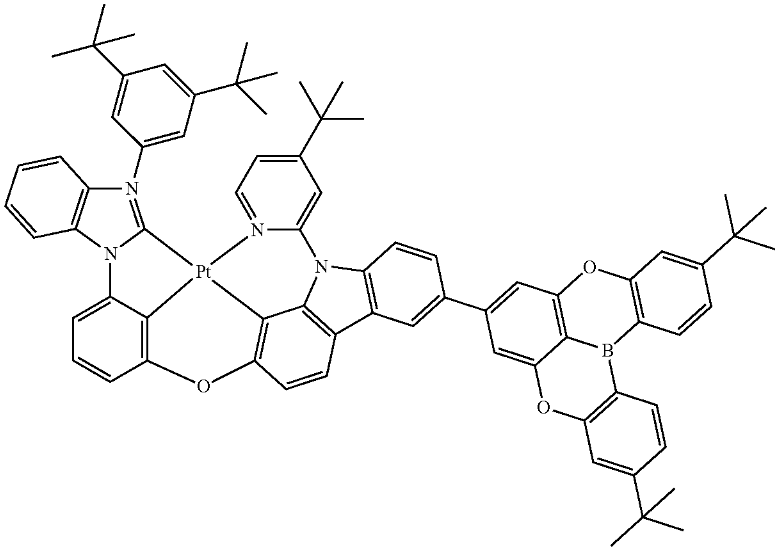

Pt-4

(1) Synthesis of Intermediate Pt-4-IM2

10.86 grams (g) (20 millimoles (mmols)) of 2-(3-(1H-benzo[d]imidazol-1-yl)phenoxy)-9-(4-(tert-butyl)pyridin-2-yl)-6-chloro-9H-carbazole, 15.25 g (30 mmol) of 3,11-di-tert-butyl-7-(4,4,5,5-tetramethyl-1,3,2-dioxaborolan-2-yl)-5,9-dioxa-13b-boranaphtho[3,2,1-de]anthracene, 0.90 g (4 mmol) of palladium (II) acetate, 3.28 g (8 mmol) of SPhos, and 8.49 g (40 mmol) of potassium phosphate tribasic were mixed with 200 milliliters (mL) of 1,4-dioxane/$H_2O$ (4:1), followed by stirring at 100° C. for 16 hours. Once the reaction was complete, the mixture was cooled to room temperature, and then, an organic layer extracted using saturated $NH_4Cl$ and methylene chloride (MC) was dried with anhydrous $MgSO_4$ and subjected to filtration, followed by concentration under reduced pressure. The resulting product was subjected to silica gel column chromatography to thereby obtain 8.89 g (10.0 mmol) of Intermediate Pt-4-IM2 (yield: 50%).

Liquid chromatography-mass spectrometry (LC-Mass) (calculated value: 888.42 g/mol, measured value: $M^{+1}$=889 g/mol).

(2) Synthesis of Intermediate Pt-4-IM1

8.89 g (10.0 mmol) of Intermediate Pt-4-IM2, 7.56 g (13.0 mmol) of (3,5-di-tert-butylphenyl)(mesityl)iodonium triflate, and 0.36 g (2.0 mmol) of copper (II) acetate were mixed with 40 mL of N,N-dimethylformamide (DMF), followed by stirring at a temperature of 100° C. for 1 hour. Once the reaction was complete, the mixture was cooled to room temperature, and then, an organic layer extracted using saturated $NH_4Cl$ and ethyl acetate (EA) was dried with anhydrous $MgSO_4$ and subjected to filtration, followed by concentration under reduced pressure. The resulting product was subjected to silica gel column chromatography to thereby obtain 10.31 g (8.40 mmol) of Intermediate Pt-4-IM1 (yield: 84%).

LC-Mass (calculated value: 1077.56 g/mol, measured value: $M^{+1}$=1077 g/mol).

(3) Synthesis of Compound Pt-4

10.31 g (8.40 mmol) of Intermediate Pt-4-IM1, 3.46 g (9.24 mmol) of $Pt(COD)Cl_2$, and 2.07 g (25.20 mmol) of sodium acetate were mixed with 420 mL of benzonitrile, followed by stirring at a temperature of 180° C. for 18 hours. Once the reaction was complete, the mixture was cooled to room temperature and concentrated under reduced pressure. The resulting product was subjected to silica gel column chromatography to thereby obtain 3.31 g (2.60 mmol) of Compound Pt-4 (yield: 31%).

LC-Mass (calculated value: 1269.53 g/mol, measured value: $M^{+1}$=1270 g/mol).

Synthesis Example 2: Synthesis of Compound Pt-6

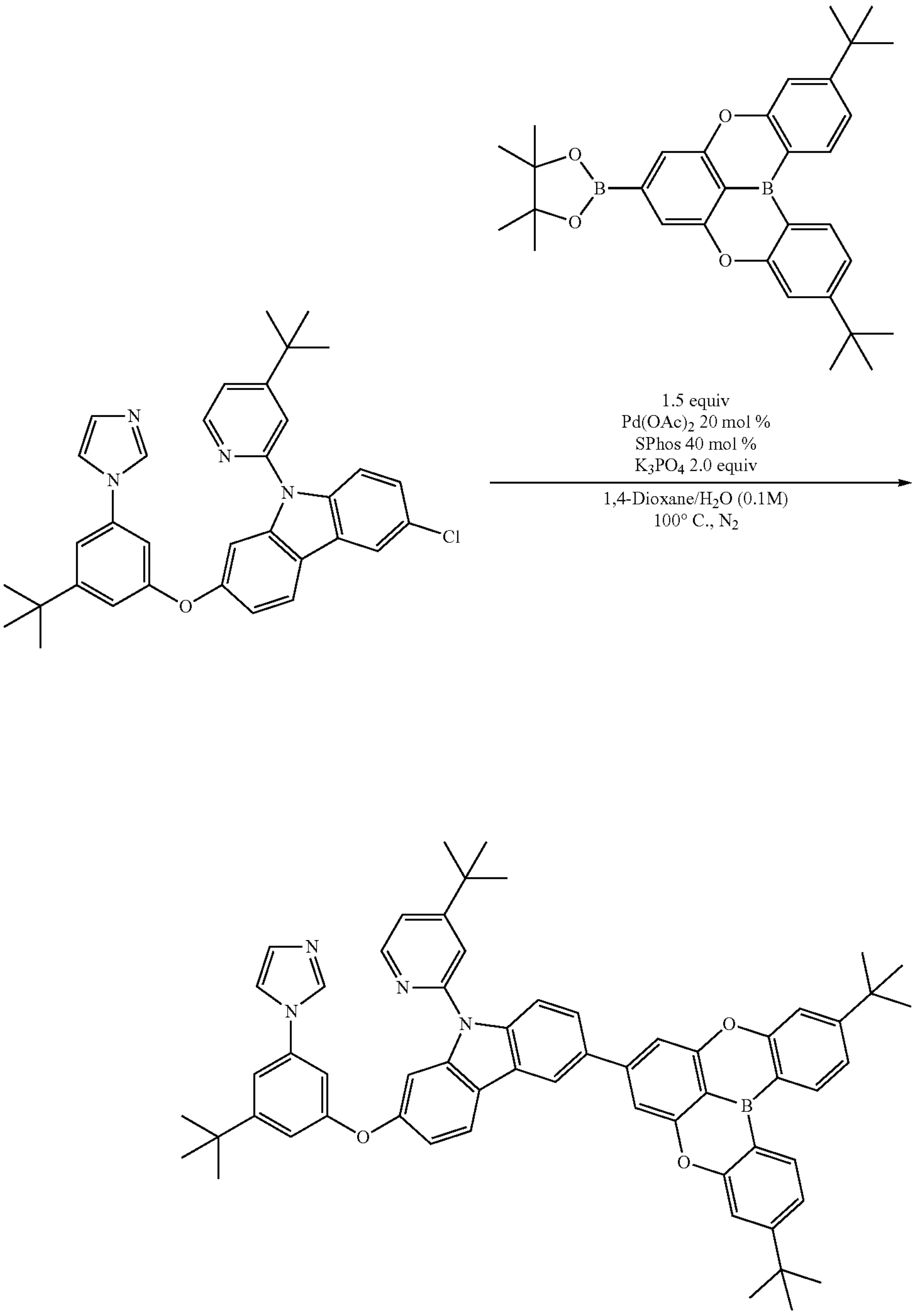

Pt-6-IM2

-continued
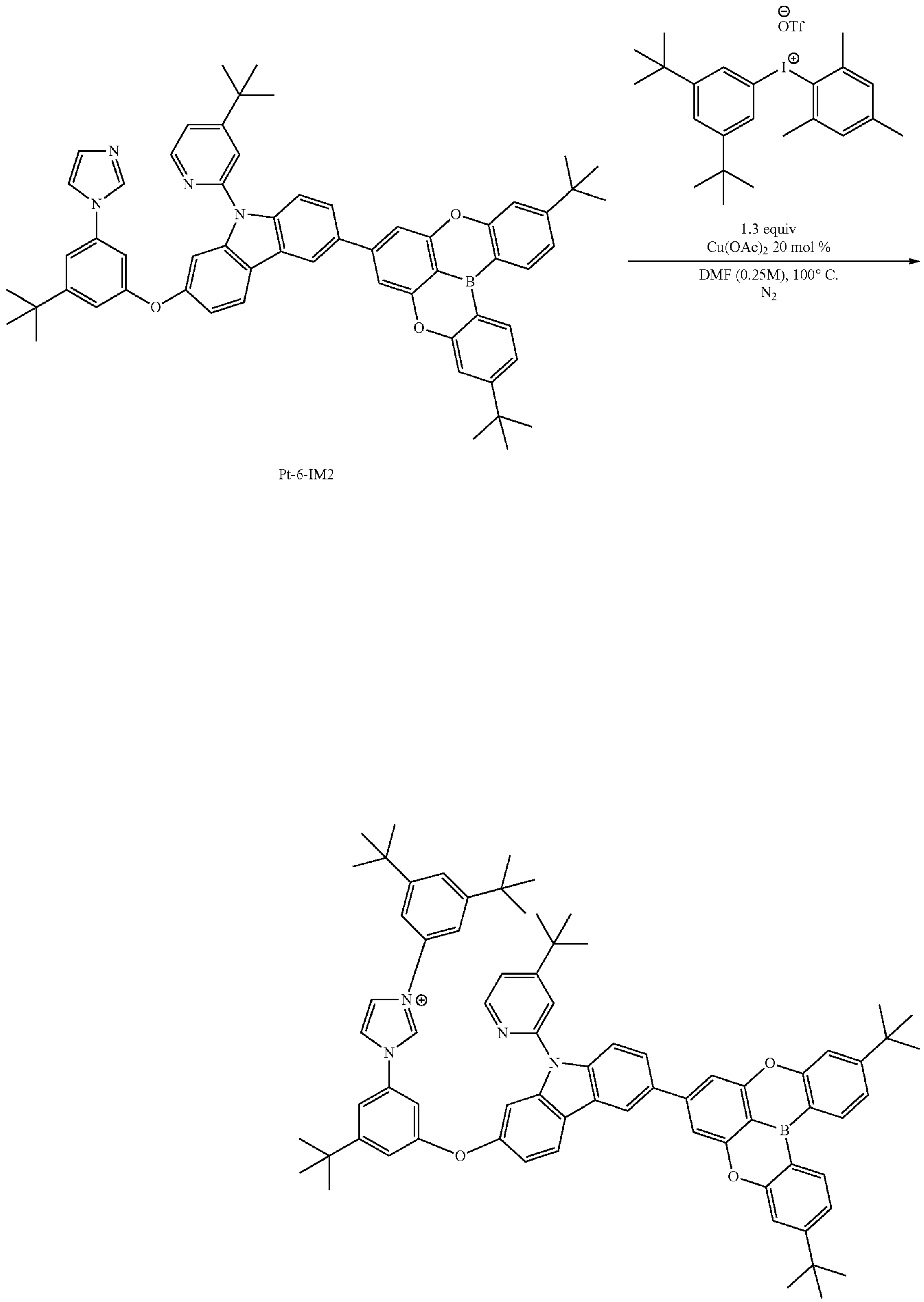
Pt-6-IM2
Pt-6-IM1

-continued

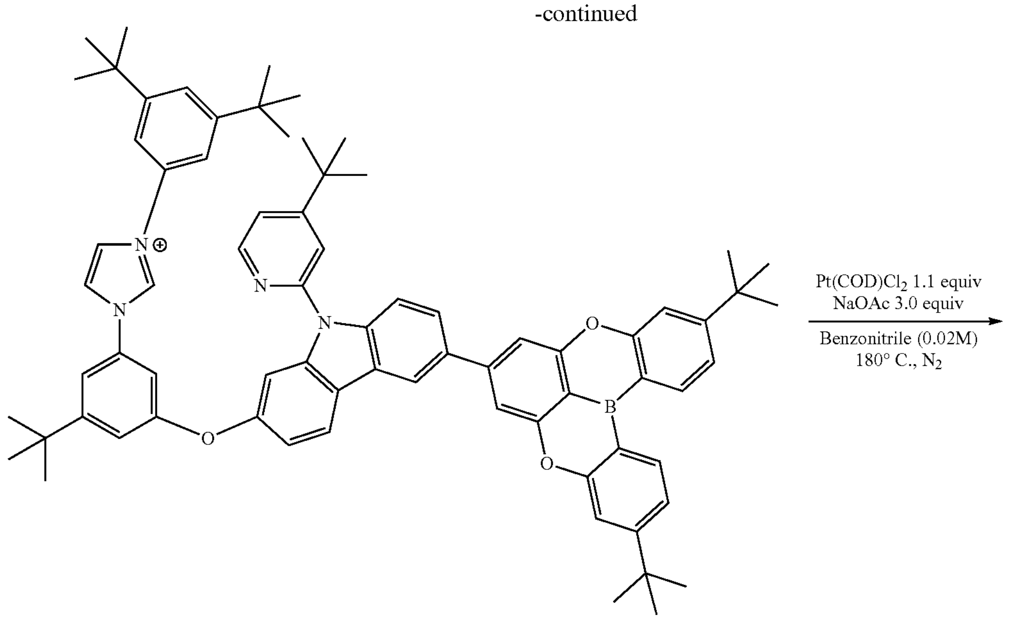

Pt-6-IM1

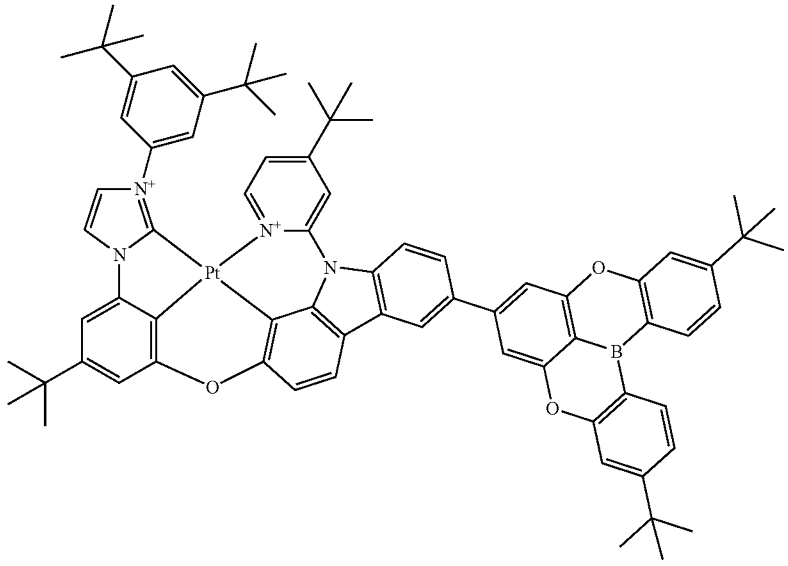

Pt-6

(1) Synthesis of Intermediate Pt-6-IM2

10.98 g (20 mmol) of 2-(3-(tert-butyl)-5-(1H-imidazol-1-yl)phenoxy)-9-(4-(tert-butyl)pyridin-2-yl)-6-chloro-9H-carbazole, 15.25 g (30 mmol) of 3,11-di-tert-butyl-7-(4,4,5,5-tetramethyl-1,3,2-dioxaborolan-2-yl)-5,9-dioxa-13b-boranaphtho[3,2,1-de]anthracene, 0.90 g (4 mmol) of palladium (II) acetate, 3.28 g (8 mmol) of SPhos, and 8.49 g (40 mmol) of potassium phosphate tribasic were mixed with 200 mL of 1,4-dioxane/$H_2O$ (4:1), followed by stirring at 100° C. for 16 hours. Once the reaction was complete, the mixture was cooled to room temperature, and then, an organic layer extracted using saturated $NH_4Cl$ and MC was dried with anhydrous $MgSO_4$ and subjected to filtration, followed by concentration under reduced pressure. The resulting product was subjected to silica gel column chromatography to thereby obtain 10.01 g (11.2 mmol) of Intermediate Pt-6-IM2 (yield: 56%).

LC-Mass (calculated value: 894.47 g/mol, measured value: $M^{+1}$=895 g/mol)

(2) Synthesis of Intermediate Pt-6-IM1

10.01 g (11.2 mmol) of Intermediate Pt-6-IM2, 8.51 g (14.56 mmol) of (3,5-di-tert-butylphenyl)(mesityl)iodonium triflate, and 0.41 g (2.24 mmol) of copper (II) acetate were mixed with 45 mL of DMF, followed by stirring at a temperature of 100° C. for 1 hour. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 10.44 g (9.63 mmol) of Intermediate Pt-6-IM1 (yield: 86%).

LC-Mass (calculated value: 1083.63 g/mol, measured value: $M^{+1}$=1083 g/mol)

(3) Synthesis of Compound Pt-6

10.44 g (9.63 mmol) of Intermediate Pt-6-IM1, 3.96 g (10.59 mmol) of $Pt(COD)Cl_2$, and 2.37 g (28.89 mmol) of sodium acetate were mixed with 480 mL of benzonitrile, followed by stirring at a temperature of 180° C. for 18 hours. Once the reaction was complete, the mixture was cooled to room temperature and concentrated under reduced pressure. The resulting product was subjected to silica gel column chromatography to thereby obtain 4.79 g (3.76 mmol) of Compound Pt-6 (yield: 39%).

LC-Mass (calculated value: 1275.57 g/mol, measured value: $M^{+1}$=1276 g/mol)

Synthesis Example 3: Synthesis of Compound Pt-26

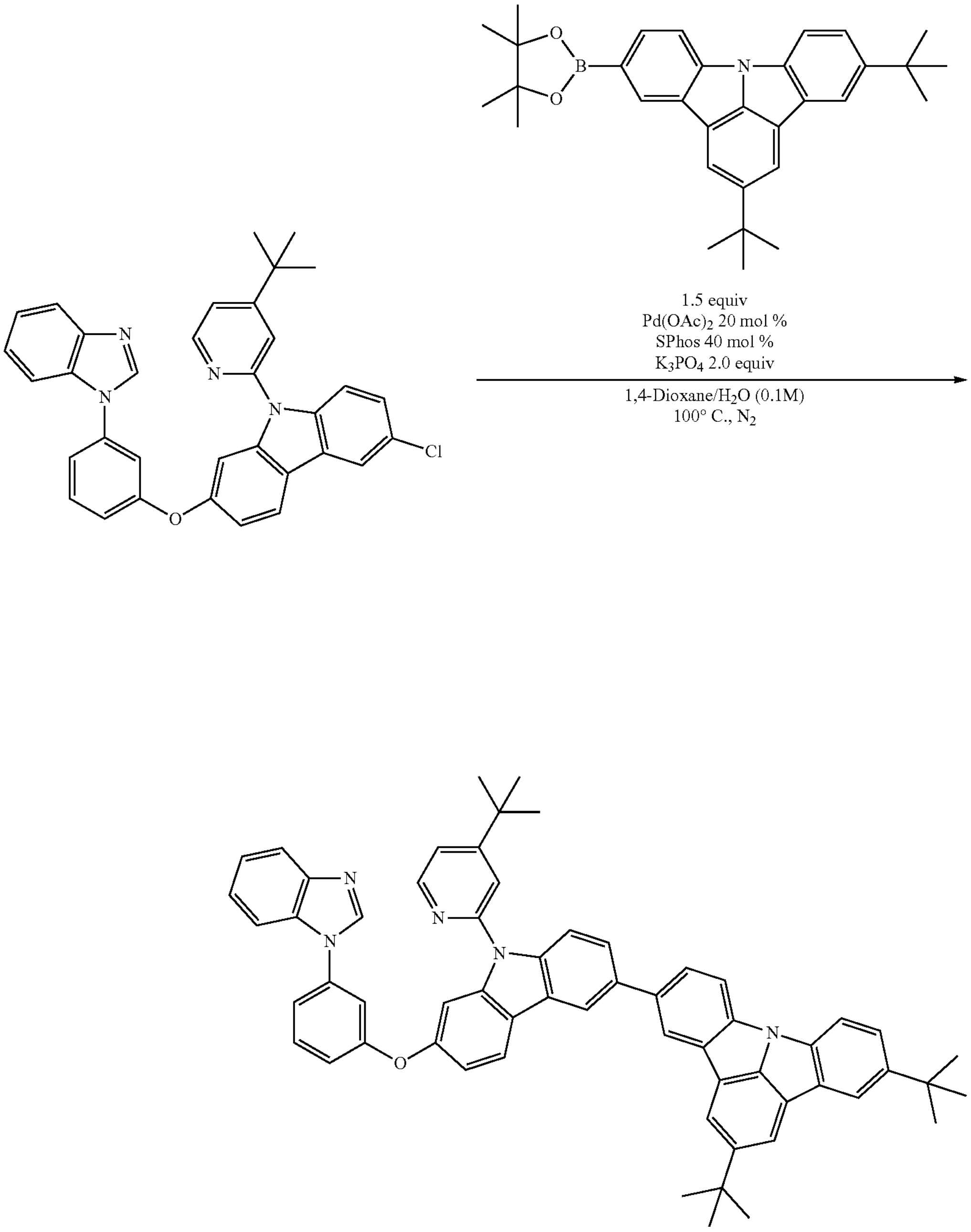

Pt-26-IM2

-continued
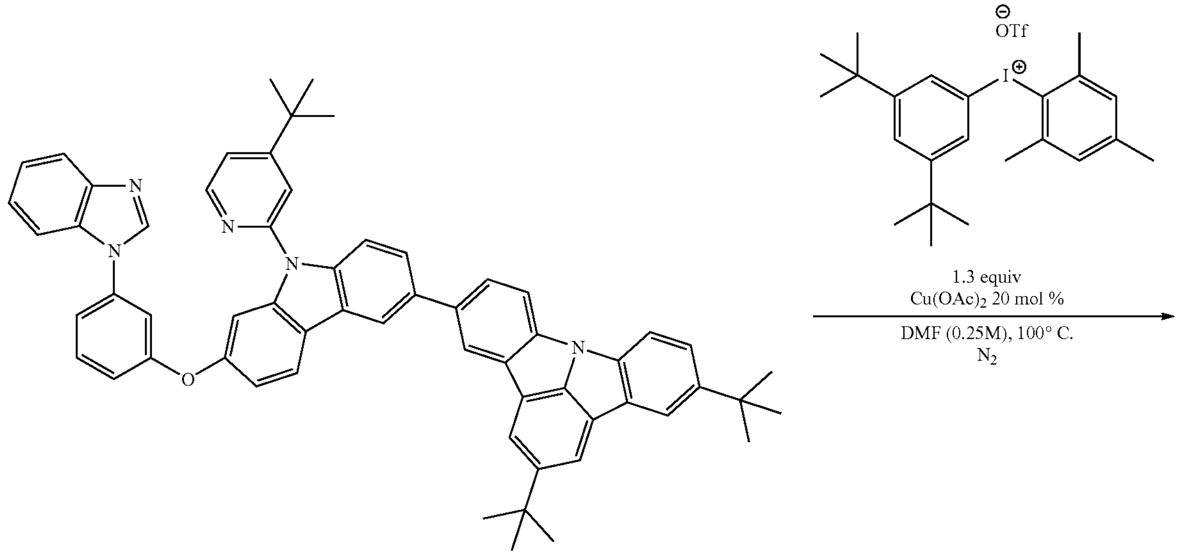
Pt-26-IM2
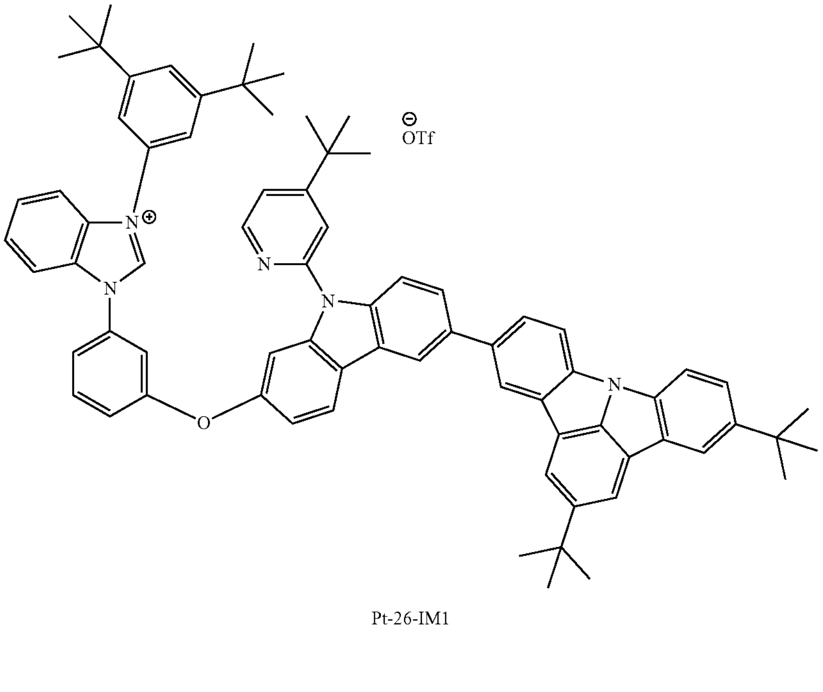
Pt-26-IM1

-continued

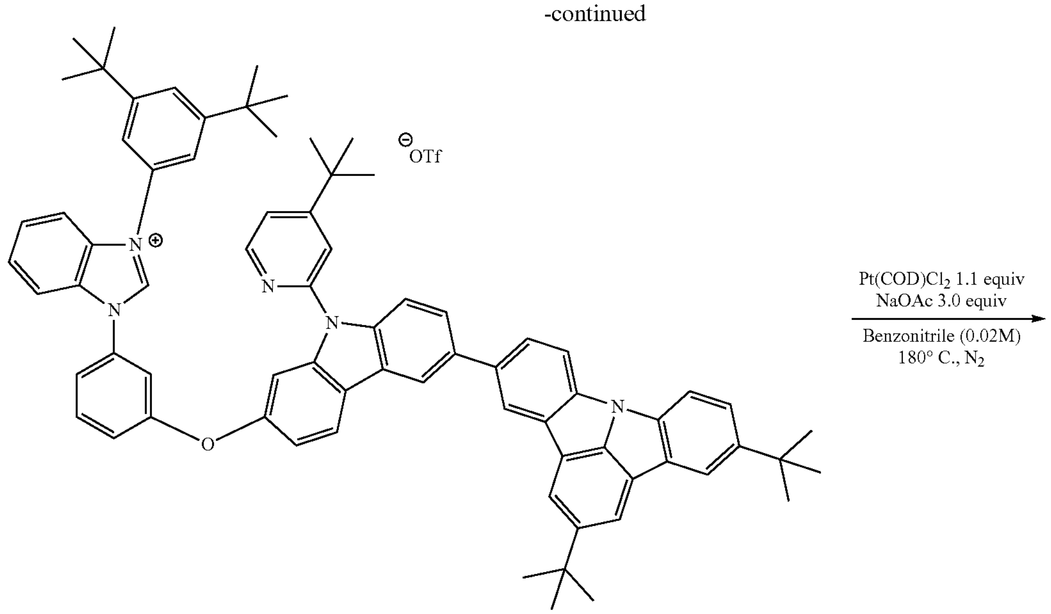

Pt-26-IM1

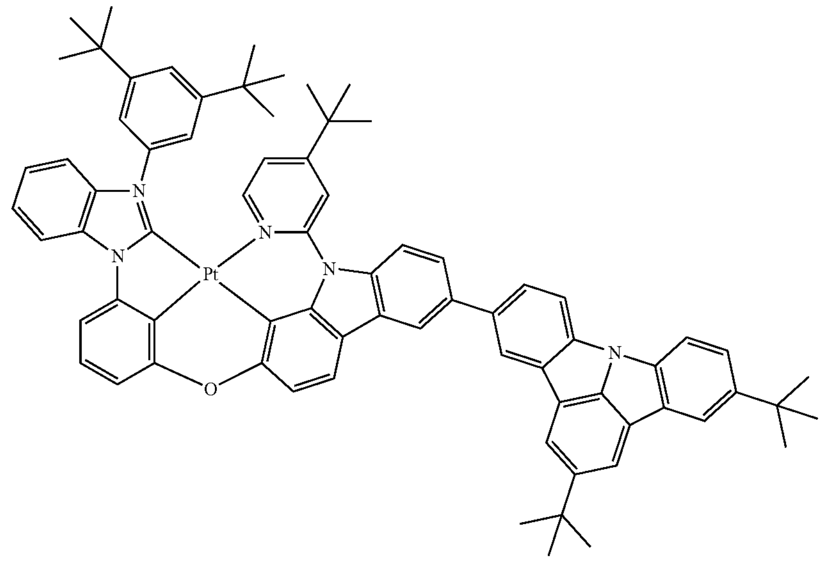

Pt-26

(1) Synthesis of Intermediate Pt-26-IM2

10.86 g (20 mmol) of 2-(3-(1H-benzo[d]imidazol-1-yl)phenoxy)-9-(4-(tert-butyl)pyridin-2-yl)-6-chloro-9H-carbazole, 14.38 g (30 mmol) of 2,5-di-tert-butyl-11-(4,4,5,5-tetramethyl-1,3,2-dioxaborolan-2-yl)indolo[3,2,1-jk]carbazole, 0.90 g (4 mmol) of palladium (II) acetate, 3.28 g (8 mmol) of SPhos, and 8.49 g (40 mmol) of potassium phosphate tribasic were mixed with 200 mL of 1,4-dioxane/$H_2O$ (4:1), followed by stirring at 100° C. for 16 hours. Once the reaction was complete, the mixture was cooled to room temperature, and then, an organic layer extracted using saturated $NH_4Cl$ and MC was dried with anhydrous $MgSO_4$ and subjected to filtration, followed by concentration under reduced pressure. The resulting product was subjected to silica gel column chromatography to thereby obtain 9.63 g (11.2 mmol) of Intermediate Pt-26-IM2 (yield: 56%).

LC-Mass (calculated value: 859.43 g/mol, measured value: $M^{+1}$=860 g/mol)

(2) Synthesis of Intermediate Pt-26-IM1

9.63 g (11.2 mmol) of Intermediate Pt-26-IM2, 8.50 g (14.56 mmol) of (3,5-di-tert-butylphenyl)(mesityl)iodonium triflate, and 0.41 g (2.24 mmol) of copper (II) acetate were mixed with 45 mL of DMF, followed by stirring at a temperature of 100° C. for 1 hour. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 11.41 g (9.52 mmol) of Intermediate Pt-26-IM1 (yield: 85%).

LC-Mass (calculated value: 1048.59 g/mol, measured value: $M^{+1}$=1048 g/mol)

(3) Synthesis of Compound Pt-26

11.41 g (9.52 mmol) of Intermediate Pt-26-IM1, 3.92 g (10.47 mmol) of $Pt(COD)Cl_2$, and 2.34 g (28.56 mmol) of sodium acetate were mixed with 476 mL of benzonitrile, followed by stirring at a temperature of 180° C. for 18 hours. Once the reaction was complete, the mixture was cooled to room temperature and concentrated under reduced pressure. The resulting product was subjected to silica gel column chromatography to thereby obtain 3.55 g (2.86 mmol) of Compound Pt-26 (yield: 30%).

LC-Mass (calculated value: 1240.53 g/mol, measured value: $M^{+1}$=1241 g/mol)

Synthesis Example 4: Synthesis of Compound Pt-47

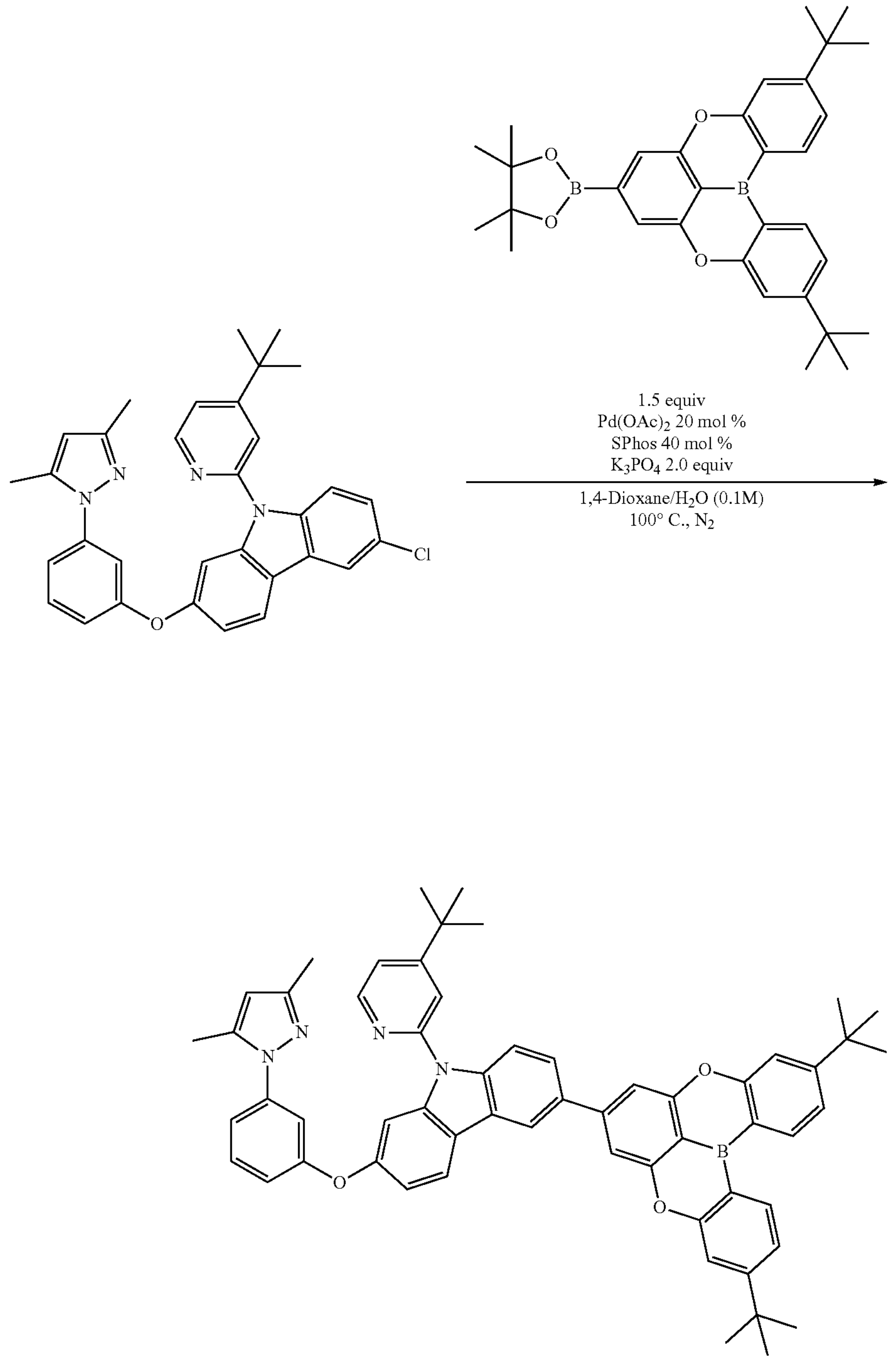

Pt-47-IM1

-continued

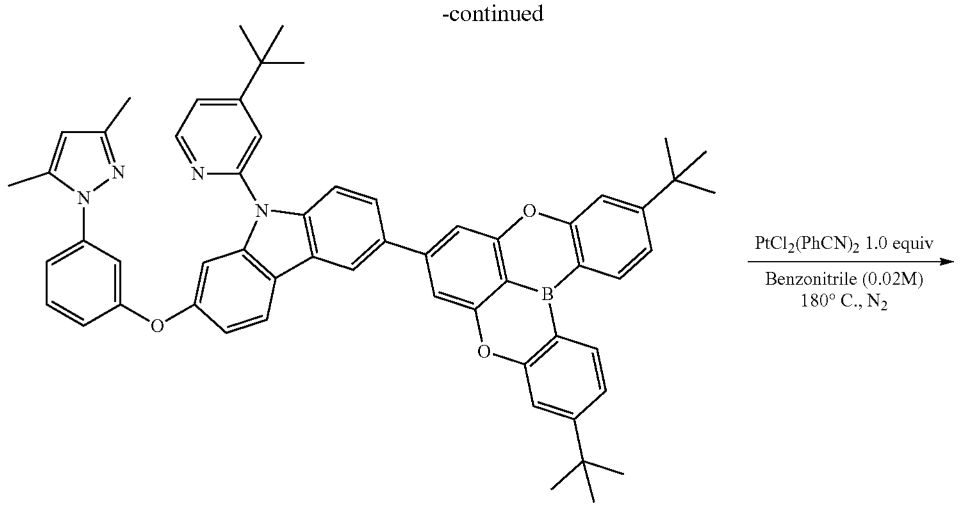

Pt-47-IM1

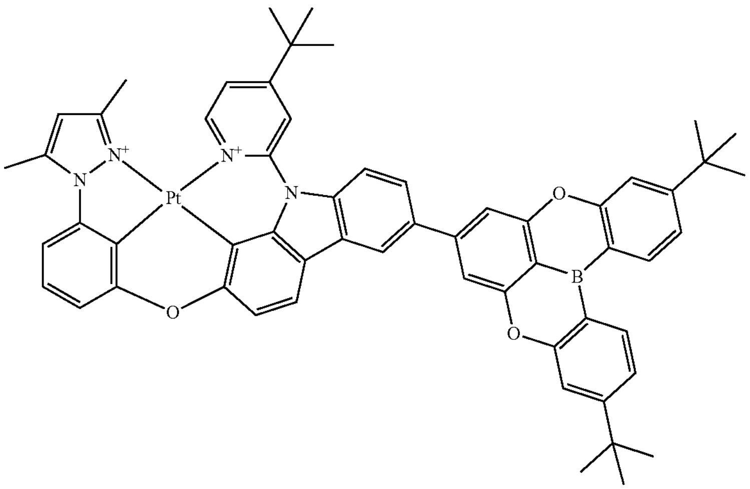

Pt-47

(1) Synthesis of Intermediate Pt-47-IM1

10.42 g (20 mmol) of 9-(4-(tert-butyl)pyridin-2-yl)-6-chloro-2-(3-(3,5-dimethyl-1H-pyrazol-1-yl)phenoxy)-9H-carbazole, 14.38 g (30 mmol) of 2,5-di-tert-butyl-11-(4,4,5,5-tetramethyl-1,3,2-dioxaborolan-2-yl)indolo[3,2,1-jk]carbazole, 0.90 g (4 mmol) of palladium (II) acetate, 3.28 g (8 mmol) of SPhos, and 8.49 g (40 mmol) of potassium phosphate tribasic were mixed with 200 mL of 1,4-dioxane/$H_2O$ (4:1), followed by stirring at 100° C. for 16 hours. Once the reaction was complete, the mixture was cooled to room temperature, and then, an organic layer extracted using saturated $NH_4Cl$ and MC was dried with anhydrous $MgSO_4$ and subjected to filtration, followed by concentration under reduced pressure. The resulting product was subjected to silica gel column chromatography to thereby obtain 10.06 g (11.6 mmol) of Intermediate Pt-47-IM1 (yield: 58%).

LC-Mass (calculated value: 866.44 g/mol, measured value: $M^{+1}$=865 g/mol)

(2) Synthesis of Compound Pt-47

10.06 g (11.6 mmol) of Intermediate Pt-47-IM1 and 5.48 g (11.6 mmol) of $PtCl_2(PhCN)_2$ were mixed with 580 mL of benzonitrile, followed by stirring at a temperature of 180° C. for 18 hours. Once the reaction was complete, the mixture was cooled to room temperature and concentrated under reduced pressure. The resulting product was subjected to silica gel column chromatography to thereby obtain 4.92 g (4.64 mmol) of Compound Pt-47 (yield: 40%).

LC-Mass (calculated value: 1059.39 g/mol, measured value: $M^{+1}$=1060 g/mol)

Evaluation Example 1: Evaluation of Photoluminescence (PL) Spectrum

Figure 2:
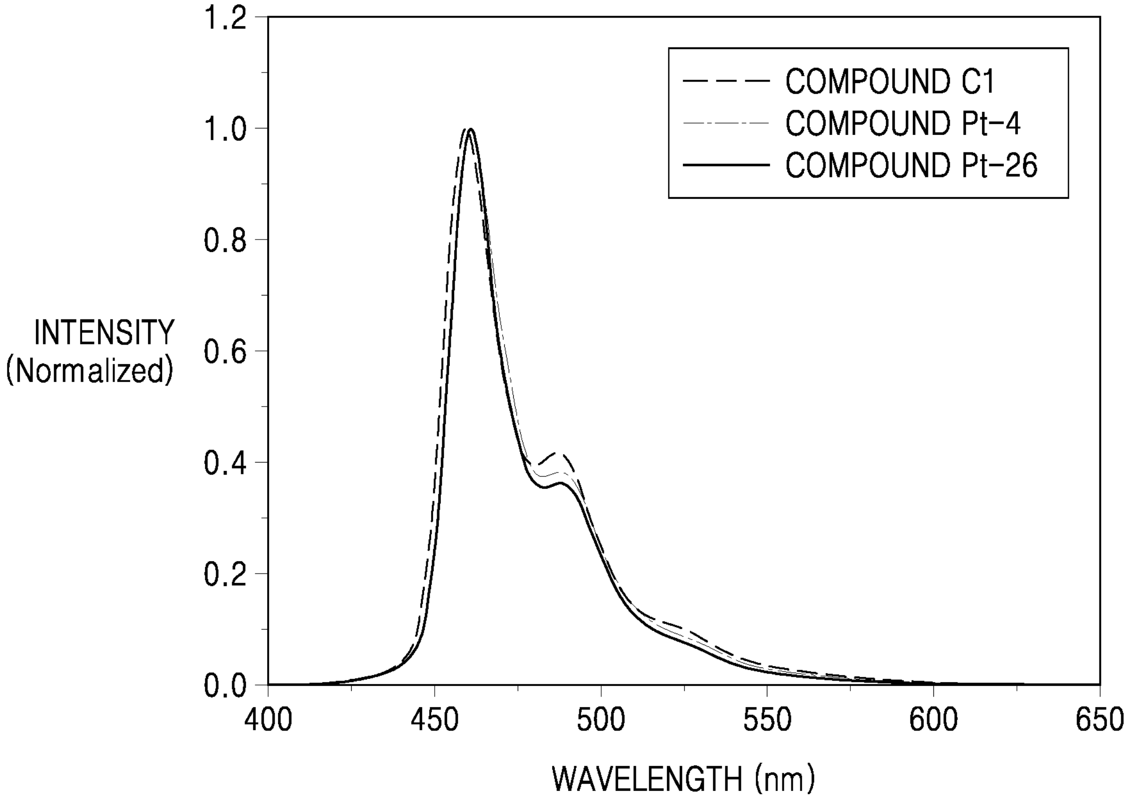
FIG. 2 is a graph of wavelength (l, nanometers (nm)) versus intensity (arbitrary units, normalized) showing photoluminescence (PL) spectra of compounds C1, Pt-4, and Pt-26 according to one or more aspects of the Examples below.

Compound Pt-4, Compound Pt-26, and Comparative Compound C1 were each diluted in toluene at a concentration of $10^{-4}$ molar (M). Then, the PL spectrum of each of the compounds was measured by using an ISC PC1 spectrofluorometer, wherein a xenon lamp is mounted. The results thereof are shown in FIG. 2. The maximum emission wavelength (nm), FWHM (nm), second peak intensity (arbitrary units), and CIE y-coordinate of each compound were obtained from the PL spectrum of each compound. The results thereof are shown in Table 2.

TABLE 2

| | Maximum emission wavelength (nm) | FWHM (nm) | Second peak intensity | CIE y-coordinate |
|---|---|---|---|---|
| C1 | 460 | 20 | 0.419 | 0.140 |
| Pt-4 | 461 | 21 | 0.383 | 0.137 |
| Pt-26 | 461 | 21 | 0.365 | 0.129 |

Referring to the results of Table 2, Compounds Pt-4 and Pt-26 were each found to have a reduced intensity of the second emission peak and a small CIE y-coordinate, as compared with Comparative Compound C1. Accordingly, the compounds according to one or more embodiments were found to emit deep blue, as compared with the Comparative Compound.

Example 1

A glass substrate having 500 Å of indium tin oxide (ITO) electrode (first electrode, anode) deposited thereon was washed with distilled water in the presence of ultrasound waves. Once the washing with distilled water was complete, ultrasound wave washing was performed on the substrate by using isopropyl alcohol, acetone, and methanol in this stated order. Subsequently, the substrate was dried, transferred to a plasma washer, washed for 5 minutes using oxygen plasma, and mounted in a vacuum deposition device.

Compound HT3 was vacuum-deposited on the ITO electrode of the glass substrate to form a first hole injection layer having a thickness of 3,500 Å, Compound HT-D1 was vacuum-deposited on the first hole injection layer to form a second hole injection layer having a thickness of 300 Å, and TAPC was vacuum-deposited on the second hole injection layer to form an electron blocking layer having a thickness of 100 Å, thereby forming a hole transport region.

Compound H52 and Compound Pt-4 (10 wt %) were co-deposited on the hole transport region to form an emission layer having a thickness of 300 Å.

Compound ET3 was vacuum-deposited on the emission layer to form an electron transport layer having a thickness of 250 Å, ET-D1 (Liq) was deposited on the electron transport layer to form an electron injection layer having a thickness of 5 Å, and an Al second electrode (a cathode) was formed on the electron injection layer to have a thickness of 1,000 Å, thereby completing the manufacture of an organic light-emitting device.

HT3

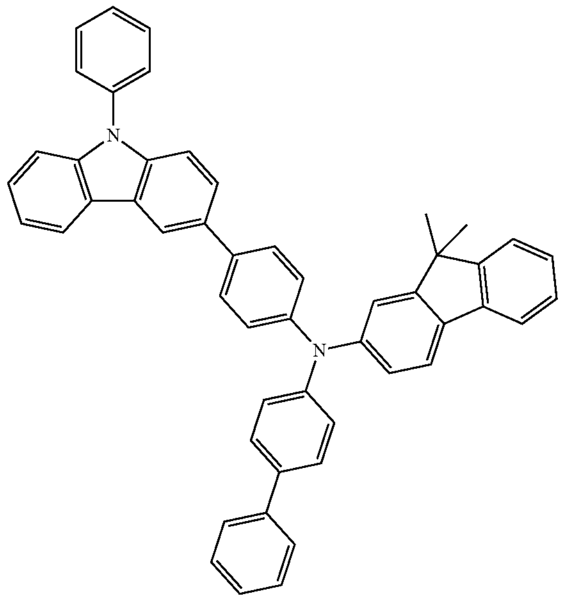

HT-D1

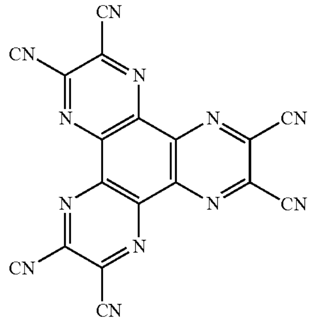

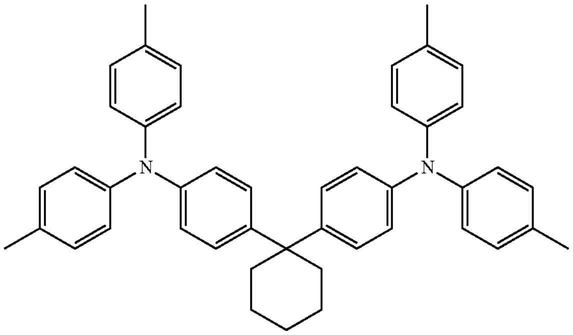

TAPC

H52

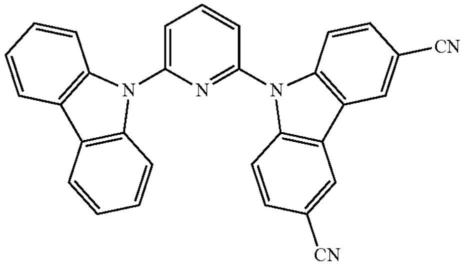

-continued

ET3

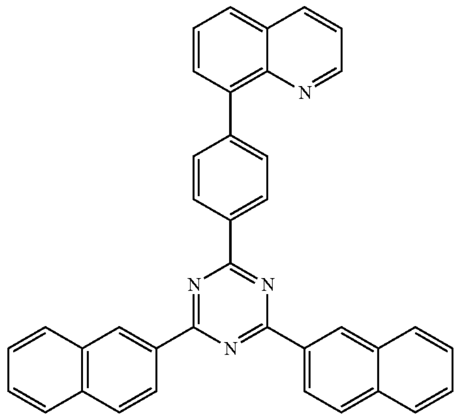

ET-D1

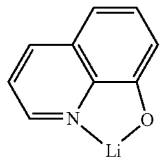

Example 2

An organic light-emitting device was manufactured in the same manner as in Example 1, except that Compound Pt-26 was used instead of Compound Pt-4 to form an emission layer.

Comparative Example 1

An organic light-emitting device was manufactured in the same manner as in Example 1, except that Compound C1 was used instead of Compound Pt-4 to form an emission layer.

Evaluation Example 2: Evaluation of Characteristics of Organic Light-Emitting Device The maximum emission wavelength of the EL spectrum, the driving voltage, and the external quantum luminescence efficiency of each of the organic light-emitting devices manufactured in Examples 1 and 2 and Comparative Example 1 were evaluated. The results thereof are shown in Table 3. EL spectra of the manufactured organic light-emitting devices at a luminance of 1,000 candela per square meter (cd/$m^2$) were measured by using a luminance meter (Minolta Cs-1000A). Then, the maximum emission wavelength ($\lambda_{max}$, nm) was evaluated. A Keithley 2400 current voltmeter and a luminance meter (Minolta Cs-1000A) were used in evaluation of driving voltage (relative value, %) and external quantum luminescence efficiency (EQE, relative value, %).

TABLE 3

| | Dopant Compound No. | Maximum emission wavelength (nm) | Driving voltage (relative value, %) | External quantum efficiency (relative value, %) |
|---|---|---|---|---|
| Example 1 | Pt-4 | 463 | 97 | 107 |
| Example 2 | Pt-26 | 463 | 96 | 109 |
| Comparative Example 1 | C1 | 462 | 100 | 100 |

Compound C1

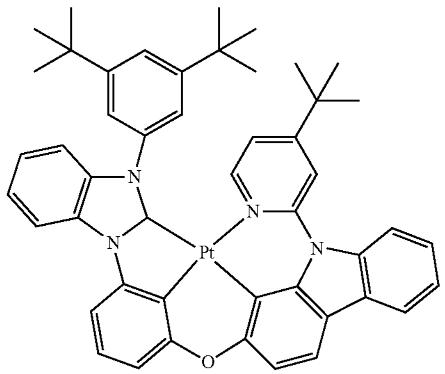

Referring to the results of Table 3, the organic light-emitting devices of Examples 1 and 2 were found to have low driving voltage and high external quantum luminescence efficiency, as compared with the organic light-emitting device of Comparative Example 1.

As apparent from the foregoing description, an organic light-emitting device including the organometallic compound represented by Formula 1 may have high efficiency and improved colorimetric purity.

It should be understood that the exemplary embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

$$M_1(L_{11})n_{11}(L_{12})n_{12} \quad \text{Formula 1}$$

wherein, in Formula 1,

M1 is a first-row transition metal, a second-row transition metal, or a third-row transition metal, $L_{11}$ is a ligand represented by Formula 1-1, $L_{12}$ is a monodentate ligand or a bidentate ligand, $n_{11}$ is 1, and $n_{12}$ is 0, 1, or 2:

Formula 1-1

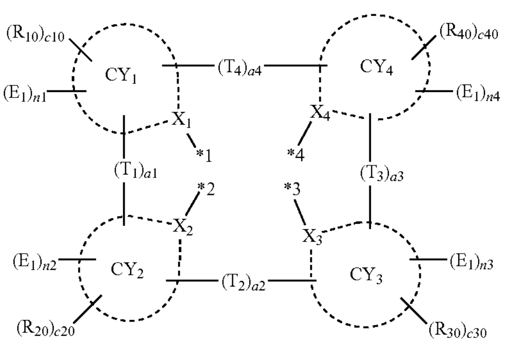

wherein, in Formula 1-1,

*1, *2, *3, and *4 are each a binding site to Min Formula 1, $X_1$ to $X_4$ are each independently C or N, a bond between $X_1$ and $M_1$, a bond between $X_2$ and $M_1$, a bond between $X_3$ and $M_1$, and a bond between $X_4$ and $M_1$ are each independently a covalent bond or a coordinate bond, ring $CY_1$ to ring $CY_4$ are each independently a $C_5$-$C_{30}$ carbocyclic group or a $C_1$-$C_{30}$ heterocyclic group, $T_1$ to $T_4$ are each independently a single bond, *—O—*', *—S—*', *—Se—*', *—S(=O)$_2$—*', *—C($R_{50}$)($R_{60}$)—*', *—C($R_{50}$)=*', *—C($R_{50}$)=C($R_{60}$)—*', *—C(=O)—*', *—C(=S)—*', *—C≡C—*', *—B($R_{50}$)—*', *—N($R_{50}$)—*', *—P($R_{50}$)—*', *—Si($R_{50}$)($R_{60}$)—*', *—P(=O)($R_{50}$)—*', or *—Ge($R_{50}$)($R_{60}$)—*', a1 to a4 are each independently an integer from 0 to 3, provided that at least three of a1 to a4 are each independently an integer from 1 to 3, $E_1$ is a group represented by one of Formulae 2-5 to 2-8, and n1 to n4 are each independently 0, 1, or 2, and the sum of n1, n2, n3, and n4 is 1 or greater:

2-5

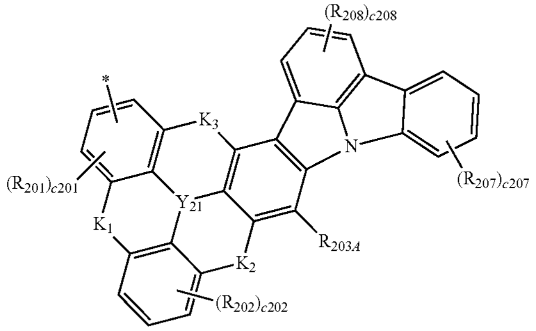

-continued 2-6

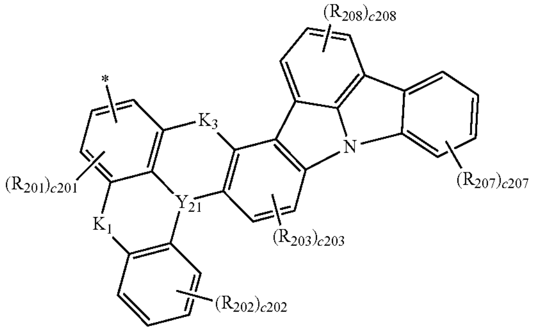

2-7

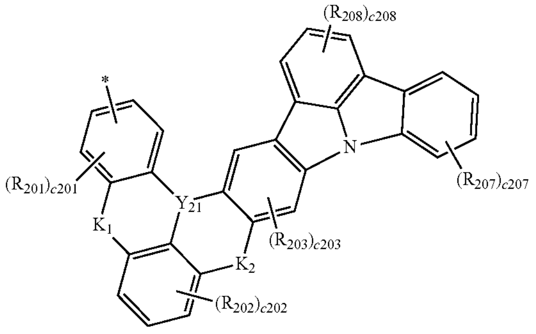

2-8

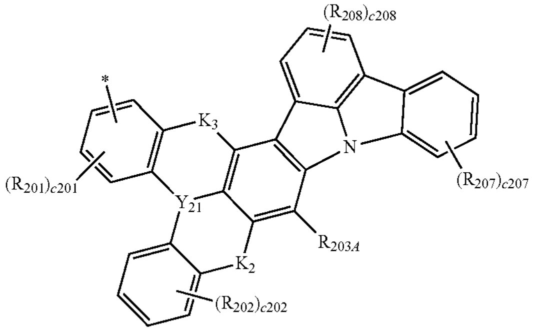

wherein, in Formulae 2-5 to 2-8, c201 and c206 are each an integer from 1 to 3, c202, c203, and c207 are each an integer from 1 to 4, $Y_{21}$ is B, P, P(=O), or N, $K_1$ to $K_3$ are each independently a single bond, B($R_{204}$), N($R_{205}$), O, S, Se, C(=O), or S(=O)$_2$, and

* indicates a binding site to an adjacent atom, wherein, in Formulae 1-1 and 2-5 to 2-8, $R_{10}$, $R_{20}$, $R_{30}$, $R_{40}$, $R_{50}$, $R_{60}$, $R_{201}$ to $R_{207}$, and $R_{203A}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P($Q_8$)($Q_9$), or —P(═O)($Q_8$)($Q_9$), c10, c20, c30, and c40 are each independently an integer from 1 to 10, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, substituted monovalent non-aromatic condensed polycyclic group, or the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, or a phosphoric acid group or a salt thereof;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{60}$ heterocycloalkenyl group, a $C_6$-$C_{60}$ aryl group, a $C_7$-$C_{60}$ alky aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P($Q_{18}$)($Q_{19}$), —P(═O)($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-Coo aryl group, a $C_7$-$C_{60}$ alky aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P($Q_{28}$)($Q_{29}$), —P(═O)($Q_{28}$)($Q_{29}$), or a combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P($Q_{38}$)($Q_{39}$), or —P(═O)($Q_{38}$)($Q_{39}$); or a combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_1$-$C_{60}$ heteroaryl group; a $C_1$-$C_{60}$ heteroaryloxy group; a $C_1$-$C_{60}$ heteroarylthio group; a monovalent non-aromatic condensed polycyclic group; or a monovalent non-aromatic condensed heteropolycyclic group.

2. The organometallic compound of claim 1, wherein $M_1$ in Formula 1 is Pt, Pd, or Au.

3. The organometallic compound of claim 1, wherein a bond between $X_1$ in Formula 1-1 and $M_1$ in Formula 1 is a coordinate bond.

4. The organometallic compound of claim 1, wherein, in Formula 1-1, a1 is not 0, and ring CY1 is represented by one of Formulae CY1(1) to CY1(56) and CY1(101) to CY1(108):

-continued
CY1(1)
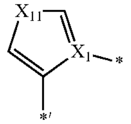
CY1(2)
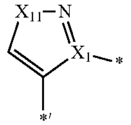
CY1(3)
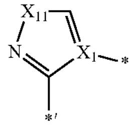
CY1(4)
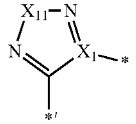
CY1(5)
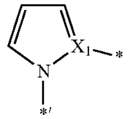
CY1(6)
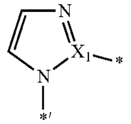
CY1(7)
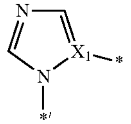
CY1(8)
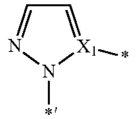
CY1(9)
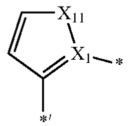
CY1(10)
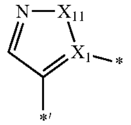
CY1(11)
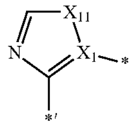
CY1(12)
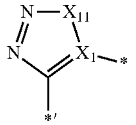
CY1(13)
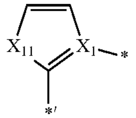
CY1(14)
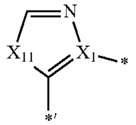
CY1(15)
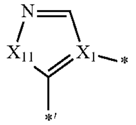
CY1(16)
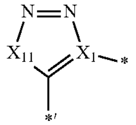
CY1(17)
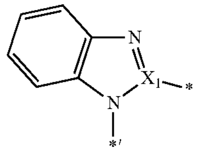
CY1(18)
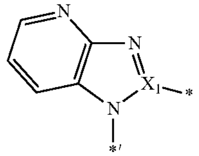
CY1(19)
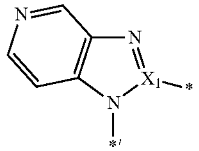
CY1(20)
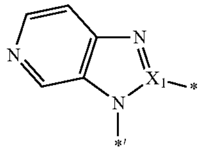
CY1(21)
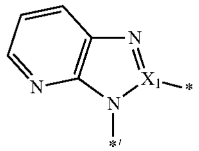

-continued
CY1(22)
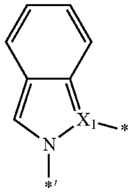
CY1(23)
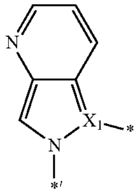
CY1(24)
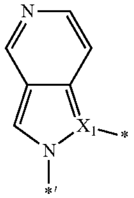
CY1(25)
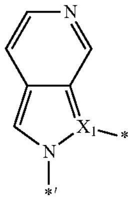
CY1(26)
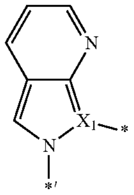
CY1(27)
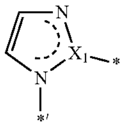
CY1(28)
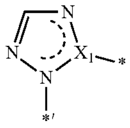
CY1(29)
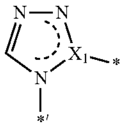
CY1(30)
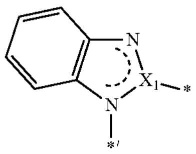
-continued
CY1(31)
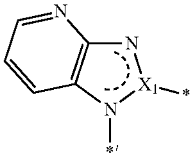
CY1(32)
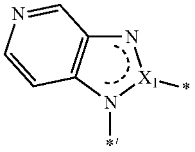
CY1(33)
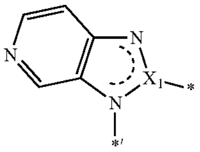
CY1(34)
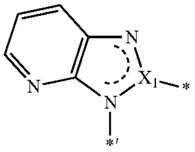
CY1(35)
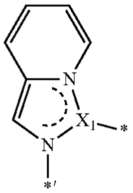
CY1(36)
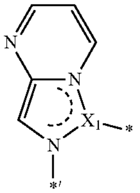
CY1(37)
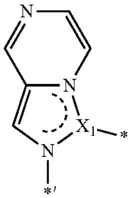
CY1(38)
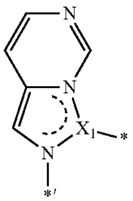

-continued
CY1(39)
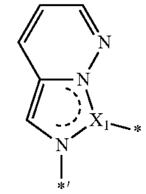
CY1(40)
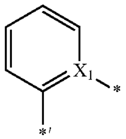
CY1(41)
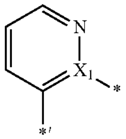
CY1(42)
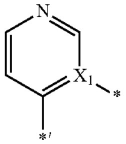
CY1(43)
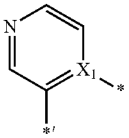
CY1(44)
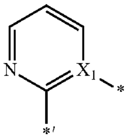
CY1(45)
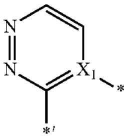
CY1(46)
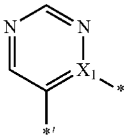
CY1(47)
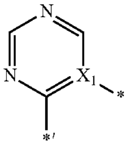
CY1(48)
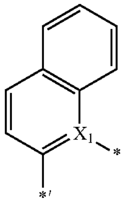
-continued
CY1(49)
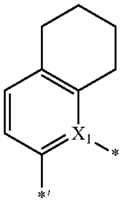
CY1(50)
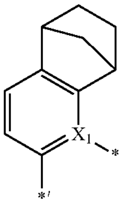
CY1(51)
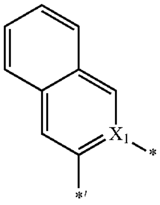
CY1(52)
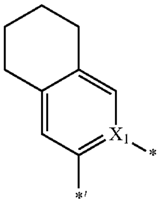
CY1(53)
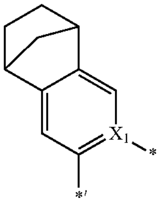
CY1(54)
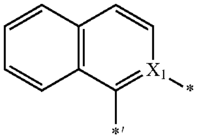
CY1(55)
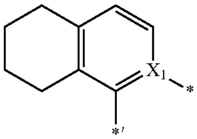
CY1(56)
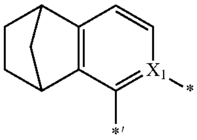

-continued

CY1(101)

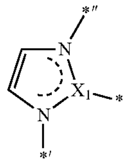

CY1(102)

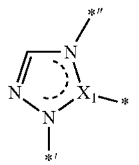

CY1(103)

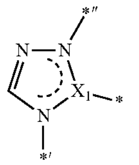

CY1(104)

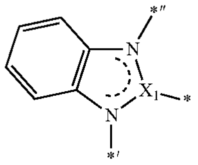

CY1(105)

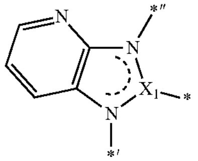

CY1(106)

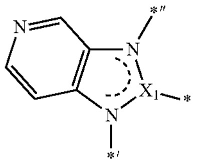

CY1(107)

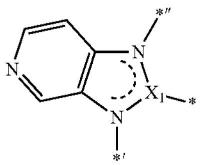

CY1(108)

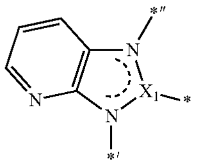

wherein, in Formulae CY1(1) to CY1(56) and CY1(101) to CY1(108), $X_1$ is C or N, and $X_1$ in Formulae CY1(27) to CY1(39) and CY1(101) to CY1(108) is C, $X_{11}$ is O, S, $N(R_{18})$, $C(R_{18})(R_{19})$, or $Si(R_{18})(R_{19})$, and $R_{18}$ and $R_{19}$ are each understood by referring to the description of $R_{10}$ in claim 1,

* indicates a binding site to $M_1$ in Formula 1,

*' indicates a binding site to $T_1$ in Formula 1-1, and

*" indicates a binding site to $T_4$ in Formula 1-1.

5. The organometallic compound of claim 1, wherein, in Formula 1-1, a1 is not 0, a2 is not 0, and ring $CY_2$ is represented by one of Formulae CY2(1) to CY2(15):

CY2(1)

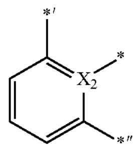

CY2(2)

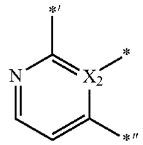

CY2(3)

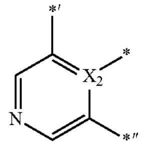

CY2(4)

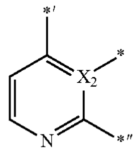

CY2(5)

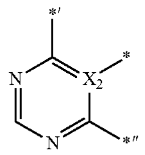

CY2(6)

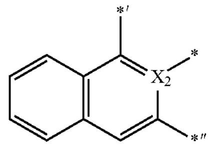

CY2(7)

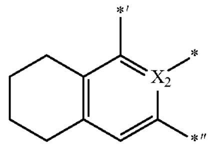

CY2(8)

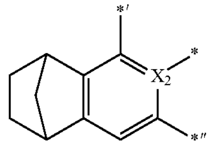

CY2(9)

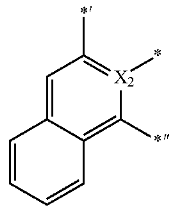

-continued

CY2(10)

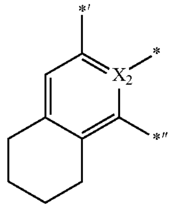

CY2(11)

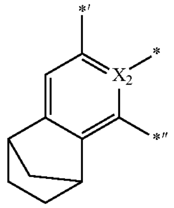

CY2(12)

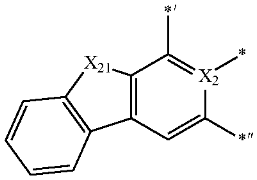

CY2(13)

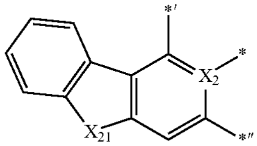

CY2(14)

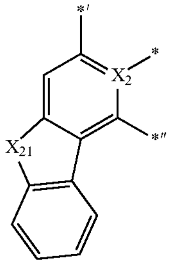

CY2(15)

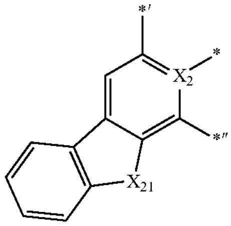

wherein, in Formulae CY2(1) to CY2(15), $X_2$ is C or N, $X_{21}$ is O, S, $N(R_{28})$, $C(R_{28})(R_{29})$, or $Si(R_{28})(R_{29})$, and $R_{28}$ and $R_{29}$ are each understood by referring to the description of $R_{20}$ in claim 1,

* indicates a binding site to $M_1$ in Formula 1,

*' indicates a binding site to $T_1$ in Formula 1-1, and

*" indicates a binding site to $T_2$ in Formula 1-1.

6. The organometallic compound of claim 1, wherein, in Formula 1-1, a2 is not 0, a3 is not 0, and ring $CY_3$ is represented by one of Formulae CY3(1) to CY3(12) and CY3(101) to CY3(122):

CY3(1)

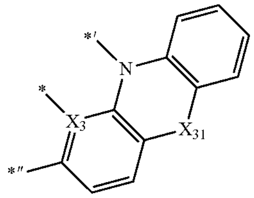

CY3(2)

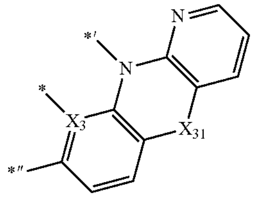

CY3(3)

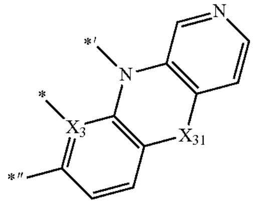

CY3(4)

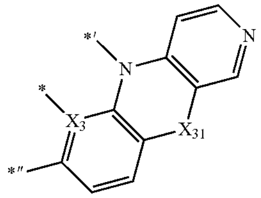

CY3(5)

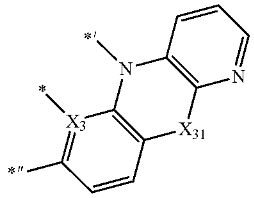

CY3(6)

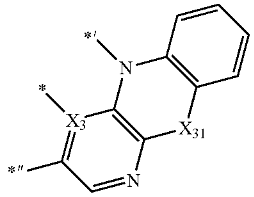

CY3(7)

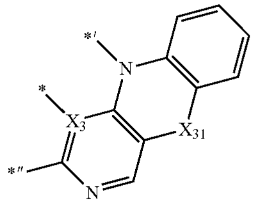

CY3(8)

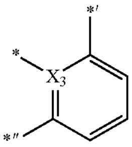

-continued
CY3(9)
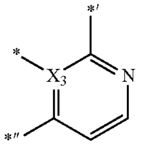
CY3(10)
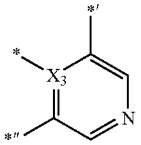
CY3(11)
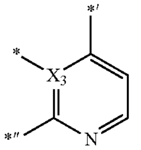
CY3(12)
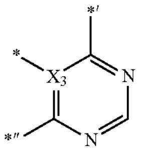
CY3(101)
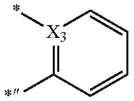
CY3(102)
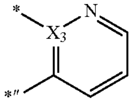
CY3(103)
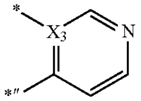
CY3(104)
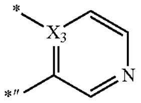
CY3(105)
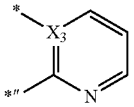
CY3(106)
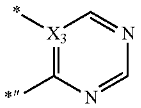
CY3(107)
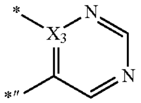
CY3(108)
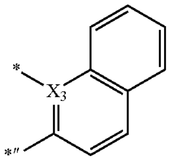
-continued
CY3(109)
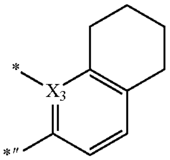
CY3(110)
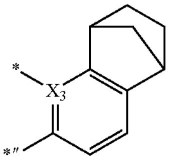
CY3(111)
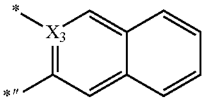
CY3(112)
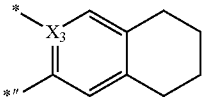
CY3(113)
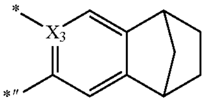
CY3(114)
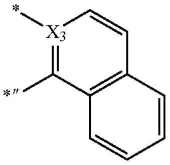
CY3(115)
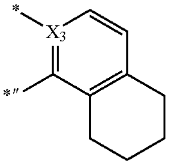
CY3(116)
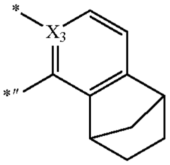
CY3(117)
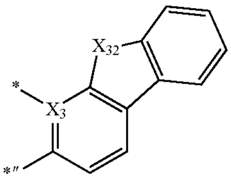
CY3(118)
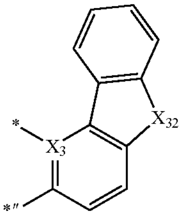

-continued

CY3(119)

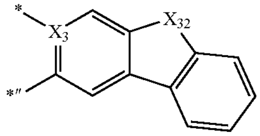

CY3(120)

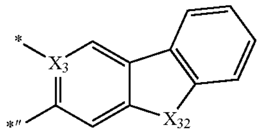

CY3(121)

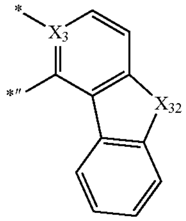

CY3(122)

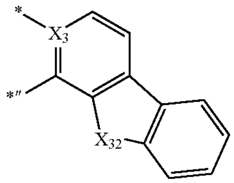

wherein, in Formulae CY3(1) to CY3(12) and CY3(101) to CY3(122), $X_3$ is C or N, $X_{31}$ is a single bond, O, S, $N(R_{38})$, $C(R_{38})(R_{39})$, or $Si(R_{38})(R_{39})$, $X_{32}$ is O, S, $N(R_{38})$, $C(R_{38})(R_{39})$, or $Si(R_{38})(R_{39})$, and $R_{38}$ and $R_{39}$ are each understood by referring to the description of $R_{30}$ in claim 1,

* indicates a binding site to $M_1$ in Formula 1,

*" indicates a binding site to $T_2$ in Formula 1-1, and

*' indicates a binding site to $T_3$ in Formula 1-1.

7. The organometallic compound of claim 1, wherein, in Formula 1-1, a3 is not 0, and ring $CY_4$ is represented by one of Formulae CY4(1) to CY4(42) and CY4(101) to CY4 (111):

CY4(1)

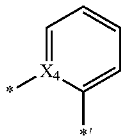

CY4(2)

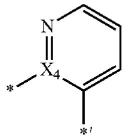

CY4(3)

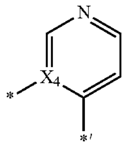

-continued

CY4(4)

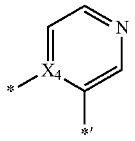

CY4(5)

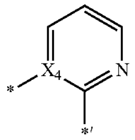

CY4(6)

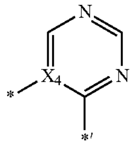

CY4(7)

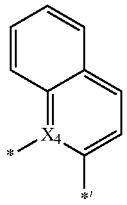

CY4(8)

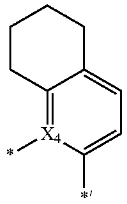

CY4(9)

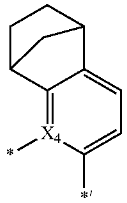

CY4(10)

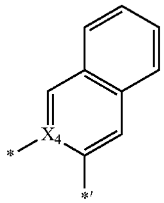

CY4(11)

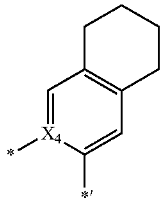

-continued
CY4(12)
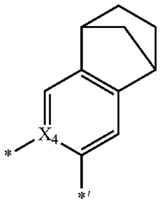
CY4(13)
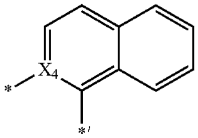
CY4(14)
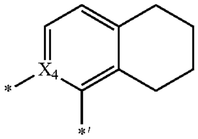
CY4(15)
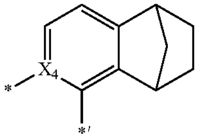
CY4(16)
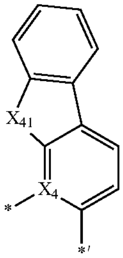
CY4(17)
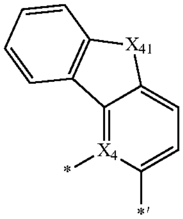
CY4(18)
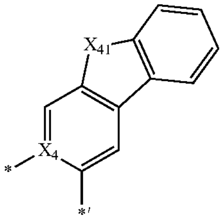
-continued
CY4(19)
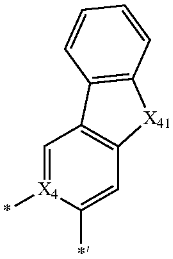
CY4(20)
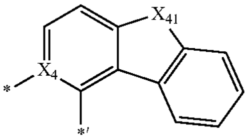
CY4(21)
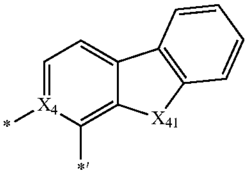
CY4(22)
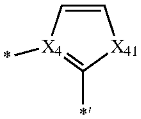
CY4(23)
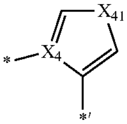
CY4(24)
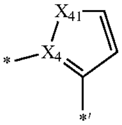
CY4(25)
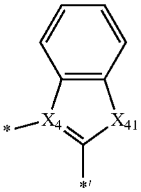
CY4(26)
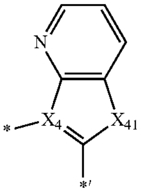
CY4(27)
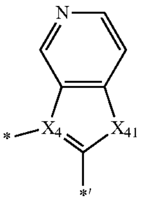

-continued
CY4(28)
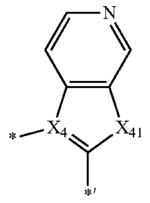
CY4(29)
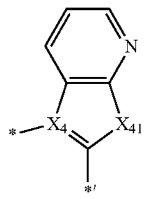
CY4(30)
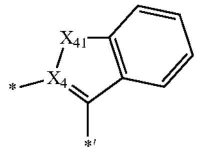
CY4(31)
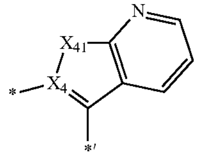
CY4(32)
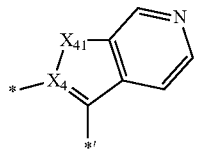
CY4(33)
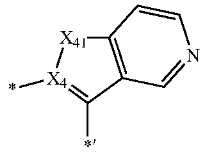
CY4(34)
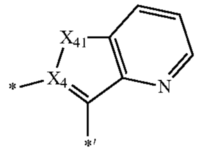
CY4(35)
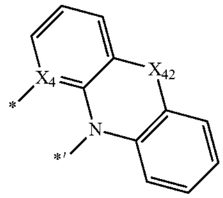
-continued
CY4(36)
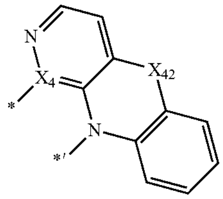
CY4(37)
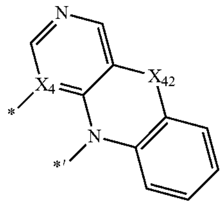
CY4(38)
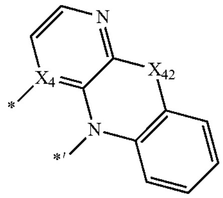
CY4(39)
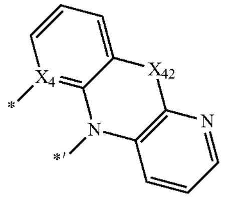
CY4(40)
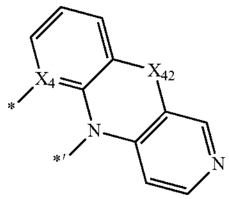
CY4(41)
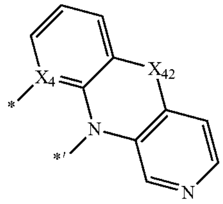
CY4(42)
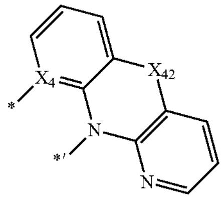
CY4(101)
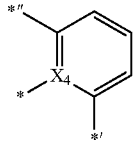

-continued

CY4(102)

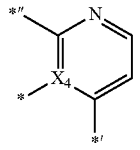

CY4(103)

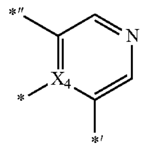

CY4(104)

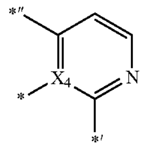

CY4(105)

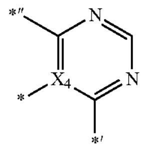

CY4(106)

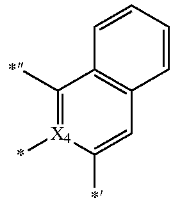

CY4(107)

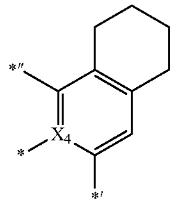

CY4(108)

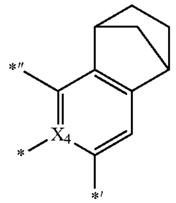

CY4(109)

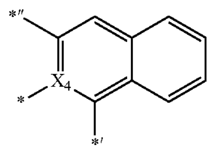

CY4(110)

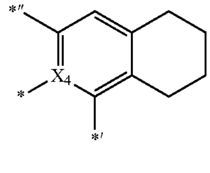

-continued

CY4(111)

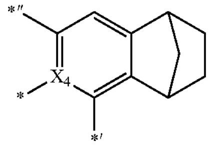

wherein, in Formulae CY4(1) to CY4(42) and CY4(101) to CY4(111), $X_4$ is C or N, $X_{41}$ is O, S, $N(R_{48})$, $C(R_{48})(R_{49})$, or $Si(R_{48})(R_{49})$, $X_{42}$ is a single bond, O, S, $N(R_{48})$, $C(R_{48})(R_{49})$, or $Si(R_{48})(R_{49})$, and $R_{48}$ and $R_{49}$ are each understood by referring to the description of $R_{40}$ in claim 1,

* indicates a binding site to $M_1$ in Formula 1,

*' indicates a binding site to $T_3$ in Formula 1-1, and

*" indicates a binding site to $T_4$ in Formula 1-1.

8. The organometallic compound of claim 1, wherein the sum of n1, n2, n3, and n4 is 1.

9. The organometallic compound of claim 1, wherein in Formula 2-5, i) $Y_{21}$ is B, and $K_1$ to $K_3$ are each O, ii) $Y_{21}$ is B, and $K_1$ to $K_3$ are each $N(R_{205})$, iii) $Y_{21}$ is B, at least one of $K_1$ to $K_3$ is O, and at least one of $K_1$ to $K_3$ is $N(R_{205})$, iv) $Y_{21}$ is N, and $K_1$ to $K_3$ are each a single bond, v) $Y_{21}$ is N, and $K_1$ to $K_3$ are each C(=O), or vi) $Y_{21}$ is N, and $K_1$ to $K_3$ are each $S(=O)_2$.

10. The organometallic compound of claim 1, wherein the organometallic compound is represented by one of Formulae 1-1A to 1-1E:

Formula 1-1A

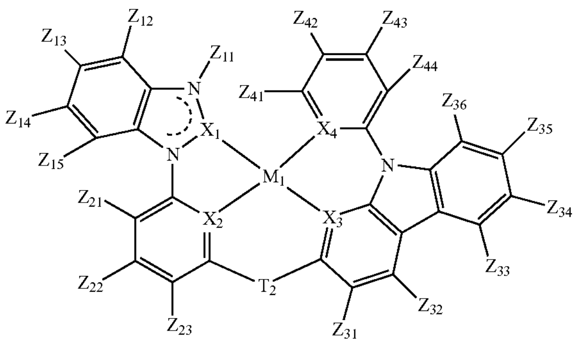

Formula 1-1B

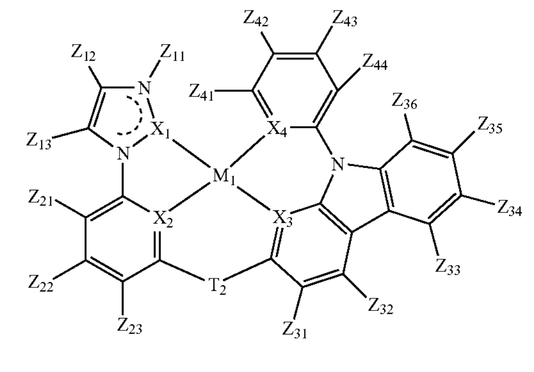

-continued

Formula 1-1C

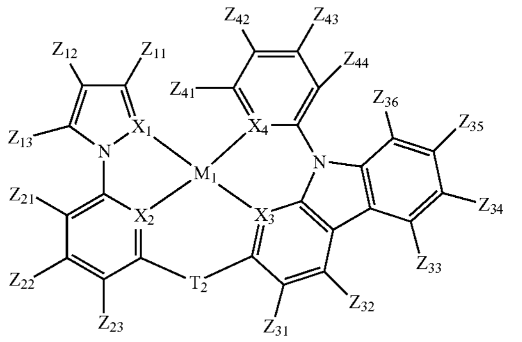

Formula 1-1D

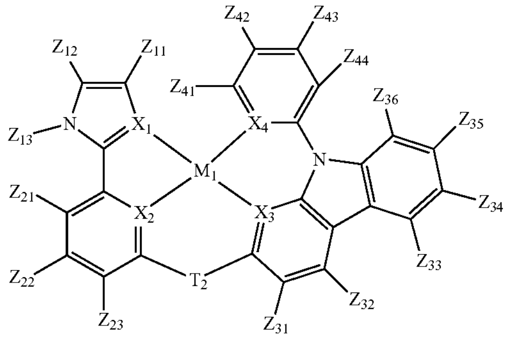

Formula 1-1E

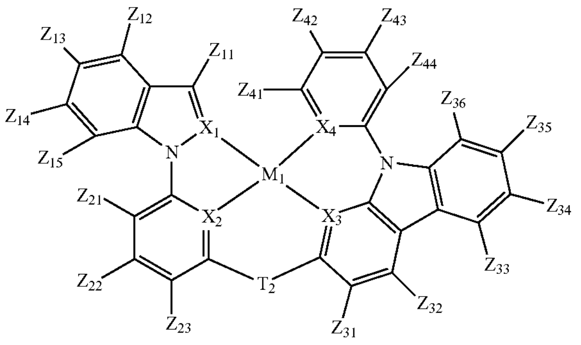

wherein, in Formulae 1-1A and 1-1B, $X_1$ is C, and $X_2$ to $X_4$ are each independently C or N, in Formulae 1-1C to 1-1E, $X_1$ to $X_4$ are each independently C or N, in Formulae 1-1A to 1-1E, $Z_{11}$ to $Z_{15}$ are each independently $R_{10}$ or $E_1$, $Z_{21}$ to $Z_{23}$ are each independently $R_{20}$ or $E_1$, $Z_{31}$ to $Z_{36}$ are each independently $R_{30}$ or $E_1$, and $Z_{41}$ to $Z_{44}$ are each independently $R_{40}$ or $E_1$, in Formulae 1-1A and 1-1E, at least one of $Z_{11}$ to $Z_{15}$, $Z_{21}$ to $Z_{23}$, $Z_{31}$ to $Z_{36}$, and $Z_{41}$ to $Z_{44}$ is $E_1$, in Formulae 1-1B to 1-1D, at least one of $Z_{11}$ to $Z_{13}$, $Z_{21}$ to $Z_{23}$, $Z_{31}$ to $Z_{36}$, and $Z_{41}$ to $Z_{44}$ is $E_1$, and $M_1$, $T_2$, $R_{10}$, $R_{20}$, $R_{30}$, $R_{40}$, and $E_1$ are respectively understood by referring to the descriptions of $M_1$, $T_2$, $R_{10}$, $R_{20}$, $R_{30}$, $R_{40}$, and $E_1$ in claim 1.

11. The organometallic compound of claim 10, wherein in Formulae 1-1A and 1-1E, $Z_{11}$ to $Z_{15}$ are each $R_{10}$, and $Z_{11}$ to $Z_{15}$ are identical to or different from one another, and, in Formulae 1-1B to 1-1D, $Z_{11}$ to $Z_{13}$ are each $R_{10}$, and $Z_{11}$ to $Z_{13}$ are identical to or different from one another, in Formulae 1-1A to 1-1E, $Z_{21}$ to $Z_{23}$ are each $R_{20}$, $Z_{21}$ to $Z_{23}$ are identical to or different from one another, $Z_{31}$ to $Z_{33}$, $Z_{35}$, and $Z_{36}$ are each $R_{30}$, $Z_{31}$ to $Z_{33}$, $Z_{35}$, and $Z_{36}$ are identical to or different from one another, $Z_{34}$ is $E_1$, $Z_{41}$ to $Z_{44}$ are each $R_{40}$, and $Z_{41}$ to $Z_{44}$ are identical to or different from one another.

12. An organic light-emitting device, comprising:

a first electrode;

a second electrode; and an organic layer located between the first electrode and the second electrode, wherein the organic layer comprises an emission layer and at least one organometallic compound of claim 1.

13. The light-emitting device of claim 12, wherein the emission layer comprises the at least one organometallic compound.

14. The organic light-emitting device of claim 13, wherein the emission layer comprises a host and a dopant, and the dopant comprises the at least one organometallic compound.

15. The organic light-emitting device of claim 13, wherein the emission layer emits blue light.

16. The light-emitting device of claim 12, wherein the first electrode is an anode, the second electrode is a cathode, the organic layer further comprises a hole transport region located between the first electrode and the emission layer, and an electron transport region located between the emission layer and the second electrode, the hole transport region comprises a hole injection layer, a hole transport layer, an electron blocking layer, a buffer layer, or a combination thereof, and the electron transport region comprises a hole blocking layer, an electron transport layer, an electron injection layer, or a combination thereof.

17. An electronic apparatus, comprising the organic light-emitting device of claim 12.

* * * * *